United States Patent
ElBsat et al.

(10) Patent No.: US 10,742,055 B2
(45) Date of Patent: Aug. 11, 2020

(54) RENEWABLE ENERGY SYSTEM WITH SIMULTANEOUS RAMP RATE CONTROL AND FREQUENCY REGULATION

(71) Applicant: Con Edison Battery Storage, LLC, Valhalla, NY (US)

(72) Inventors: Mohammad N. ElBsat, Milwaukee, WI (US); Michael J. Wenzel, Oak Creek, WI (US); Brett M. Lenhardt, Waukesha, WI (US)

(73) Assignee: Con Edison Battery Storage, LLC, Valhalla, NY (US)

( * ) Notice: Subject to any disclaimer, the term of this patent is extended or adjusted under 35 U.S.C. 154(b) by 319 days.

(21) Appl. No.: 15/247,872

(22) Filed: Aug. 25, 2016

(65) Prior Publication Data

US 2017/0104342 A1 Apr. 13, 2017

Related U.S. Application Data

(60) Provisional application No. 62/239,233, filed on Oct. 8, 2015, provisional application No. 62/239,249, filed (Continued)

(51) Int. Cl.
*H02J 7/00* (2006.01)
*G01R 31/387* (2019.01)
(Continued)

(52) U.S. Cl.
CPC ............ *H02J 7/007* (2013.01); *G01R 31/387* (2019.01); *H02J 3/32* (2013.01); *H02J 3/383* (2013.01);
(Continued)

(58) Field of Classification Search
USPC .................................................. 307/66, 80
See application file for complete search history.

(56) References Cited

U.S. PATENT DOCUMENTS

| 4,349,869 A | 9/1982 | Prett et al. |
| 4,616,308 A | 10/1986 | Morshedi et al. |
| (Continued) | | |

FOREIGN PATENT DOCUMENTS

| CN | 102566435 B | 10/2013 |
| CN | 102891495 | 1/2016 |
| (Continued) | | |

OTHER PUBLICATIONS

Search Report for International Application No. PCT/US2016/056178, dated Jan. 25, 2017, 3 pages.

(Continued)

*Primary Examiner* — Rexford N Barnie
*Assistant Examiner* — Dru Parries
(74) *Attorney, Agent, or Firm* — Michael Best & Friedrich LLP

(57) ABSTRACT

A frequency regulation and ramp rate control system includes a battery configured to store and discharge electric power, a battery power inverter configured to control an amount of the electric power in the battery, a photovoltaic power inverter configured to control an electric power output of a photovoltaic field, and a controller. The controller generates a battery power setpoint for the battery power inverter and a photovoltaic power setpoint for the photovoltaic power inverter. The generated setpoints cause the battery power inverter and the photovoltaic power inverter to simultaneously perform both frequency regulation and ramp rate control.

20 Claims, 17 Drawing Sheets

Related U.S. Application Data on Oct. 8, 2015, provisional application No. 62/239,231, filed on Oct. 8, 2015, provisional application No. 62/239,245, filed on Oct. 8, 2015, provisional application No. 62/239,246, filed on Oct. 8, 2015.

(51) Int. Cl.
  *H02J 3/38* (2006.01)
  *H02J 3/32* (2006.01)
  *H02J 7/35* (2006.01)

(52) U.S. Cl.
  CPC .............. *H02J 7/35* (2013.01); *Y02E 10/563* (2013.01); *Y02E 10/566* (2013.01); *Y02E 70/30* (2013.01)

(56) References Cited

U.S. PATENT DOCUMENTS

| | | |
|---|---|---|
| 5,301,101 A | 4/1994 | Macarthur et al. |
| 5,347,446 A | 9/1994 | Iino et al. |
| 5,351,184 A | 9/1994 | Lu et al. |
| 5,408,406 A | 4/1995 | Mathur et al. |
| 5,442,544 A | 8/1995 | Jelinek |
| 5,519,605 A | 5/1996 | Cawlfield |
| 5,572,420 A | 11/1996 | Lu |
| 5,867,384 A | 2/1999 | Drees et al. |
| 6,055,483 A | 4/2000 | Lu |
| 6,122,555 A | 9/2000 | Lu |
| 6,278,899 B1 | 8/2001 | Piche et al. |
| 6,347,254 B1 | 2/2002 | Lu |
| 6,459,939 B1 | 10/2002 | Hugo |
| 6,757,591 B2 | 6/2004 | Kramer |
| 6,807,510 B1 | 10/2004 | Backstrom et al. |
| 6,900,556 B2 | 5/2005 | Provanzana et al. |
| 7,050,863 B2 | 5/2006 | Mehta et al. |
| 7,050,866 B2 | 5/2006 | Martin et al. |
| 7,113,890 B2 | 9/2006 | Frerichs et al. |
| 7,152,023 B2 | 12/2006 | Das |
| 7,165,399 B2 | 1/2007 | Stewart |
| 7,188,779 B2 | 3/2007 | Alles |
| 7,197,485 B2 | 3/2007 | Fuller |
| 7,203,554 B2 | 4/2007 | Fuller |
| 7,266,416 B2 | 9/2007 | Gallestey et al. |
| 7,272,454 B2 | 9/2007 | Wojsznis et al. |
| 7,275,374 B2 | 10/2007 | Stewart et al. |
| 7,328,074 B2 | 2/2008 | Das et al. |
| 7,328,577 B2 | 2/2008 | Stewart et al. |
| 7,376,471 B2 | 5/2008 | Das et al. |
| 7,376,472 B2 | 5/2008 | Wojsznis et al. |
| 7,389,773 B2 | 6/2008 | Stewart et al. |
| 7,400,933 B2 | 7/2008 | Rawlings et al. |
| 7,418,372 B2 | 8/2008 | Nishira et al. |
| 7,454,253 B2 | 11/2008 | Fan |
| 7,496,413 B2 | 2/2009 | Fan et al. |
| 7,577,483 B2 | 8/2009 | Fan et al. |
| 7,591,135 B2 | 9/2009 | Stewart |
| 7,610,108 B2 | 10/2009 | Boe et al. |
| 7,650,195 B2 | 1/2010 | Fan et al. |
| 7,664,573 B2 | 2/2010 | Ahmed |
| 7,676,283 B2 | 3/2010 | Liepold et al. |
| 7,826,909 B2 | 11/2010 | Attarwala |
| 7,827,813 B2 | 11/2010 | Seem |
| 7,839,027 B2 | 11/2010 | Shelton et al. |
| 7,844,352 B2 | 11/2010 | Vouzis et al. |
| 7,856,281 B2 | 12/2010 | Thiele et al. |
| 7,878,178 B2 | 2/2011 | Stewart et al. |
| 7,894,943 B2 | 2/2011 | Sloup et al. |
| 7,930,045 B2 | 4/2011 | Cheng |
| 7,945,352 B2 | 5/2011 | Koc |
| 7,949,416 B2 | 5/2011 | Fuller |
| 7,987,005 B2 | 7/2011 | Rund |
| 7,987,145 B2 | 7/2011 | Baramov |
| 7,996,140 B2 | 8/2011 | Stewart et al. |
| 8,005,575 B2 | 8/2011 | Kirchhof |
| 8,032,235 B2 | 10/2011 | Sayyar-Rodsari |
| 8,036,758 B2 | 10/2011 | Lu et al. |
| 8,046,089 B2 | 10/2011 | Renfro et al. |
| 8,060,258 B2 | 11/2011 | Butoyi |
| 8,060,290 B2 | 11/2011 | Stewart et al. |
| 8,073,659 B2 | 12/2011 | Gugaliya et al. |
| 8,078,291 B2 | 12/2011 | Pekar et al. |
| 8,096,140 B2 | 1/2012 | Seem |
| 8,105,029 B2 | 1/2012 | Egedal et al. |
| 8,109,255 B2 | 2/2012 | Stewart et al. |
| 8,121,818 B2 | 2/2012 | Gorinevsky |
| 8,126,575 B2 | 2/2012 | Attarwala |
| 8,145,329 B2 | 3/2012 | Pekar et al. |
| 8,180,493 B1 | 5/2012 | Laskow |
| 8,185,217 B2 | 5/2012 | Thiele |
| 8,200,346 B2 | 6/2012 | Thiele |
| 8,295,989 B2 | 10/2012 | Rettger et al. |
| 8,489,666 B1 | 7/2013 | Nikitin |
| 8,492,926 B2 | 7/2013 | Collins et al. |
| 8,495,888 B2 | 7/2013 | Seem |
| 8,583,520 B1 | 11/2013 | Forbes, Jr. |
| 8,600,561 B1 | 12/2013 | Modi et al. |
| 8,600,571 B2 | 12/2013 | Dillon et al. |
| 8,843,238 B2 | 9/2014 | Wenzel et al. |
| 8,901,411 B2 | 12/2014 | Liu et al. |
| 8,914,158 B2 | 12/2014 | Geinzer et al. |
| 8,922,056 B2 | 12/2014 | Thisted |
| 9,002,532 B2 | 4/2015 | Asmus |
| 9,002,761 B2 | 4/2015 | Montalvo |
| 9,061,599 B2 | 6/2015 | Sisk |
| 9,235,657 B1 | 1/2016 | Wenzel et al. |
| 2004/0095237 A1 | 5/2004 | Chen et al. |
| 2005/0062289 A1 | 3/2005 | Cho et al. |
| 2007/0080675 A1 | 4/2007 | Gray et al. |
| 2007/0087756 A1 | 4/2007 | Hoffberg |
| 2009/0094173 A1 | 4/2009 | Smith et al. |
| 2009/0254396 A1 | 10/2009 | Metcalfe |
| 2009/0313083 A1 | 12/2009 | Dillon et al. |
| 2009/0319090 A1 | 12/2009 | Dillon et al. |
| 2010/0087933 A1 | 4/2010 | Cheng |
| 2010/0198420 A1 | 8/2010 | Rettger et al. |
| 2010/0198421 A1 | 8/2010 | Fahimi et al. |
| 2010/0235004 A1 | 9/2010 | Thind |
| 2010/0269854 A1 | 10/2010 | Barbieri et al. |
| 2011/0022193 A1 | 1/2011 | Panaitescu |
| 2011/0060424 A1 | 3/2011 | Havlena |
| 2011/0066258 A1 | 3/2011 | Torzhkov et al. |
| 2011/0088000 A1 | 4/2011 | Mackay |
| 2011/0125293 A1 | 5/2011 | Havlena |
| 2011/0184565 A1 | 7/2011 | Peterson |
| 2011/0190958 A1 | 8/2011 | Hirst |
| 2011/0221276 A1 | 9/2011 | Geinzer et al. |
| 2011/0257789 A1 | 10/2011 | Stewart et al. |
| 2011/0264289 A1 | 10/2011 | Sawyer et al. |
| 2011/0276269 A1 | 11/2011 | Hummel |
| 2011/0301723 A1 | 12/2011 | Pekar et al. |
| 2012/0010757 A1 | 1/2012 | Francino et al. |
| 2012/0059351 A1 | 3/2012 | Nordh |
| 2012/0060505 A1 | 3/2012 | Fuller et al. |
| 2012/0083930 A1 | 4/2012 | Ilic et al. |
| 2012/0109620 A1 | 5/2012 | Gaikwad et al. |
| 2012/0116546 A1 | 5/2012 | Sayyar-Rodsari |
| 2012/0130555 A1 | 5/2012 | Jelinek |
| 2012/0143385 A1 | 6/2012 | Goldsmith |
| 2012/0215362 A1 | 8/2012 | Stagner |
| 2012/0232701 A1 | 9/2012 | Carty et al. |
| 2012/0261990 A1* | 10/2012 | Collins .................... H02J 3/28 307/44 |
| 2012/0323396 A1 | 12/2012 | Shelton et al. |
| 2012/0326511 A1 | 12/2012 | Johnson |
| 2013/0099565 A1 | 4/2013 | Sachs et al. |
| 2013/0138285 A1 | 5/2013 | Bozchalui et al. |
| 2013/0154583 A1 | 6/2013 | Shi et al. |
| 2013/0184884 A1 | 7/2013 | More et al. |
| 2013/0204443 A1 | 8/2013 | Steven et al. |
| 2013/0212410 A1 | 8/2013 | Li et al. |
| 2013/0300194 A1 | 11/2013 | Palmer et al. |
| 2013/0345880 A1 | 12/2013 | Asmus |
| 2014/0037909 A1 | 2/2014 | Hawwa et al. |

(56) References Cited

U.S. PATENT DOCUMENTS

| | | | |
|---|---|---|---|
| 2014/0039709 | A1 | 2/2014 | Steven et al. |
| 2014/0049109 | A1 | 2/2014 | Kearns et al. |
| 2014/0052308 | A1 | 2/2014 | Hanafusa |
| 2014/0089692 | A1 | 3/2014 | Hanafusa |
| 2014/0100810 | A1 | 4/2014 | Nielsen |
| 2014/0152009 | A1 | 6/2014 | Meisner et al. |
| 2014/0159491 | A1 | 6/2014 | Kusunose |
| 2014/0239722 | A1 | 8/2014 | Arai et al. |
| 2014/0279361 | A1 | 9/2014 | Streeter et al. |
| 2014/0336840 | A1 | 11/2014 | Geinzer et al. |
| 2014/0354239 | A1 | 12/2014 | Miyazaki et al. |
| 2014/0358316 | A1 | 12/2014 | Shichiri |
| 2015/0002105 | A1 | 1/2015 | Kelly |
| 2015/0008884 | A1 | 1/2015 | Waki et al. |
| 2015/0019034 | A1* | 1/2015 | Gonatas ............ H01L 31/02021 700/291 |
| 2015/0021991 | A1 | 1/2015 | Wood et al. |
| 2015/0045962 | A1 | 2/2015 | Wenzel et al. |
| 2015/0046221 | A1 | 2/2015 | Narayan et al. |
| 2015/0084339 | A1 | 3/2015 | McDaniel et al. |
| 2015/0088315 | A1 | 3/2015 | Behrangrad |
| 2015/0094870 | A1 | 4/2015 | Fornage et al. |
| 2015/0094968 | A1 | 4/2015 | Jia et al. |
| 2015/0127425 | A1 | 5/2015 | Greene et al. |
| 2015/0277467 | A1 | 10/2015 | Steven et al. |
| 2015/0283912 | A1 | 10/2015 | Shimizu et al. |
| 2016/0028234 | A1 | 1/2016 | Watanabe et al. |
| 2016/0047862 | A1 | 2/2016 | Shimizu et al. |
| 2016/0190810 | A1 | 6/2016 | Bhavaraju et al. |
| 2016/0241042 | A1 | 8/2016 | Mammoli et al. |
| 2016/0254671 | A1 | 9/2016 | Cutright et al. |
| 2016/0315475 | A1 | 10/2016 | Carlson et al. |
| 2017/0060113 | A1 | 3/2017 | Kaucic et al. |
| 2017/0090440 | A1 | 3/2017 | Eck et al. |
| 2017/0104345 | A1 | 4/2017 | Wenzel et al. |

FOREIGN PATENT DOCUMENTS

| | | |
|---|---|---|
| EP | 2506380 | 10/2012 |
| EP | 2549617 | 1/2013 |
| EP | 2660943 | 11/2013 |
| EP | 2773008 | 9/2014 |
| EP | 2871742 | 5/2015 |
| JP | 2014-233096 | 12/2014 |
| WO | WO 02/15365 | 2/2002 |
| WO | WO-2010/042550 | 4/2010 |
| WO | WO-2010/057250 | 5/2010 |
| WO | WO-2010/094012 | 8/2010 |
| WO | WO-2011/080548 | 7/2011 |
| WO | WO-2012/122234 | 9/2012 |
| WO | WO 2013/063581 | 5/2013 |
| WO | WO-2014/016727 | 1/2014 |
| WO | WO 2015/019541 | 2/2015 |
| WO | WO 2015/139061 | 9/2015 |

OTHER PUBLICATIONS

U.S. Appl. No. 13/802,279, filed Mar. 13, 2013, Johnson Controls Technology Company.
Search Report and Written Opinion for International Application No. PCT/US2016/056165, dated Jan. 3, 2017, 13 pages.
Search Report and Written Opinion for International Application No. PCT/US2016/056167, dated Jan. 3, 2017, 12 pages.
Search Report and Written Opinion for International Application No. PCT/US2016/056169, dated Jan. 3, 2017, 12 pages.
Search Report and Written Opinion for International Application No. PCT/US2016/056170, dated Jan. 18, 2017, 12 pages.
Search Report and Written Opinion for International Application No. PCT/US2016/056179, dated Jan. 19, 2017, 10 pages.
Search Report and Written Opinion for International Application No. PCT/US2016/056182, dated Jan. 4, 2017, 13 pages.
Search Report and Written Opinion for International Application No. PCT/US2016/056183, dated Dec. 20, 2016, 13 pages.
Search Report and Written Opinion for International Application No. PCT/US2016/056184, dated Dec. 20, 2016, 13 pages.
Search Report and Written Opinion for International Application No. PCT/US2016/056186, dated Jan. 16, 2017, 10 pages.
Search Report and Written Opinion for International Application No. PCT/US2016/056187, dated Dec. 9, 2016, 12 pages.
Search Report and Written Opinion for International Application No. PCT/US2016/056189, dated Dec. 21, 2016, 11 pages.
Search Report and Written Opinion for International Application No. PCT/US2016/056190, dated Jan. 18, 2017, 10 pages.
Search Report and Written Opinion for International Application No. PCT/US2016/056192, dated Jan. 16, 2017, 11 pages.
Search Report for International Application No. PCT/US2016/056181, dated Jan. 26, 2017, 10 pages.
U.S. Appl. No. 13/802,154, filed Mar. 13, 2013, Johnson Controls Technology Company.
Extended European Search Report for EP Application No. 16154938.1, dated Jun. 23, 2016, 8 pages.
Extended European Search Report for EP Application No. 16154940.7, dated Jun. 30, 2016, 7 pages.
Hoke et al., Active Power Control of Photovoltaic Power Systems, 2013 1st IEEE Conference on Technologies for Sustainability (SusTech), Aug. 1-2, 2013, 8 pages.
Lopez-Martinez et al., Vision-Based System for the Safe Operation of a Solar Power Tower Plant, in Advances in Artificial Intelligence-IBERAMIA 2002, 8th Ibero-American Conference on Artificial Intelligence, Nov. 2002, Springer Berlin Heidelberg, 10 pages.
Sasikala et al., Coordinated Control and Strategy of Solar Photovoltaic Generators with MPPT and Battery Storage in Micro Grids, International Journal of Scientific Engineering and Technology Research, vol. 3, No. 46, Dec. 2014, 7 pages.
SMA Solar Technology AG, PV and Storage: Solutions with Potential-Energy on demand with the Sunny Central Storage, Brochure, Nov. 30, 2002, 8 pages.
U.S. Office Action on U.S. Appl. No. 15/247,793 dated May 10, 2018. 9 pages.
U.S. Office Action on U.S. Appl. No. 15/247,777 dated Feb. 9, 2018. 25 pages.
U.S. Office Action on U.S. Appl. No. 15/247,784 dated Apr. 19, 2018. 7 pages.
U.S. Office Action on U.S. Appl. No. 15/247,788 dated May 7, 2018. 19 pages.
U.S. Office Action on U.S. Appl. No. 15/247,875 dated Feb. 8, 2018. 27 pages.
U.S. Office Action on U.S. Appl. No. 15/247,880 dated May 11, 2018. 12 pages.
U.S. Office Action on U.S. Appl. No. 15/247,881 dated Mar. 8, 2018. 25 pages.
U.S. Office Action on U.S. Appl. No. 15/247,883 dated Mar. 21, 2018. 36 pages.
U.S. Office Action on U.S. Appl. No. 15/247,885 dated Apr. 16, 2018. 33 pages.
U.S. Office Action on U.S. Appl. No. 15/247,886 dated Feb. 9, 2018. 7 pages.
Office Action on European Patent Application No. 16787642.4 dated Jun. 21, 2018. 7 pages.
United States Patent Office Action for U.S. Appl. No. 15/247,873 dated Sep. 19, 2018 (15 Pages).
U.S. Office Action on U.S. Appl. No. 15/247,869 dated Aug. 9, 2018. 16 pages.
U.S. Office Action on U.S. Appl. No. 15/247,844 dated Aug. 28, 2018. 19 pages.
U.S. Office Action for U.S. Appl. No. 15/247,883 dated Oct. 17, 2018 15 pages.
U.S. Office Action for U.S. Appl. No. 15/247,885 dated Nov. 28, 2018 45 pages.
U.S. Office Action for U.S. Appl. No. 15/247,788 dated Dec. 11, 2018 25 pages.

* cited by examiner

RENEWABLE ENERGY SYSTEM WITH SIMULTANEOUS RAMP RATE CONTROL AND FREQUENCY REGULATION

CROSS-REFERENCE TO RELATED PATENT APPLICATIONS

This application claims the benefit of and priority to U.S. Provisional Patent Application No. 62/239,231, U.S. Provisional Patent Application No. 62/239,233, U.S. Provisional Patent Application No. 62/239,245, U.S. Provisional Patent Application No. 62/239,246, and U.S. Provisional Patent Application No. 62/239,249, each of which has a filing date of Oct. 8, 2015. The entire disclosure of each of these patent applications is incorporated by reference herein.

BACKGROUND

The present disclosure relates generally to renewable energy systems such as photovoltaic power systems, wind power systems, hydroelectric power systems, and other power systems that generate power using renewable energy sources. More specifically, the present description relates to systems and methods for controlling ramp rate and frequency regulation in a renewable energy system.

Increased concerns about environmental issues such as global warming have prompted an increased interest in alternate clean and renewable sources of energy. Such sources include solar and wind power. One method for harvesting solar energy is using a photovoltaic (PV) field which provides power to an energy grid supplying regional power.

Availability of solar power depends on the time of day (sunrise and sunsets) and weather variables such as cloud cover. The power output of a PV field can be intermittent and may vary abruptly throughout the course of a day. For example, a down-ramp (i.e., a negative change) in PV output power may occur when a cloud passes over a PV field. An up-ramp (i.e., a positive change) in PV output power may occur at sunrise and at any time during the day when a cloudy sky above the PV field clears up. This intermittency in PV power output presents a problem to the stability of the energy grid. In order to address the intermittency of PV output power, ramp rate control is often used to maintain the stability of the grid.

Ramp rate control is the process of offsetting PV ramp rates that fall outside of compliance limits determined by the electric power authority overseeing the grid. Ramp rate control typically requires the use of an energy source that allows for offsetting ramp rates by either supplying additional power to the grid or consuming more power from the grid. Stationary battery technology can be used for such applications. Stationary battery technology can also be used for frequency regulation, which is the process of maintaining the grid frequency at a desired value (e.g. 60 Hz in the United States) by adding or removing energy from the grid as needed. However, it is difficult and challenging to implement both ramp rate control and frequency regulation simultaneously.

Ramp rate control and frequency regulation both impact the rate at which energy is provided to or removed from the energy grid. However, ramp rate control and frequency regulation often have conflicting objectives (i.e., controlling PV ramp rates vs. regulating grid frequency) which increases the difficulty of using the same battery for ramp rate control and frequency regulation simultaneously. Additionally, conventional ramp rate control and frequency regulation techniques can result in premature degradation of battery assets and often fail to maintain the state-of-charge of the battery within an acceptable range. It would be desirable to provide solutions to these and other disadvantages of conventional ramp rate control and frequency regulation techniques.

SUMMARY

One implementation of the present disclosure is a frequency regulation and ramp rate control system. The system includes a battery configured to store and discharge electric power, a battery power inverter configured to control an amount of the electric power stored or discharged from the battery, a photovoltaic power inverter configured to control an electric power output of a photovoltaic field, and a controller. The controller generates a battery power setpoint for the battery power inverter and a photovoltaic power setpoint for the photovoltaic power inverter. The battery power setpoint and the photovoltaic power setpoint cause the battery power inverter and the photovoltaic power inverter to simultaneously perform both frequency regulation and ramp rate control.

In some embodiments, the controller may be configured to generate the battery power setpoint. The controller may generate a frequency regulation power setpoint based on a frequency of an energy grid electrically connected to the photovoltaic field and the battery. The controller may generate a ramp rate control power setpoint based a ramp rate compliance limit. The controller can combine the frequency regulation power setpoint and the ramp rate control power setpoint to generate the battery power setpoint.

In some embodiments, the controller may be configured to combine the frequency regulation power setpoint and the ramp rate control power setpoint by summing the frequency regulation power setpoint and the ramp rate control power setpoint.

In some embodiments, the controller may be configured to generate upper and lower bounds for the ramp rate control power setpoint. The upper and lower bounds define a range of values for the ramp rate control power setpoint that ensure compliance with the ramp rate compliance limit.

In some embodiments, the controller can generate the ramp rate control power setpoint by determining whether the power output of the PV field is ramping-up, ramping-down, or not ramping. The state of the PV field ramp is based on the upper and lower bounds. The controller can generate the ramp rate control power setpoint based on whether the power output of the PV field is ramping-up, ramping-down, or not ramping.

In some embodiments, the controller can be configured to generate the ramp rate control power setpoint. The controller can identify a state-of-charge of the battery, compares the state-of-charge of the battery with a state-of-charge setpoint, and generates the ramp rate control power setpoint based on a difference between the identified state-of-charge of the battery and the state-of-charge setpoint.

In some embodiments, the state-of-charge setpoint includes a single setpoint value and a range of setpoint values between an upper setpoint limit and a lower setpoint limit.

In some embodiments, the controller can determine whether the power output of the PV field is ramping-up, ramping-down, or not ramping based on a power signal from the photovoltaic field over a plurality of time steps.

Another implementation of the present disclosure is a frequency regulation and ramp rate control method. The method includes storing and discharging electric power in a battery, controlling an amount of the electric power stored or discharged from the battery using a battery power inverter and controlling an electric power output of a photovoltaic field using a photovoltaic power inverter. The method further includes generating a battery power setpoint for the battery power inverter and a photovoltaic power setpoint for the photovoltaic power inverter using a controller. The method includes using the battery power inverter and the photovoltaic power inverter to simultaneously perform both frequency regulation and ramp rate control based on the battery power setpoint and the photovoltaic power setpoint.

In some embodiments, the method may include generating a frequency regulation power setpoint based on a frequency of an energy grid electrically connected to the photovoltaic field and the battery. The method may include generating a ramp rate control power setpoint based on a ramp rate compliance limit. The method may also include combining the frequency regulation power setpoint and the ramp rate control power setpoint to generate the battery power setpoint.

In some embodiments, the frequency regulation power setpoint and the ramp rate control power setpoint may be generated by summing the frequency regulation power setpoint and the ramp rate control power setpoint.

In some embodiments, the method may include generating upper and lower bounds for the ramp rate control power setpoint. The upper and lower bounds may define a range of values for the ramp rate control power setpoint that ensure compliance with the ramp rate compliance limit.

In some embodiments, the method may include determining whether the power output of the PV field is ramping-up, ramping-down, or not ramping based on the upper and lower bounds. The method may include generating the ramp rate control power setpoint based on whether the power output of the PV field is ramping-up, ramping-down, or not ramping.

In some embodiments, the method may include generating the ramp rate control power setpoints by identifying a state-of-charge of the battery, comparing the state-of-charge of the battery with a state-of-charge setpoint, and generating the ramp rate control power setpoint. The ramp rate control power setpoint may be generated based on a difference between the identified state-of-charge of the battery and the state-of-charge setpoint.

In some embodiments, the state-of-charge setpoint may include a single setpoint value and a range of setpoint values between an upper setpoint limit and a lower setpoint limit.

In some embodiments, the method may include determining whether the power output of the PV field is ramping-up, ramping-down, or not ramping based on a power signal from the photovoltaic field over a plurality of time steps.

Another implementation of the present disclosure is a controller for a frequency regulation and ramp rate control system. The controller controls an amount of the electric power stored or discharged from a battery using a battery power inverter. The controller controls an electric power output of a photovoltaic field using a photovoltaic power inverter and generates a battery power setpoint for the battery power inverter and a photovoltaic power setpoint for the photovoltaic power inverter. The controller uses the battery power inverter and the photovoltaic power inverter to simultaneously perform both frequency regulation and ramp rate control based on the battery power setpoint and the photovoltaic power setpoint.

In some embodiments, the controller may generate the battery power setpoints. The controller generates a frequency regulation power setpoint based on a frequency of an energy grid electrically connected to the photovoltaic field and the battery. The controller may generate a ramp rate control power setpoint based a ramp rate compliance limit. Finally, the controller combines the frequency regulation power setpoint and the ramp rate control power setpoint to generate the battery power setpoint.

In some embodiments, the controller may generate upper and lower bounds for the ramp rate control power setpoint. The upper and lower bounds define a range of values for the ramp rate control power setpoint that ensure compliance with the ramp rate compliance limit.

In some embodiments, the controller may generate the ramp rate control power setpoint. The controller can determine whether the power output of the PV field is ramping-up, ramping-down, or not ramping based on the upper and lower bounds. The controller may generate the ramp rate control power setpoint based on whether the power output of the PV field is ramping-up, ramping-down, or not ramping.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Referring generally to the FIGURES, systems and methods for controlling ramp rate and frequency regulation in a photovoltaic (PV) energy system are shown, according to various exemplary embodiments. An asset such as a stationary battery can be used for several applications, two of which are ramp rate control and frequency regulation. Ramp rate control is the process of offsetting PV ramp rates (i.e., increases or decreases in PV power output) that fall outside of compliance limits determined by the electric power authority overseeing the energy grid. Ramp rate control typically requires the use of an energy source that allows for offsetting ramp rates by either supplying additional power to the grid or consuming more power from the grid. Frequency regulation is the process of maintaining the grid frequency at a desired value (e.g. 60 Hz in the United States) by adding or removing energy from the grid as needed.

A frequency regulation and ramp rate controller in accordance with the present invention simultaneously controls the ramp rate of the PV power and sets the battery setpoint to a value for the purpose of frequency regulation. Furthermore, the controller maintains the state-of-charge of the battery within a desirable range (e.g., a state-of-charge setpoint±a tolerance) in order to avoid the depletion of the battery and/or affecting its health. The controller is configured to determine a setpoint for a battery power inverter and a setpoint for a PV power inverter such that the PV ramp rate remains within compliance, the frequency of the energy grid is regulated, and the state-of-charge of the battery is maintained.

In some embodiments, the controller uses one-step ahead prediction of the PV power in order to determine the amount of battery power needed to control the PV ramp rate. The controller may use the uncertainty in the PV prediction to statistically determine the minimum and maximum amount of battery power required for the ramp rate of the PV power to stay in compliance. The controller may then determine the total battery power required at any instant based on that required for frequency regulation, the state-of-charge of the battery, the power needed for ramp rate control, and the nature of the ramp rate event. If the PV power output is experiencing an up-ramp and the current stage-of-charge of the battery is within the desired range, the PV power inverter may be used to control the PV ramp rate rather than charging the battery. Additional features and advantages of the present invention are described in greater detail below.

Photovoltaic Energy System with Ramp Rate Control

Figure 1:
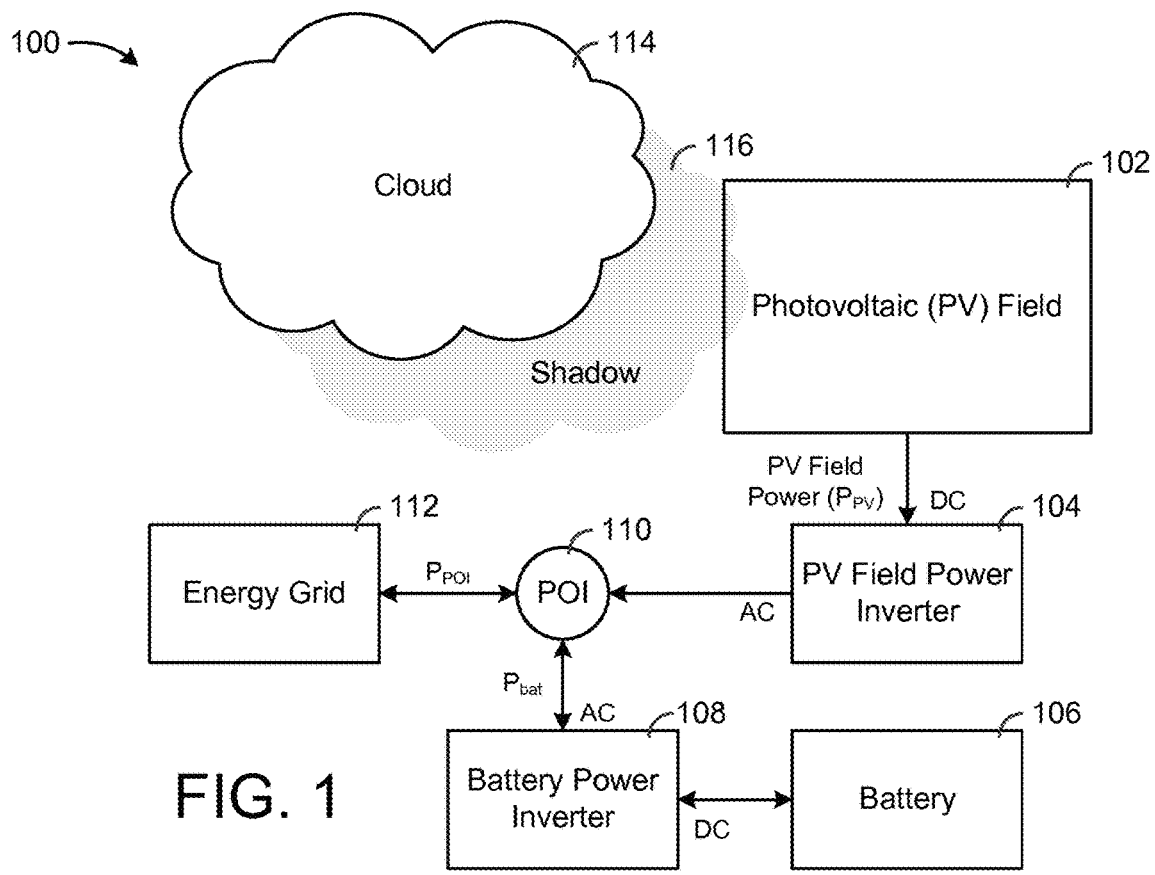
FIG. 1 is a block diagram of a photovoltaic (PV) energy system configured to perform ramp rate control, according to an exemplary embodiment.

Referring now to FIG. 1, a photovoltaic energy system 100 is shown, according to an exemplary embodiment. In brief overview, system 100 converts solar energy into electricity using solar panels or other materials that exhibit the photovoltaic effect. The electricity generated by system 100 may be used locally by system 100 (e.g., used to power components of system 100), provided to a building or campus connected to system 100, supplied to a regional energy grid, and/or stored in a battery. System 100 may use battery storage to perform load shifting and/or ramp rate control. Battery storage can also be used to perform frequency regulation. A photovoltaic energy system 300 that uses battery storage to simultaneously perform both ramp rate control and frequency regulation is described in greater detail with reference to FIGS. 3A-8.

System 100 is shown to include a photovoltaic (PV) field 102, a PV field power inverter 104, a battery 106, a battery power inverter 108, a point of interconnection (POI) 110, and an energy grid 112. PV field 102 may include a collection of photovoltaic cells. The photovoltaic cells are configured to convert solar energy (i.e., sunlight) into electricity using a photovoltaic material such as monocrystalline silicon, polycrystalline silicon, amorphous silicon, cadmium telluride, copper indium gallium selenide/sulfide, or other materials that exhibit the photovoltaic effect. In some embodiments, the photovoltaic cells are contained within packaged assemblies that form solar panels. Each solar panel may include a plurality of linked photovoltaic cells. The solar panels may combine to form a photovoltaic array.

PV field 102 may have any of a variety of sizes and/or locations. In some embodiments, PV field 102 is part of a large-scale photovoltaic power station (e.g., a solar park or farm) capable of providing an energy supply to a large number of consumers. When implemented as part of a large-scale system, PV field 102 may cover multiple hectares and may have power outputs of tens or hundreds of megawatts. In other embodiments, PV field 102 may cover a smaller area and may have a relatively lesser power output (e.g., between one and ten megawatts, less than one megawatt, etc.). For example, PV field 102 may be part of a rooftop-mounted system capable of providing enough electricity to power a single home or building. It is contemplated that PV field 102 may have any size, scale, and/or power output, as may be desirable in different implementations.

PV field 102 may generate a direct current (DC) output that depends on the intensity and/or directness of the sunlight to which the solar panels are exposed. The directness of the sunlight may depend on the angle of incidence of the sunlight relative to the surfaces of the solar panels. The intensity of the sunlight may be affected by a variety of environmental factors such as the time of day (e.g., sunrises and sunsets) and weather variables such as clouds that cast shadows upon PV field 102. For example, FIG. 1 is shown to include a cloud 114 that casts a shadow 116 on PV field 102 as cloud 114 passes over PV field 102. When PV field 102 is partially or completely covered by shadow 116, the power output of PV field 102 (i.e., PV field power $P_{PV}$) may drop as a result of the decrease in solar intensity. The variability of the PV field power output $P_{PV}$ is described in greater detail with reference to FIG. 2.

In some embodiments, PV field 102 is configured to maximize solar energy collection. For example, PV field 102 may include a solar tracker (e.g., a GPS tracker, a sunlight sensor, etc.) that adjusts the angle of the solar panels so that the solar panels are aimed directly at the sun throughout the day. The solar tracker may allow the solar panels to receive direct sunlight for a greater portion of the day and may increase the total amount of power produced by PV field 102. In some embodiments, PV field 102 includes a collection of mirrors, lenses, or solar concentrators configured to direct and/or concentrate sunlight on the solar panels. The energy generated by PV field 102 may be stored in battery 106 or provided to energy grid 112.

Still referring to FIG. 1, system 100 is shown to include a PV field power inverter 104. Power inverter 104 may be configured to convert the DC output of PV field 102 $P_{PV}$ into an alternating current (AC) output that can be fed into energy grid 112 or used by a local (e.g., off-grid) electrical network. For example, power inverter 104 may be a solar inverter or grid-tie inverter configured to convert the DC output from PV field 102 into a sinusoidal AC output synchronized to the grid frequency of energy grid 112. In some embodiments, power inverter 104 receives a cumulative DC output from PV field 102. For example, power inverter 104 may be a string inverter or a central inverter. In other embodiments, power inverter 104 may include a collection of micro-inverters connected to each solar panel or solar cell.

Power inverter 104 may receive the DC power output $P_{PV}$ from PV field 102 and convert the DC power output to an AC power output that can be fed into energy grid 112. Power inverter 104 may synchronize the frequency of the AC power output with that of energy grid 112 (e.g., 50 Hz or 60 Hz) using a local oscillator and may limit the voltage of the AC power output to no higher than the grid voltage. In some embodiments, power inverter 104 is a resonant inverter that includes or uses LC circuits to remove the harmonics from a simple square wave in order to achieve a sine wave matching the frequency of energy grid 112. In various embodiments, power inverter 104 may operate using high-frequency transformers, low-frequency transformers, or without transformers. Low-frequency transformers may convert the DC output from PV field 102 directly to the AC output provided to energy grid 112. High-frequency transformers may employ a multi-step process that involves converting the DC output to high-frequency AC, then back to DC, and then finally to the AC output provided to energy grid 112.

Power inverter 104 may be configured to perform maximum power point tracking and/or anti-islanding. Maximum power point tracking may allow power inverter 104 to produce the maximum possible AC power from PV field 102. For example, power inverter 104 may sample the DC power output from PV field 102 and apply a variable resistance to find the optimum maximum power point. Anti-islanding is a protection mechanism that immediately shuts down power inverter 104 (i.e., preventing power inverter 104 from generating AC power) when the connection to an electricity-consuming load no longer exists. In some embodiments, PV field power inverter 104 performs ramp rate control by limiting the power generated by PV field 102.

Still referring to FIG. 1, system 100 is shown to include a battery power inverter 108. In some embodiments, battery power inverter 108 is a bidirectional power inverter configured to control the power output/input of battery 106 (i.e., battery power $P_{bat}$). In other words, battery power inverter 108 controls the rate at which battery 106 charges or discharges stored electricity. The battery power $P_{bat}$ may be positive if battery power inverter 108 is drawing power from battery 106 or negative if battery power inverter 108 is storing power in battery 106.

Battery power inverter 108 may include some or all of the features of PV field power inverter 104. For example, battery power inverter 108 may be configured to receive a DC power output from battery 106 and convert the DC power output into an AC power output that can be fed into energy grid 112 (e.g., via POI 110). Battery power inverter 108 may also be configured to convert AC power from POI 110 into DC power that can be stored in battery 106. As such, battery power inverter 104 can function as both a power inverter and a rectifier to convert between DC and AC in either direction. The power outputs from PV field power inverter 104 and battery power inverter 108 combine at POI 110 to form the power output $P_{POI}$ provided to energy grid 112 (e.g., $P_{POI}=P_{PV}+P_{bat}$) $P_{POI}$ may be positive if POI 110 is providing power to energy grid 112 or negative if POI 110 is drawing power from energy grid 112.

Figure 2:
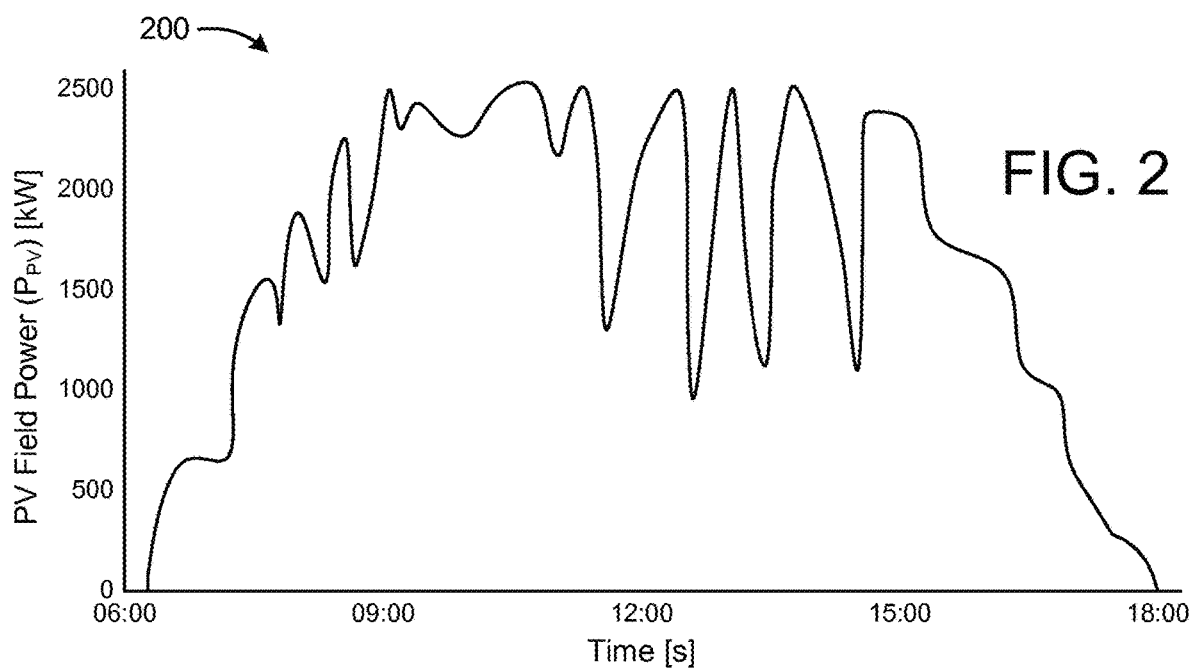
FIG. 2 is a graph illustrating the variability of the power output of the PV field of FIG. 1, according to an exemplary embodiment.

Referring now to FIG. 2, a graph 200 illustrating the variability of the PV field power output $P_{PV}$ generated by PV field 102 is shown, according to an exemplary embodiment. As shown in graph 200, the PV field power output $P_{PV}$ may be intermittent and can vary abruptly throughout the course of a day. For example, if a cloud passes over PV field 102, power output $P_{PV}$ may rapidly and temporarily drop while PV field 102 is within the cloud's shadow. This intermittency in PV power output $P_{PV}$ presents a problem to the stability of energy grid 112. System 100 uses ramp rate control to maintain the stability of energy grid 112 in the presence of a variable PV power output $P_{PV}$.

In system 100, ramp rate is defined as the time rate of change of the power output $P_{POI}$ provided to energy grid 112 (i.e., the power at POI 110). The power output $P_{POI}$ may vary depending on the magnitude of the DC output $P_{PV}$ provided by PV field 102 and the magnitude of the power output $P_{bat}$ from battery power inverter 108. System 100 may be configured to calculate the ramp rate by sampling power output $P_{POI}$ and determining a change in power output $P_{POI}$ over time. For example, system 100 may calculate the ramp rate as the derivative or slope of power output $P_{POI}$ as a function of time, as shown in the following equations:

$$\text{Ramp Rate} = \frac{dP_{POI}}{dt} \text{ or Ramp Rate} = \frac{\Delta P_{POI}}{\Delta t}$$

where $P_{POI}$ represents the power provided to energy grid 112 and t represents time.

In some embodiments, system 100 controls the ramp rate to comply with regulatory requirements or contractual requirements imposed by energy grid 112. For example, photovoltaic energy system 100 may be required to maintain the ramp rate within a predetermined range in order to deliver power to energy grid 112. In some embodiments, system 100 is required to maintain the absolute value of the ramp rate at less than a threshold value (e.g., less than 10% of the rated power capacity per minute). In other words, system 100 may be required to prevent power output $P_{POI}$ from increasing or decreasing too rapidly. If this requirement is not met, system 100 may be deemed to be in non-compliance and its capacity may be de-rated, which directly impacts the revenue generation potential of system 100.

System 100 may use battery 106 to perform ramp rate control. For example, system 100 may use energy from battery 106 to smooth a sudden drop in the PV power output $P_{PV}$ so that the absolute value of the ramp rate is less than a threshold value. As previously mentioned, a sudden drop in power output $P_{PV}$ may occur when a solar intensity disturbance occurs, such as a passing cloud blocking the sunlight to PV field 102. System 100 may use energy from battery 106 to make up the difference between the power output $P_{PV}$ of PV field 102 (which has suddenly dropped) and the minimum required power output to comply with ramp rate requirements. The energy from battery 106 allows system 100 to gradually decrease power output $P_{POI}$ so that the absolute value of the ramp rate does not exceed the threshold value.

Once the cloud has passed, the power output $P_{PV}$ may suddenly increase as the solar intensity returns to its previous value. System 100 may perform ramp rate control by gradually ramping up power output $P_{POI}$. Ramping up power output $P_{POI}$ may not require energy from battery 106. For example, power inverter 104 may use only a portion of the power output $P_{PV}$ (which has suddenly increased) to generate power output $P_{POI}$ (i.e., limiting the power output) so that the ramp rate of power output $P_{POI}$ does not exceed the threshold value. The remainder of the energy generated by PV field 102 (i.e., the excess energy) may be stored in battery 106 and/or dissipated. Limiting the energy generated by PV field 102 may include diverting or dissipating a portion of the energy generated by PV field 102 (e.g., using variable resistors or other circuit elements) so that only a portion of the energy generated by PV field 102 is provided to energy grid 112. This allows system 100 to ramp up power output $P_{POI}$ gradually without exceeding the ramp rate.

Photovoltaic Energy System with Frequency Regulation and Ramp Rate Control

Figure 3A:
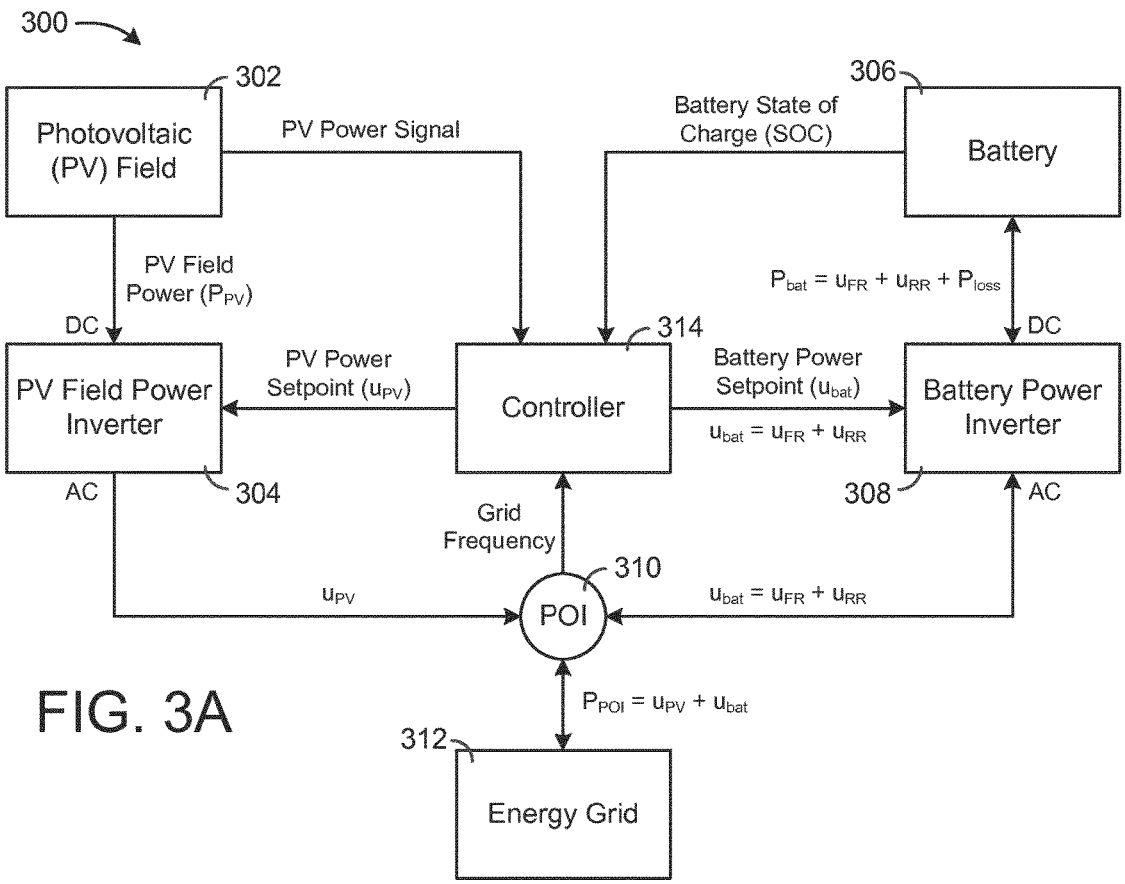
FIG. 3A is a block diagram of an electrical energy storage system configured to simultaneously perform both ramp rate control and frequency regulation while maintaining the state-of-charge of the battery within a desired range, according to an exemplary embodiment.
Figure 3B:
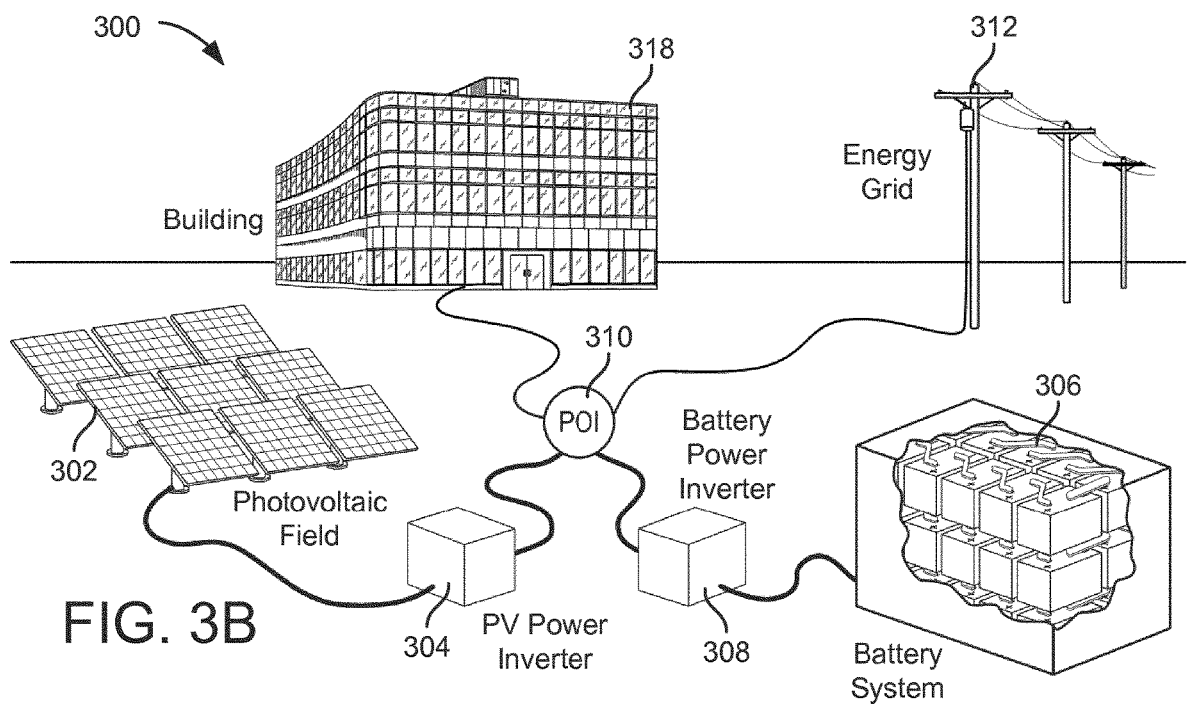
FIG. 3B is a drawing of the electrical energy storage system of FIG. 3A.
Figure 4:
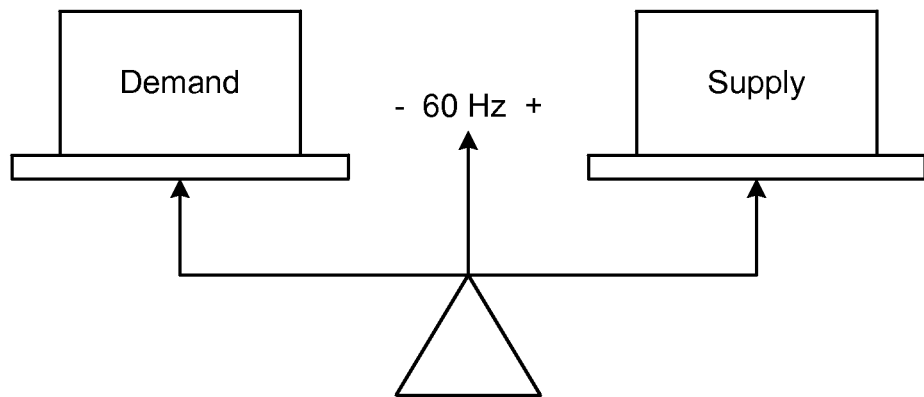
FIG. 4 is a drawing illustrating the electric supply to an energy grid and electric demand from the energy grid which must be balanced in order to maintain the grid frequency, according to an exemplary embodiment.

Referring now to FIGS. 3A-4, a photovoltaic energy system 300 that uses battery storage to simultaneously perform both ramp rate control and frequency regulation is shown, according to an exemplary embodiment. Frequency regulation is the process of maintaining the stability of the grid frequency (e.g., 60 Hz in the United States). As shown in FIG. 4, the grid frequency may remain balanced at 60 Hz as long as there is a balance between the demand from the energy grid and the supply to the energy grid. An increase in demand yields a decrease in grid frequency, whereas an increase in supply yields an increase in grid frequency. During a fluctuation of the grid frequency, system 300 may offset the fluctuation by either drawing more energy from the energy grid (e.g., if the grid frequency is too high) or by providing energy to the energy grid (e.g., if the grid frequency is too low). Advantageously, system 300 may use battery storage in combination with photovoltaic power to perform frequency regulation while simultaneously complying with ramp rate requirements and maintaining the state-of-charge of the battery storage within a predetermined desirable range.

Referring particularly to FIGS. 3A-3B, system 300 is shown to include a photovoltaic (PV) field 302, a PV field power inverter 304, a battery 306, a battery power inverter 308, a point of interconnection (POI) 310, and an energy grid 312. These components may be the same or similar to PV field 102, PV field power inverter 104, battery 106, battery power inverter 108, POI 110, and energy grid 112, as described with reference to FIG. 1. For example, PV field 302 may convert solar energy into a DC power output $P_{PV}$ and provide the DC power output $P_{PV}$ to PV field power inverter 304. PV field power inverter 304 may convert the DC power output $P_{PV}$ into an AC power output $u_{PV}$ and provide the AC power output $u_{PV}$ to POI 310.

In some embodiments, system 300 also includes a controller 314 (shown in FIG. 3A) and/or a building 318 (shown in FIG. 3B). In brief overview, PV field power inverter 304 can be operated by controller 314 to control the power output of PV field 302. Similarly, battery power inverter 308 can be operated by controller 314 to control the power input and/or power output of battery 306. The power outputs of PV field power inverter 304 and battery power inverter 308 combine at POI 310 to form the power provided to energy grid 312. In some embodiments, building 318 is also connected to POI 310. Building 318 can consume a portion of the combined power at POI 310 to satisfy the energy requirements of building 318.

PV field power inverter 304 can include any of a variety of circuit components (e.g., resistors, capacitors, indictors, transformers, transistors, switches, diodes, etc.) configured to perform the functions described herein. In some embodiments DC power from PV field 302 is connected to a transformer of PV field power inverter 304 through a center tap of a primary winding. A switch can be rapidly switched back and forth to allow current to flow back to PV field 302 following two alternate paths through one end of the primary winding and then the other. The alternation of the direction of current in the primary winding of the transformer can produce alternating current (AC) in a secondary circuit.

In some embodiments, PV field power inverter 304 uses an electromechanical switching device to convert DC power from PV field 302 into AC power. The electromechanical switching device can include two stationary contacts and a spring supported moving contact. The spring can hold the movable contact against one of the stationary contacts, whereas an electromagnet can pull the movable contact to the opposite stationary contact. Electric current in the electromagnet can be interrupted by the action of the switch so that the switch continually switches rapidly back and forth. In some embodiments, PV field power inverter 304 uses transistors, thyristors (SCRs), and/or various other types of semiconductor switches to convert DC power from PV field 302 into AC power. SCRs provide large power handling capability in a semiconductor device and can readily be controlled over a variable firing range.

In some embodiments, PV field power inverter 304 produces a square voltage waveform (e.g., when not coupled to an output transformer). In other embodiments, PV field power inverter 304 produces a sinusoidal waveform that matches the sinusoidal frequency and voltage of energy grid 312. For example, PV field power inverter 304 can use Fourier analysis to produce periodic waveforms as the sum of an infinite series of sine waves. The sine wave that has the same frequency as the original waveform is called the fundamental component. The other sine waves, called harmonics, that are included in the series have frequencies that are integral multiples of the fundamental frequency.

In some embodiments, PV field power inverter 304 uses inductors and/or capacitors to filter the output voltage waveform. If PV field power inverter 304 includes a transformer, filtering can be applied to the primary or the secondary side of the transformer or to both sides. Low-pass filters can be applied to allow the fundamental component of the waveform to pass to the output while limiting the passage of the harmonic components. If PV field power inverter 304 is designed to provide power at a fixed frequency, a resonant filter can be used. If PV field power inverter 304 is an adjustable frequency inverter, the filter can be tuned to a frequency that is above the maximum fundamental frequency. In some embodiments, PV field power inverter 304 includes feedback rectifiers or antiparallel diodes connected across semiconductor switches to provide a path for a peak inductive load current when the switch is turned off. The antiparallel diodes can be similar to freewheeling diodes commonly used in AC/DC converter circuits.

Like PV field power inverter 304, battery power inverter 308 can include any of a variety of circuit components (e.g., resistors, capacitors, indictors, transformers, transistors, switches, diodes, etc.) configured to perform the functions described herein. Battery power inverter 308 can include many of the same components as PV field power inverter 304 and can operate using similar principles. For example, battery power inverter 308 can use electromechanical switching devices, transistors, thyristors (SCRs), and/or various other types of semiconductor switches to convert between AC and DC power. Battery power inverter 308 can operate the circuit components to adjust the amount of power stored in battery 306 and/or discharged from battery 306 (i.e., power throughput) based on a power control signal or power setpoint from controller 314.

Battery power inverter 308 may be configured to draw a DC power $P_{bat}$ from battery 306, convert the DC power $P_{bat}$ into an AC power $u_{bat}$, and provide the AC power $u_{bat}$ to POI 310. Battery power inverter 308 may also be configured to draw the AC power $u_{bat}$ from POI 310, convert the AC power $u_{bat}$ into a DC battery power $P_{bat}$, and store the DC battery power $P_{bat}$ in battery 306. The DC battery power $P_{bat}$ may be positive if battery 306 is providing power to battery power inverter 308 (i.e., if battery 306 is discharging) or negative if battery 306 is receiving power from battery power inverter 308 (i.e., if battery 306 is charging). Similarly, the AC battery power $u_{bat}$ may be positive if battery power inverter 308 is providing power to POI 310 or negative if battery power inverter 308 is receiving power from POI 310.

The AC battery power $u_{bat}$ is shown to include an amount of power used for frequency regulation (i.e., $u_{FR}$) and an amount of power used for ramp rate control (i.e., $u_{RR}$) which together form the AC battery power (i.e., $u_{bat}=u_{FR}+u_{RR}$). The DC battery power $P_{bat}$ is shown to include both $u_{RR}$ and $u_{RR}$ as well as an additional term $P_{loss}$ representing power losses in battery 306 and/or battery power inverter 308 (i.e., $P_{bat}=u_{FR}+u_{RR}+P_{loss}$). The PV field power $u_{PV}$ and the battery power $u_{bat}$ combine at POI 110 to form $P_{POI}$ (i.e., $P_{POI}=u_{PV}+u_{bat}$), which represents the amount of power provided to energy grid 312. $P_{POI}$ may be positive if POI 310 is providing power to energy grid 312 or negative if POI 310 is receiving power from energy grid 312.

Still referring to FIG. 3A, system 300 is shown to include a controller 314. Controller 314 may be configured to generate a PV power setpoint $u_{PV}$ for PV field power inverter 304 and a battery power setpoint $u_{bat}$ for battery power inverter 308. Throughout this disclosure, the variable $u_{PV}$ is used to refer to both the PV power setpoint generated by controller 314 and the AC power output of PV field power inverter 304 since both quantities have the same value. Similarly, the variable $u_{bat}$ is used to refer to both the battery power setpoint generated by controller 314 and the AC power output/input of battery power inverter 308 since both quantities have the same value.

PV field power inverter 304 uses the PV power setpoint $u_{PV}$ to control an amount of the PV field power $P_{RI}$, to provide to POI 110. The magnitude of $u_{PV}$ may be the same as the magnitude of $P_{RI}$, or less than the magnitude of $P_{PV}$. For example, $u_{PV}$ may be the same as $P_{PV}$ if controller 314 determines that PV field power inverter 304 is to provide all of the photovoltaic power $P_{PV}$ to POI 310. However, $u_{PV}$ may be less than $P_{PV}$ if controller 314 determines that PV field power inverter 304 is to provide less than all of the photovoltaic power $P_{RI}$, to POI 310. For example, controller 314 may determine that it is desirable for PV field power inverter 304 to provide less than all of the photovoltaic power $P_{PV}$, to POI 310 to prevent the ramp rate from being exceeded and/or to prevent the power at POI 310 from exceeding a power limit.

Battery power inverter 308 uses the battery power setpoint $u_{bat}$ to control an amount of power charged or discharged by battery 306. The battery power setpoint $u_{bat}$ may be positive if controller 314 determines that battery power inverter 308 is to draw power from battery 306 or negative if controller 314 determines that battery power inverter 308 is to store power in battery 306. The magnitude of $u_{bat}$ controls the rate at which energy is charged or discharged by battery 306.

Controller 314 may generate $u_{PV}$ and $u_{bat}$ based on a variety of different variables including, for example, a power signal from PV field 302 (e.g., current and previous values for $P_{PV}$), the current state-of-charge (SOC) of battery 306, a maximum battery power limit, a maximum power limit at POI 310, the ramp rate limit, the grid frequency of energy grid 312, and/or other variables that can be used by controller 314 to perform ramp rate control and/or frequency regulation. Advantageously, controller 314 generates values for $u_{PV}$ and $u_{bat}$ that maintain the ramp rate of the PV power within the ramp rate compliance limit while participating in the regulation of grid frequency and maintaining the SOC of battery 306 within a predetermined desirable range. Controller 314 is described in greater detail with reference to FIGS. 5-7. Exemplary processes which may be performed by controller 314 to generate the PV power setpoint $u_{PV}$ and the battery power setpoint $u_{bat}$ are described with reference to FIGS. 8-10.

Reactive Ramp Rate Control

Controller 314 may be configured to control a ramp rate of the power output 316 provided to energy grid 312. Ramp rate may be defined as the time rate of change of power output 316. Power output 316 may vary depending on the magnitude of the DC output provided by PV field 302. For example, if a cloud passes over PV field 302, power output 316 may rapidly and temporarily drop while PV field 302 is within the cloud's shadow. Controller 314 may be configured to calculate the ramp rate by sampling power output 316 and determining a change in power output 316 over time. For example, controller 314 may calculate the ramp rate as the derivative or slope of power output 316 as a function of time, as shown in the following equations:

$$\text{Ramp Rate} = \frac{dP}{dt} \text{ or Ramp Rate} = \frac{\Delta P}{\Delta t}$$

where P represents power output 316 and t represents time.

In some embodiments, controller 314 controls the ramp rate to comply with regulatory requirements or contractual requirements imposed by energy grid 312. For example, system 300 may be required to maintain the ramp rate within a predetermined range in order to deliver power to energy grid 312. In some embodiments, system 300 is required to maintain the absolute value of the ramp rate at less than a threshold value (e.g., less than 10% of the rated power capacity per minute). In other words, system 300 may be required to prevent power output 316 from increasing or decreasing too rapidly. If this requirement is not met, system 300 may be deemed to be in non-compliance and its capacity may be de-rated, which directly impacts the revenue generation potential of system 300.

Controller 314 may use battery 306 to perform ramp rate control. For example, controller 314 may use energy from battery 306 to smooth a sudden drop in power output 316 so that the absolute value of the ramp rate is less than a threshold value. As previously mentioned, a sudden drop in power output 316 may occur when a solar intensity disturbance occurs, such as a passing cloud blocking the sunlight to PV field 302. Controller 314 may use the energy from battery 306 to make up the difference between the power provided by PV field 302 (which has suddenly dropped) and the minimum required power output 316 to maintain the required ramp rate. The energy from battery 306 allows controller 314 to gradually decrease power output 316 so that the absolute value of the ramp rate does not exceed the threshold value.

Once the cloud has passed, the power output from PV field 302 may suddenly increase as the solar intensity returns to its previous value. Controller 314 may perform ramp rate control by gradually ramping up power output 316. Ramping up power output 316 may not require energy from battery 306. For example, power inverter 304 may use only a portion of the energy generated by PV field 302 (which has suddenly increased) to generate power output 316 (i.e., limiting the power output) so that the ramp rate of power output 316 does not exceed the threshold value. The remainder of the energy generated by PV field 302 (i.e., the excess energy) may be stored in battery 306 and/or dissipated. Limiting the energy generated by PV field 302 may include diverting or dissipating a portion of the energy generated by PV field 302 (e.g., using variable resistors or other circuit elements) so that only a portion of the energy generated by PV field 302 is provided to energy grid 312. This allows power inverter 304 to ramp up power output 316 gradually without exceeding the ramp rate. The excess energy may be stored in battery 306, used to power other components of system 300, or dissipated.

Figure 11:
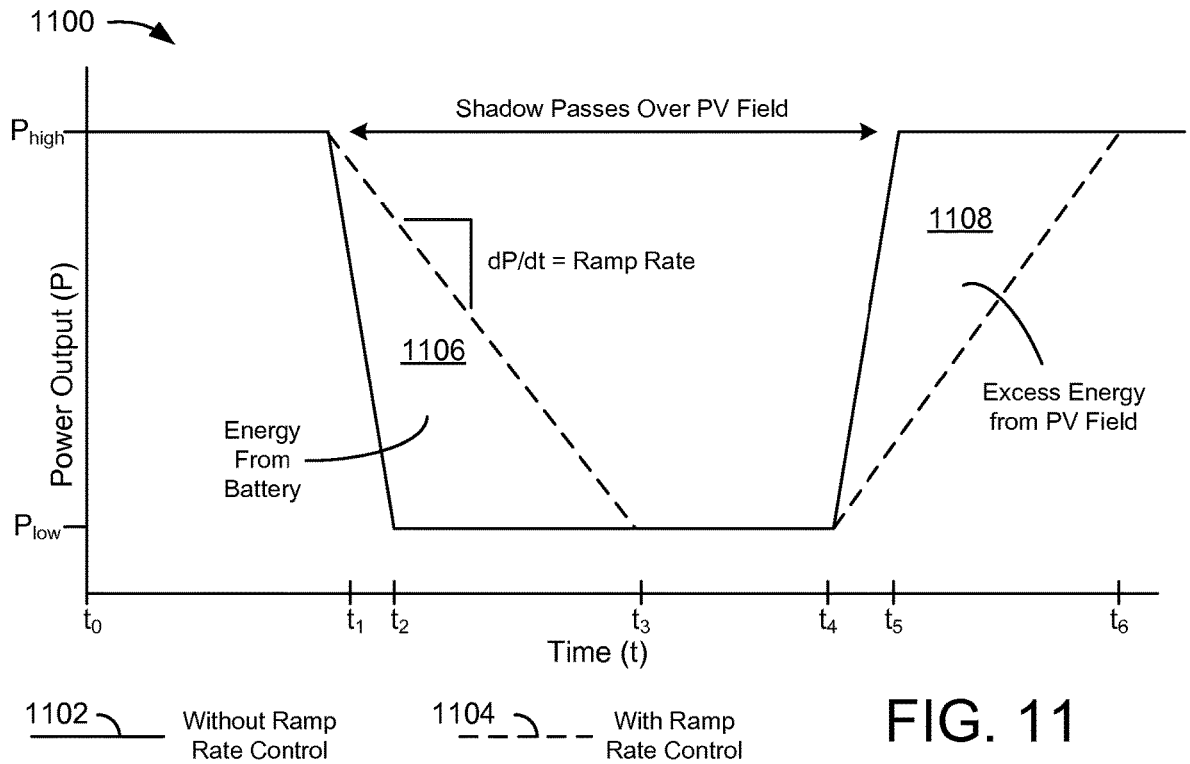
FIG. 11 is a graph illustrating a reactive ramp rate control technique which can be used by the electrical energy storage system of FIGS. 3A-3B, according to an exemplary embodiment.

Referring now to FIG. 11, a graph 1100 illustrating a reactive ramp rate control technique which can be used by system 300 is shown, according to an exemplary embodiment. Graph 1100 plots the power output P provided to energy grid 312 as a function of time t. The solid line 1102 illustrates power output P without any ramp rate control, whereas the broken line 1104 illustrates power output P with ramp rate control.

Between times $t_0$ and $t_1$, power output P is at a high value $P_{high}$. At time $t_1$, a cloud begins to cast its shadow on PV field 302, causing the power output of PV field 302 to suddenly decrease, until PV field 302 is completely in shadow at time $t_2$. Without any ramp rate control, the sudden drop in power output from PV field 302 causes the power output P to rapidly drop to a low value $P_k$, at time $t_2$. However, with ramp rate control, system 300 uses energy from battery 306 to gradually decrease power output P to $P_{low}$ at time $t_3$. Triangular region 1106 represents the energy from battery 306 used to gradually decrease power output P.

Between times $t_2$ and $t_4$, PV field 302 is completely in shadow. At time $t_4$, the shadow cast by the cloud begins to move off PV field 302, causing the power output of PV field 302 to suddenly increase, until PV field 302 is entirely in sunlight at time $t_5$. Without any ramp rate control, the sudden increase in power output from PV field 302 causes the power output P to rapidly increase to the high value $P_{high}$ at time $t_5$. However, with ramp rate control, power inverter 304 limits the energy from PV field 302 to gradually increase power output P to $P_{high}$ at time $t_6$. Triangular region 1108 represents the energy generated by PV field 302 in excess of the ramp rate limit. The excess energy may be stored in battery 306 and/or dissipated in order to gradually increase power output P at a rate no greater than the maximum allowable ramp rate.

Notably, both triangular regions 1106 and 1108 begin after a change in the power output of PV field 302 occurs. As such, both the decreasing ramp rate control and the increasing ramp rate control provided by system 300 are reactionary processes triggered by a detected change in the power output. In some embodiments, a feedback control technique is used to perform ramp rate control in system 300. For example, controller 314 may monitor power output 316 and determine the absolute value of the time rate of change of power output 316 (e.g., dP/dt or ΔP/Δt). Controller 314 may initiate ramp rate control when the absolute value of the time rate of change of power output 316 exceeds a threshold value.

Preemptive Ramp Rate Control

In some embodiments, controller 314 is configured to predict when solar intensity disturbances will occur and may cause power inverter 304 to ramp down the power output 316 provided to energy grid 312 preemptively. Instead of reacting to solar intensity disturbances after they occur, controller 314 can actively predict solar intensity disturbances and preemptively ramp down power output 316 before the disturbances affect PV field 302. Advantageously, this allows system controller 314 to perform both ramp down control and ramp up control by using only a portion of the energy provided by PV field 302 to generate power output 316 while the power output of PV field 302 is still high, rather than relying on energy from a battery. The remainder of the energy generated by PV field 302 (i.e., the excess energy) may be stored in battery 306 and/or dissipated.

In some embodiments, controller 314 predicts solar intensity disturbances using input from one or more cloud detectors. The cloud detectors may include an array of solar intensity sensors. The solar intensity sensors may be positioned outside PV field 302 or within PV field 302. Each solar intensity sensor may have a known location. In some embodiments, the locations of the solar intensity sensors are based on the geometry and orientation of PV field 302. For example, if PV field 302 is rectangular, more sensors may be placed along its long side than along its short side. A cloud formation moving perpendicular to the long side may cover more area of PV field 302 per unit time than a cloud formation moving perpendicular to the short side. Therefore, it may be desirable to include more sensors along the long side to more precisely detect cloud movement perpendicular to the long side. As another example, more sensors may be placed along the west side of PV field 302 than along the east side of PV field 302 since cloud movement from west to east is more common than cloud movement from east to west.

The placement of sensors may be selected to detect approaching cloud formations without requiring unnecessary or redundant sensors.

The solar intensity sensors may be configured to measure solar intensity at various locations outside PV field 302. When the solar intensity measured by a particular solar intensity sensor drops below a threshold value, controller 314 may determine that a cloud is currently casting a shadow on the solar intensity sensor. Controller 314 may use input from multiple solar intensity sensors to determine various attributes of clouds approaching PV field 302 and/or the shadows produced by such clouds. For example, if a shadow is cast upon two or more of the solar intensity sensors sequentially, controller 314 may use the known positions of the solar intensity sensors and the time interval between each solar intensity sensor detecting the shadow to determine how fast the cloud/shadow is moving. If two or more of the solar intensity sensors are within the shadow simultaneously, controller 314 may use the known positions of the solar intensity sensors to determine a position, size, and/or shape of the cloud/shadow.

Although the cloud detectors are described primarily as solar intensity sensors, it is contemplated that the cloud detectors may include any type of device configured to detect the presence of clouds or shadows cast by clouds. For example, the cloud detectors may include one or more cameras that capture visual images of cloud movement. The cameras may be upward-oriented cameras located below the clouds (e.g., attached to a structure on the Earth) or downward-oriented cameras located above the clouds (e.g., satellite cameras). Images from the cameras may be used to determine cloud size, position, velocity, and/or other cloud attributes. In some embodiments, the cloud detectors include radar or other meteorological devices configured to detect the presence of clouds, cloud density, cloud velocity, and/or other cloud attributes. In some embodiments, controller 314 receives data from a weather service that indicates various cloud attributes.

Advantageously, controller 314 may use the attributes of the clouds/shadows to determine when a solar intensity disturbance (e.g., a shadow) is approaching PV field 302. For example, controller 314 may use the attributes of the clouds/shadows to determine whether any of the clouds are expected to cast a shadow upon PV field 302. If a cloud is expected to cast a shadow upon PV field 302, controller 314 may use the size, position, and/or velocity of the cloud/shadow to determine a portion of PV field 302 that will be affected. The affected portion of PV field 302 may include some or all of PV field 302. Controller 314 may use the attributes of the clouds/shadows to quantify a magnitude of the expected solar intensity disturbance (e.g., an expected decrease in power output from PV field 302) and to determine a time at which the disturbance is expected to occur (e.g., a start time, an end time, a duration, etc.).

In some embodiments, controller 314 predicts a magnitude of the disturbance for each of a plurality of time steps. Controller 314 may use the predicted magnitudes of the disturbance at each of the time steps to generate a predicted disturbance profile. The predicted disturbance profile may indicate how fast power output 316 is expected to change as a result of the disturbance. Controller 314 may compare the expected rate of change to a ramp rate threshold to determine whether ramp rate control is required. For example, if power output 316 is predicted to decrease at a rate in excess of the maximum compliant ramp rate, controller 314 may preemptively implement ramp rate control to gradually decrease power output 316.

In some embodiments, controller 314 identifies the minimum expected value of power output 316 and determines when the predicted power output is expected to reach the minimum value. Controller 314 may subtract the minimum expected power output 316 from the current power output 316 to determine an amount by which power output 316 is expected to decrease. Controller 314 may apply the maximum allowable ramp rate to the amount by which power output 316 is expected to decrease to determine a minimum time required to ramp down power output 316 in order to comply with the maximum allowable ramp rate. For example, controller 314 may divide the amount by which power output 316 is expected to decrease (e.g., measured in units of power) by the maximum allowable ramp rate (e.g., measured in units of power per unit time) to identify the minimum time required to ramp down power output 316. Controller 314 may subtract the minimum required time from the time at which the predicted power output is expected to reach the minimum value to determine when to start preemptively ramping down power output 316.

Advantageously, controller 314 may preemptively act upon predicted disturbances by causing power inverter 304 to ramp down power output 316 before the disturbances affect PV field 302. This allows power inverter 304 to ramp down power output 316 by using only a portion of the energy generated by PV field 302 to generate power output 316 (i.e., performing the ramp down while the power output is still high), rather than requiring additional energy from a battery (i.e., performing the ramp down after the power output has decreased). The remainder of the energy generated by PV field 302 (i.e., the excess energy) may be stored in battery 306 and/or dissipated.

Figure 12:
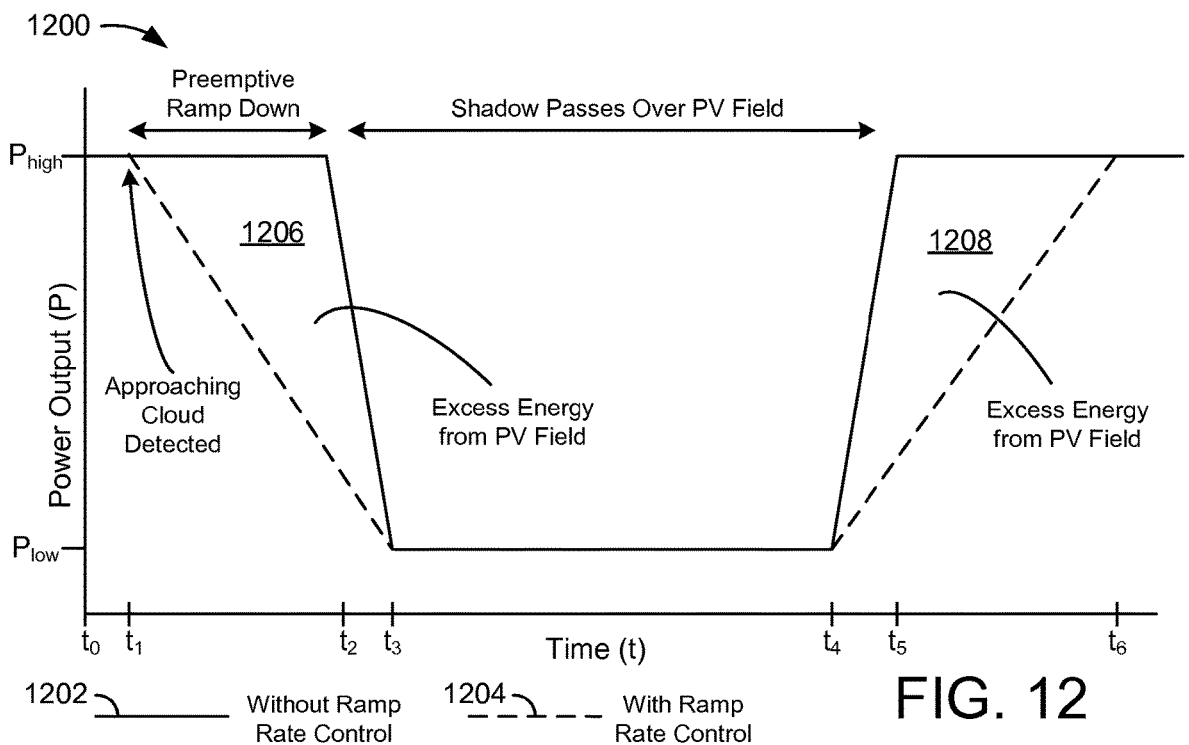
FIG. 12 is a graph illustrating a preemptive ramp rate control technique which can be used by the electrical energy storage system of FIGS. 3A-3B, according to an exemplary embodiment.

Referring now to FIG. 12, a graph 1200 illustrating a preemptive ramp rate control technique which can be used by controller 314 is shown, according to an exemplary embodiment. Graph 1200 plots the power output P provided to energy grid 312 as a function of time t. The solid line 1202 illustrates power output P without any ramp rate control, whereas the broken line 1204 illustrates power output P with preemptive ramp rate control.

Between times $t_0$ and $t_2$, power output P is at a high value $P_{high}$. At time $t_2$, a cloud begins to cast its shadow on PV field 302, causing the power output of PV field 302 to suddenly decrease, until PV field 302 is completely in shadow at time $t_3$. Without any ramp rate control, the sudden drop in power output from PV field 302 causes the power output P to rapidly drop from $P_{high}$ to a low value $P_{low}$ between times $t_2$ and $t_3$. However, with preemptive ramp rate control, controller 314 preemptively causes power inverter 304 to begin ramping down power output P at time $t_1$, prior to the cloud casting a shadow on PV field 302. The preemptive ramp down occurs between times $t_1$ and $t_3$, resulting in a ramp rate that is relatively more gradual. Triangular region 1206 represents the energy generated by PV field 302 in excess of the ramp rate limit. The excess energy may be limited by power inverter 304 and/or stored in battery 306 to gradually decrease power output P at a rate no greater than the ramp rate limit.

Between times $t_3$ and $t_4$, PV field 302 is completely in shadow. At time $t_4$, the shadow cast by the cloud begins to move off PV field 302, causing the power output of PV field 302 to suddenly increase, until PV field 302 is entirely in sunlight at time $t_5$. Without any ramp rate control, the sudden increase in power output from PV field 302 causes the power output P to rapidly increase to the high value $P_{high}$ at time $t_5$. However, with ramp rate control, power inverter 304 uses only a portion of the energy from PV field 302 to gradually increase power output P to $P_{high}$ at time $t_6$. Triangular region 1208 represents the energy generated by PV field 302 in excess of the ramp rate limit. The excess energy may be limited by power inverter 304 and/or stored in battery 306 to gradually increase power output P at a rate no greater than the ramp rate limit.

Notably, a significant portion of triangular region 1206 occurs between times $t_1$ and $t_2$, before the disturbance affects PV field 302. As such, the decreasing ramp rate control provided by system 300 is a preemptive process triggered by detecting an approaching cloud, prior to the cloud casting a shadow upon PV field 302. In some embodiments, controller 314 uses a predictive control technique (e.g., feedforward control, model predictive control, etc.) to perform ramp down control in system 300. For example, controller 314 may actively monitor the positions, sizes, velocities, and/or other attributes of clouds/shadows that could potentially cause a solar intensity disturbance affecting PV field 302. When an approaching cloud is detected at time $t_1$, controller 314 may preemptively cause power inverter 304 to begin ramping down power output 316. This allows power inverter 304 to ramp down power output 316 by limiting the energy generated by PV field 302 while the power output is still high, rather than requiring additional energy from a battery to perform the ramp down once the power output has dropped.

Frequency Regulation and Ramp Rate Controller

Figure 5:
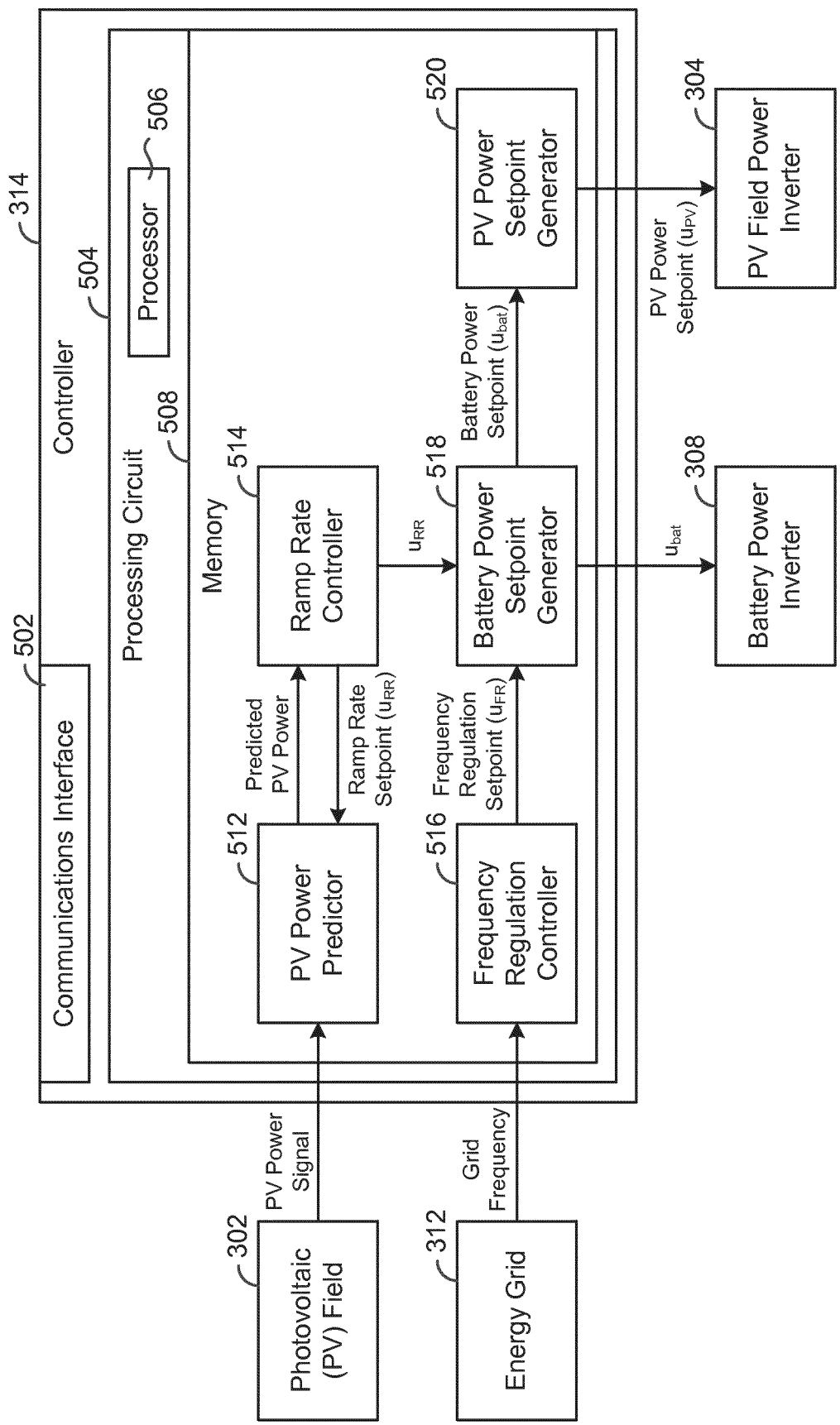
FIG. 5 is a block diagram illustrating the controller of FIG. 3A in greater detail, according to an exemplary embodiment.

Referring now to FIG. 5, a block diagram illustrating controller 314 in greater detail is shown, according to an exemplary embodiment. Controller 314 is shown to include a communications interface 502 and a processing circuit 504. Communications interface 502 may include wired or wireless interfaces (e.g., jacks, antennas, transmitters, receivers, transceivers, wire terminals, etc.) for conducting data communications with various systems, devices, or networks. For example, communications interface 302 may include an Ethernet card and port for sending and receiving data via an Ethernet-based communications network and/or a WiFi transceiver for communicating via a wireless communications network. Communications interface 502 may be configured to communicate via local area networks or wide area networks (e.g., the Internet, a building WAN, etc.) and may use a variety of communications protocols (e.g., BACnet, IP, LON, etc.).

Communications interface 502 may be a network interface configured to facilitate electronic data communications between controller 314 and various external systems or devices (e.g., PV field 302, energy grid 312, PV field power inverter 304, battery power inverter 308, etc.). For example, controller 314 may receive a PV power signal from PV field 302 indicating the current value of the PV power $P_{PV}$ generated by PV field 302. Controller 314 may use the PV power signal to predict one or more future values for the PV power $P_{PV}$ and generate a ramp rate setpoint $u_{RR}$. Controller 314 may receive a grid frequency signal from energy grid 312 indicating the current value of the grid frequency. Controller 314 may use the grid frequency to generate a frequency regulation setpoint $u_{FR}$. Controller 314 may use the ramp rate setpoint $u_{RR}$ and the frequency regulation setpoint $u_{FR}$ to generate a battery power setpoint $u_{bat}$ and may provide the battery power setpoint $u_{bat}$ to battery power inverter 308. Controller 314 may use the battery power setpoint $u_{bat}$ to generate a PV power setpoint $u_{PV}$ and may provide the PV power setpoint $u_{PV}$ to PV field power inverter 304.

Still referring to FIG. 5, processing circuit 504 is shown to include a processor 506 and memory 508. Processor 506 may be a general purpose or specific purpose processor, an application specific integrated circuit (ASIC), one or more field programmable gate arrays (FPGAs), a group of processing components, or other suitable processing components. Processor 506 may be configured to execute computer code or instructions stored in memory 508 or received from other computer readable media (e.g., CDROM, network storage, a remote server, etc.).

Memory 508 may include one or more devices (e.g., memory units, memory devices, storage devices, etc.) for storing data and/or computer code for completing and/or facilitating the various processes described in the present disclosure. Memory 508 may include random access memory (RAM), read-only memory (ROM), hard drive storage, temporary storage, non-volatile memory, flash memory, optical memory, or any other suitable memory for storing software objects and/or computer instructions. Memory 508 may include database components, object code components, script components, or any other type of information structure for supporting the various activities and information structures described in the present disclosure. Memory 508 may be communicably connected to processor 506 via processing circuit 504 and may include computer code for executing (e.g., by processor 506) one or more processes described herein.

Predicting PV Power Output

Still referring to FIG. 5, controller 314 is shown to include a PV power predictor 512. PV power predictor 512 may receive the PV power signal from PV field 302 and use the PV power signal to make a short term prediction of the photovoltaic power output $P_{PV}$. In some embodiments, PV power predictor 512 predicts the value of $P_{PV}$ for the next time step (i.e., a one step ahead prediction). For example, at each time step k, PV power predictor 512 may predict the value of the PV power output $P_{PV}$ for the next time step k+1 (i.e., $\hat{P}_{PV}(k+1)$). Advantageously, predicting the next value for the PV power output $P_{PV}$ allows controller 314 to predict the ramp rate and perform an appropriate control action to prevent the ramp rate from exceeding the ramp rate compliance limit.

In some embodiments, PV power predictor 512 performs a time series analysis to predict $\hat{P}_{PV}(k+1)$. A time series may be defined by an ordered sequence of values of a variable at equally spaced intervals. PV power predictor 512 may model changes between values of $P_{PV}$ over time using an autoregressive moving average (ARMA) model or an autoregressive integrated moving average (ARIMA) model. PV power predictor 512 may use the model to predict the next value of the PV power output $P_{PV}$ and correct the prediction using a Kalman filter each time a new measurement is acquired. The time series analysis technique is described in greater detail in the following paragraphs.

In some embodiments, PV power predictor 512 uses a technique in the Box-Jenkins family of techniques to perform the time series analysis. These techniques are statistical tools that use past data (e.g., lags) to predict or correct new data, and other techniques to find the parameters or coefficients of the time series. A general representation of a time series from the Box-Jenkins approach is:

$$X_k - \sum_{r=1}^{p} \varphi_r X_{k-r} = \sum_{s=0}^{q} \theta_s \epsilon_{k-s}$$

which is known as an ARMA process. In this representation, the parameters p and q define the order and number of lags of the time series, $\varphi$ is an autoregressive parameter, and $\theta$ is a moving average parameter. This representation is desirable for a stationary process which has a mean, variance, and autocorrelation structure that does not change over time. However, if the original process $\{Y_k\}$ representing the time series values of $P_{PV}$ is not stationary, $X_k$ can represent the first difference (or higher order difference) of the process $\{Y_k - Y_{k-1}\}$. If the difference is stationary, PV power predictor 512 may model the process as an ARIMA process.

PV power predictor 512 may be configured to determine whether to use an ARMA model or an ARIMA model to model the time series of the PV power output $P_{PV}$. Determining whether to use an ARMA model or an ARIMA model may include identifying whether the process is stationary. As shown in FIG. 2, the power output $P_{PV}$ is not stationary. However, the first difference $Y_k - Y_{k-1}$ may be stationary. Accordingly, PV power predictor 512 may select an ARIMA model to represent the time series of $P_{PV}$.

PV power predictor 512 may find values for the parameters p and q that define the order and the number of lags of the time series. In some embodiments, PV power predictor 512 finds values for p and q by checking the partial autocorrelation function (PACF) and selecting a number where the PACF approaches zero (e.g., p=q). For the time series data shown in FIG. 2, PV power predictor 512 may determine that a 4$^{th}$ or 5$^{th}$ order model is appropriate. However, it is contemplated that PV power predictor 512 may select a different model order to represent different time series processes.

PV power predictor 512 may find values for the autoregressive parameter $\varphi_{1 \ldots p}$ and the moving average parameter $\theta_{1 \ldots q}$. In some embodiments, PV power predictor 512 uses an optimization algorithm to find values for $\varphi_{1 \ldots p}$ and $\theta_{1 \ldots q}$ given the time series data $\{Y_k\}$. For example, PV power predictor 512 may generate a discrete-time ARIMA model of the form:

$$A(z)y(k) = \left[\frac{C(z)}{1-z^{-1}}\right]e(t)$$

where A(z) and C(z) are defined as follows:

$$A(z)=1+\varphi_1 z^{-1}+\varphi_2 z^{-2}+\varphi_3 z^{-3}+\varphi_4 z^{-4}$$

$$C(z)=1+\theta_1 z^{-1}+\theta_2 z^{-2}+\theta_3 z^{-3}+\theta_4 z^{-4}$$

where the values for $\varphi_{1 \ldots p}$ and $\theta_{1 \ldots q}$ are determined by fitting the model to the time series values of $P_{PV}$.

In some embodiments, PV power predictor 512 uses the ARIMA model as an element of a Kalman filter. The Kalman filter may be used by PV power predictor 512 to correct the estimated state and provide tighter predictions based on actual values of the PV power output $P_{PV}$. In order to use the ARIMA model with the Kalman filter, PV power predictor 512 may generate a discrete-time state-space representation of the ARIMA model of the form:

$$x(k+1)=Ax(k)+Ke(k)$$

$$y(k)=Cx(k)+e(k)$$

where y(k) represents the values of the PV power output $P_{PV}$ and e(k) is a disturbance considered to be normal with zero mean and a variance derived from the fitted model. It is contemplated that the state-space model can be represented in a variety of different forms. For example, the ARIMA model can be rewritten as a difference equation and used to generate a different state-space model using state-space modeling techniques. In various embodiments, PV power predictor 512 may use any of a variety of different forms of the state-space model.

The discrete Kalman filter consists of an iterative process that takes a state-space model and forwards it in time until there are available data to correct the predicted state and obtain a better estimate. The correction may be based on the evolution of the mean and covariance of an assumed white noise system. For example, PV power predictor 512 may use a state-space model of the following form:

$$x(k+1)=Ax(k)+Bu(k)+w(k)\ w(k)\sim N(0,Q)$$

$$y(k)=Cx(k)+Du(k)+v(k)\ v(k)\sim N(0,R)$$

where N( ) represents a normal distribution, v(k) is the measurement error having zero mean and variance R, and w(k) is the process error having zero mean and variance Q. The values of R and Q are design choices. The variable x(k) is a state of the process and the variable y(k) represents the PV power output $P_{PV}(k)$. This representation is referred to as a stochastic state-space representation.

PV power predictor 512 may use the Kalman filter to perform an iterative process to predict $\hat{P}_{PV}(k+1)$ based on the current and previous values of $P_{PV}$ (e.g., $P_{PV}(k)$, $P_{PV}(k-1)$, etc.). The iterative process may include a prediction step and an update step. The prediction step moves the state estimate forward in time using the following equations:

$$\hat{x}^-(k+1)=A*\hat{x}(k)$$

$$P^-(k+1)=A*P(k)*A^T+Q$$

where $\bar{x}(k)$ is the mean of the process or estimated state at time step k and P(k) is the covariance of the process at time step k. The super index "−" indicates that the estimated state $\hat{x}^-(k+1)$ is based on the information known prior to time step k+1 (i.e., information up to time step k). In other words, the measurements at time step k+1 have not yet been incorporated to generate the state estimate $\hat{x}^-(k+1)$. This is known as an a priori state estimate.

PV power predictor 512 may predict the PV power output $\hat{P}_{PV}(k+1)$ by determining the value of the predicted measurement $\hat{y}^-(k+1)$. As previously described, the measurement y(k) and the state x(k) are related by the following equation:

$$y(k)=Cx(k)+e(k)$$

which allows PV power predictor 512 to predict the measurement $\hat{y}^-(k-1)$ as a function of the predicted state $\hat{x}^-(k-1)$. PV power predictor 512 may use the measurement estimate $\hat{y}^-(k+1)$ as the value for the predicted PV power output $\hat{P}_{PV}(k+1)$ (i.e., $\hat{P}_{PV}(k+1)=\hat{y}(k+1)$).

The update step uses the following equations to correct the a priori state estimate $\hat{x}^-(k+1)$ based on the actual (measured) value of y(k+1):

$$K=P^-(k+1)*C^T*[R+C*P^-(k+1)*C^T]^{-1}$$

$$\hat{x}(k+1)=\hat{x}^-(k+1)+K*[y(k+1)C*\hat{x}^-(k+1)]$$

$$P(k+1)=P^-(k+1)K*[R+C*P^-(k+1)*C^T]*K^T$$

where y(k+1) corresponds to the actual measured value of $P_{PV}(k+1)$. The variable $\hat{x}(k+1)$ represents the a posteriori estimate of the state x at time k+1 given the information known up to time step k+1. The update step allows PV power predictor 512 to prepare the Kalman filter for the next iteration of the prediction step.

Although PV power predictor 512 is primarily described as using a time series analysis to predict $\hat{P}_{PV}(k+1)$, it is contemplated that PV power predictor 512 may use any of a variety of techniques to predict the next value of the PV power output $P_{PV}$. For example, PV power predictor 512 may use a deterministic plus stochastic model trained from historical PV power output values (e.g., linear regression for the deterministic portion and an AR model for the stochastic portion). This technique is described in greater detail in U.S. patent application Ser. No. 14/717,593, titled "Building Management System for Forecasting Time Series Values of Building Variables" and filed May 20, 2015, the entirety of which is incorporated by reference herein.

In other embodiments, PV power predictor 512 uses input from cloud detectors (e.g., cameras, light intensity sensors, radar, etc.) to predict when an approaching cloud will cast a shadow upon PV field 302. When an approaching cloud is detected, PV power predictor 512 may estimate an amount by which the solar intensity will decrease as a result of the shadow and/or increase once the shadow has passed PV field 302. PV power predictor 512 may use the predicted change in solar intensity to predict a corresponding change in the PV power output $P_{PV}$. This technique is described in greater detail in U.S. Provisional Patent Application No. 62/239,131 titled "Systems and Methods for Controlling Ramp Rate in a Photovoltaic Energy System" and filed Oct. 8, 2015, the entirety of which is incorporated by reference herein. PV power predictor 512 may provide the predicted PV power output $\hat{P}_{PV}(k+1)$ to ramp rate controller 514.

Controlling Ramp Rate

Still referring to FIG. 5, controller 314 is shown to include a ramp rate controller 514. Ramp rate controller 514 may be configured to determine an amount of power to charge or discharge from battery 306 for ramp rate control (i.e., $u_{RR}$). Advantageously, ramp rate controller 514 may determine a value for the ramp rate power $u_{RR}$ that simultaneously maintains the ramp rate of the PV power (i.e., $u_{RR}+P_{PV}$) within compliance limits while allowing controller 314 to regulate the frequency of energy grid 312 and while maintaining the state-of-charge of battery 306 within a predetermined desirable range.

In some embodiments, the ramp rate of the PV power is within compliance limits as long as the actual ramp rate evaluated over a one minute interval does not exceed ten percent of the rated capacity of PV field 302. The actual ramp rate may be evaluated over shorter intervals (e.g., two seconds) and scaled up to a one minute interval. Therefore, a ramp rate may be within compliance limits if the ramp rate satisfies one or more of the following inequalities:

$$|rr| < \frac{0.1 P_{cap}}{30}(1 + \text{tolerance})$$

$$|RR| < 0.1 P_{cap}(1 + \text{tolerance})$$

where rr is the ramp rate calculated over a two second interval, RR is the ramp rate calculated over a one minute interval, $P_{cap}$ is the rated capacity of PV field 302, and tolerance is an amount by which the actual ramp rate can exceed the compliance limit without resulting in a non-compliance violation (e.g., tolerance=10%). In this formulation, the ramp rates rr and RR represent a difference in the PV power (e.g., measured in kW) at the beginning and end of the ramp rate evaluation interval.

Simultaneous implementation of ramp rate control and frequency regulation can be challenging (e.g., can result in non-compliance), especially if the ramp rate is calculated as the difference in the power $P_{POI}$ at POI 310. In some embodiments, the ramp rate over a two second interval is defined as follows:

$$rr = [P_{POI}(k) - P_{POI}(k-1)] - [u_{FR}(k) - u_{FR}(k-1)]$$

where $P_{POI}(k-1)$ and $P_{POI}(k)$ are the total powers at POI 310 measured at the beginning and end, respectively, of a two second interval, and $u_{FR}(k-1)$ and $u_{FR}(k)$ are the powers used for frequency regulation measured at the beginning and end, respectively, of the two second interval.

The total power at POI 310 (i.e., $P_{POI}$) is the sum of the power output of PV field power inverter 304 (i.e., $u_{PV}$) and the power output of battery power inverter 308 (i.e., $u_{bat}=u_{FR}+u_{RR}$). Assuming that PV field power inverter 304 is not limiting the power $P_{PV}$ generated by PV field 302, the output of PV field power inverter 304 $u_{PV}$ may be equal to the PV power output $P_{PV}$ (i.e., $P_{PV}=u_p$) and the total power $P_{POI}$ at POI 310 can be calculated using the following equation:

$$P_{POI} = P_{PV} + u_{FR} + u_{RR}$$

Therefore, the ramp rate rr can be rewritten as:

$$rr = P_{PV}(k) - P_{PV}(k-1) + u_{RR}(k) - u_{RR}(k-1)$$

and the inequality which must be satisfied to comply with the ramp rate limit can be rewritten as:

$$|P_{PV}(k) - P_{PV}(k-1) + u_{RR}(k) - u_{RR}(k-1)| < \frac{0.1 P_{cap}}{30}(1 + \text{tolerance})$$

where $P_{PV}(k-1)$ and $P_{PV}(k)$ are the power outputs of PV field 302 measured at the beginning and end, respectively, of the two second interval, and $u_{RR}(k-1)$ and $u_{RR}(k)$ are the powers used for ramp rate control measured at the beginning and end, respectively, of the two second interval.

In some embodiments, ramp rate controller 514 determines the ramp rate compliance of a facility based on the number of scans (i.e., monitored intervals) in violation that occur within a predetermined time period (e.g., one week) and the total number of scans that occur during the predetermined time period. For example, the ramp rate compliance RRC may be defined as a percentage and calculated as follows:

$$RRC = 100\left(1 - \frac{n_{vscan}}{n_{tscan}}\right)$$

where $n_{vscan}$ is the number of scans over the predetermined time period where rr is in violation and $n_{tscan}$ is the total number of scans during which the facility is performing ramp rate control during the predetermined time period.

In some embodiments, the intervals that are monitored or scanned to determine ramp rate compliance are selected arbitrarily or randomly (e.g., by a power utility). Therefore, it may be impossible to predict which intervals will be monitored. Additionally, the start times and end times of the intervals may be unknown. In order to guarantee ramp rate compliance and minimize the number of scans where the ramp rate is in violation, ramp rate controller 514 may determine the amount of power $u_{RR}$ used for ramp rate control ahead of time. In other words, ramp rate controller 514 may determine, at each instant, the amount of power $u_{RR}$ to be used for ramp rate control at the next instant. Since the start and end times of the intervals may be unknown, ramp rate controller 514 may perform ramp rate control at smaller time intervals (e.g., on the order of milliseconds).

Figure 6:
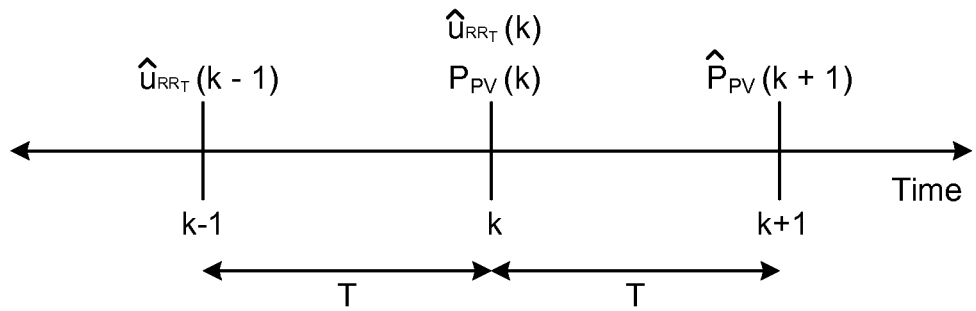
FIG. 6 is a timeline illustrating a one-step-ahead prediction of the PV power output which may be used by the controller of FIG. 3A to generate battery power setpoints and PV power setpoints, according to an exemplary embodiment.
Figure 7:
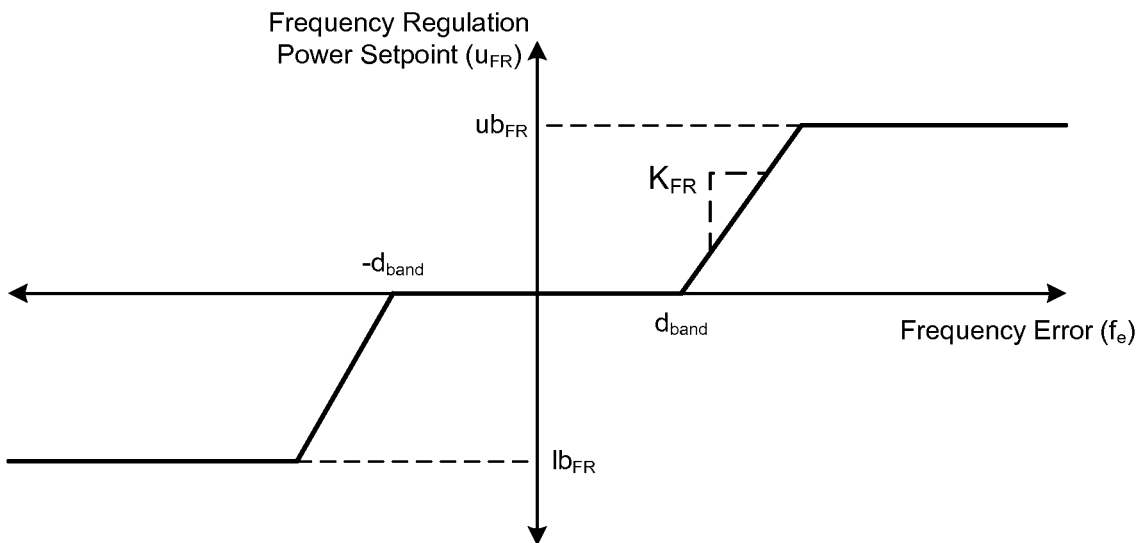
FIG. 7 is a graph illustrating a frequency regulation control law which may be used by the controller of FIG. 3A to generate a frequency regulation power setpoint, according to an exemplary embodiment.

As shown in FIG. 6, ramp rate controller 514 may use the predicted PV power $\hat{P}_{PV}(k+1)$ at instant k+1 and the current PV power $P_{PV}(k)$ at instant k to determine the ramp rate control power $\hat{u}_{RR_T}(k)$ at instant k. Advantageously, this allows ramp rate controller 514 to determine whether the PV power $P_{PV}$ is in an up-ramp, a down-ramp, or no-ramp at instant k. Assuming a T seconds time resolution, ramp rate controller 514 may determine the value of the power for ramp rate control $\hat{u}_{RR_T}(k)$ at instant k based on the predicted value of the PV power $\hat{P}_{PV}(k+1)$, the current value of the PV power $P_{PV}(k)$, and the previous power used for ramp rate control $\hat{u}_{RR_T}(k-1)$. Scaling to T seconds and assuming a tolerance of zero, ramp rate compliance is guaranteed if $\hat{u}_{RR_T}(k)$ satisfies the following inequality:

$$lb_{RR_T} \leq \hat{u}_{RR_T} \leq ub_{RR_T}$$

where T is the sampling time in seconds, $lb_{RR_T}$ is the lower bound on $\hat{u}_{RR_T}(k)$, and $ub_{RR_T}$ is the upper bound on $\hat{u}_{RR_T}(k)$.

In some embodiments, the lower bound $lb_{RR_T}$ and the upper bound $ub_{RR_T}$ are defined as follows:

$$lb_{RR_T} = -(\hat{P}_{PV}(k+1) - P_{PV}(k)) + \hat{u}_{RR_T}(k-1) - \frac{0.1 P_{cap}}{60/T} + \lambda \sigma$$

$$ub_{RR_T} = -(\hat{P}_{PV}(k+1) - P_{PV}(k)) + \hat{u}_{RR_T}(k-1) + \frac{0.1 P_{cap}}{60/T} - \lambda \sigma$$

where $\sigma$ is the uncertainty on the PV power prediction and $\lambda$ is a scaling factor of the uncertainty in the PV power prediction. Advantageously, the lower bound $lb_{RR_T}$ and the upper bound $ub_{RR_T}$ provide a range of ramp rate power $\hat{u}_{RR_T}(k)$ that guarantees compliance of the rate of change in the PV power.

In some embodiments, ramp rate controller 514 determines the ramp rate power $\hat{u}_{RR_T}(k)$ based on whether the PV power $P_{PV}$ is in an up-ramp, a down-ramp, or no-ramp (e.g., the PV power is not changing or changing at a compliant rate) at instant k. Ramp rate controller 514 may also consider the state-of-charge (SOC) of battery 306 when determining $\hat{u}_{RR_T}(k)$ Exemplary processes which may be performed by ramp rate controller 514 to generate values for the ramp rate power $\hat{u}_{RR_T}(k)$ are described in detail with reference to FIGS. 8-10. Ramp rate controller 514 may provide the ramp rate power setpoint $\hat{u}_{RR_T}(k)$ to battery power setpoint generator 518 for use in determining the battery power setpoint $u_{bat}$.

Controlling Frequency Regulation

Referring again to FIG. 5, controller 314 is shown to include a frequency regulation controller 516. Frequency regulation controller 516 may be configured to determine an amount of power to charge or discharge from battery 306 for frequency regulation (i.e., $u_{FR}$). Frequency regulation controller 516 is shown receiving a grid frequency signal from energy grid 312. The grid frequency signal may specify the current grid frequency $f_{grid}$ of energy grid 312. In some embodiments, the grid frequency signal also includes a scheduled or desired grid frequency $f_s$ to be achieved by performing frequency regulation. Frequency regulation controller 516 may determine the frequency regulation setpoint $u_{FR}$ based on the difference between the current grid frequency $f_{grid}$ and the scheduled frequency $f_s$.

In some embodiments, the range within which the grid frequency $f_{grid}$ is allowed to fluctuate is determined by an electric utility. Any frequencies falling outside the permissible range may be corrected by performing frequency regulation. Facilities participating in frequency regulation may be required to supply or consume a contracted power for purposes of regulating grid frequency $f_{grid}$ (e.g., up to 10% of the rated capacity of PV field 302 per frequency regulation event).

In some embodiments, frequency regulation controller 516 performs frequency regulation using a dead-band control technique with a gain that is dependent upon the difference $f_e$ between the scheduled grid frequency $f_s$ and the actual grid frequency $f_{grid}$ (i.e., $f_e = f_s - f_{grid}$) and an amount of power required for regulating a given deviation amount of frequency error $f_e$. Such a control technique is shown graphically in FIG. 7 and expressed mathematically by the following equation:

$$u_{FR}(k) = \min(\max(lb_{FR}, \alpha), ub_{FR})$$

where $lb_{FR}$ and $ub_{FR}$ are the contracted amounts of power up to which power is to be consumed or supplied by a facility. $lb_{FR}$ and $ub_{FR}$ may be based on the rated capacity $P_{cap}$ of PV field 302 as shown in the following equations:

$$lb_{FR} = -0.1 \times P_{cap}$$

$$ub_{FR} = 0.1 \times P_{cap}$$

The variable $\alpha$ represents the required amount of power to be supplied or consumed from energy grid 312 to offset the frequency error $f_e$. In some embodiments, frequency regulation controller 516 calculates $\alpha$ using the following equation:

$$\alpha = K_{FR} \times \text{sign}(f_e) \times \max(|f_e| d_{band}, 0)$$

where $d_{band}$ is the threshold beyond which a deviation in grid frequency must be regulated and $K_{FR}$ is the control gain. In some embodiments, frequency regulation controller 516 calculates the control gain $K_{FR}$ as follows:

$$K_{FR} = \frac{P_{cap}}{0.01 \times \text{droop} \times f_s}$$

where droop is a parameter specifying a percentage that defines how much power must be supplied or consumed to offset a 1 Hz deviation in the grid frequency. Frequency regulation controller 516 may calculate the frequency regulation setpoint $u_{FR}$ using these equations and may provide the frequency regulation setpoint to battery power setpoint generator 518.

Generating Battery Power Setpoints

Still referring to FIG. 5, controller 314 is shown to include a battery power setpoint generator 518. Battery power setpoint generator 518 may be configured to generate the battery power setpoint $u_{bat}$ for battery power inverter 308. The battery power setpoint $u_{bat}$ is used by battery power inverter 308 to control an amount of power drawn from battery 306 or stored in battery 306. For example, battery power inverter 308 may draw power from battery 306 in response to receiving a positive battery power setpoint $u_{bat}$ from battery power setpoint generator 518 and may store power in battery 306 in response to receiving a negative battery power setpoint $u_{bat}$ from battery power setpoint generator 518.

Battery power setpoint generator 518 is shown receiving the ramp rate power setpoint $u_{RR}$ from ramp rate controller 514 and the frequency regulation power setpoint $u_{FR}$ from frequency regulation controller 516. In some embodiments, battery power setpoint generator 518 calculates a value for the battery power setpoint $u_{bat}$ by adding the ramp rate power setpoint $u_{RR}$ and the frequency response power setpoint $u_{FR}$. For example, battery power setpoint generator 518 may calculate the battery power setpoint $u_{bat}$ using the following equation:

$$u_{bat} = u_{RR} + u_{FR}$$

In some embodiments, battery power setpoint generator 518 adjusts the battery power setpoint $u_{bat}$ based on a battery power limit for battery 306. For example, battery power setpoint generator 518 may compare the battery power setpoint $u_{bat}$ with the battery power limit battPowerLimit. If the battery power setpoint is greater than the battery power limit (i.e., $u_{bat}$>battPowerLimit), battery power setpoint generator 518 may replace the battery power setpoint $u_{bat}$ with the battery power limit. Similarly, if the battery power setpoint is less than the negative of the battery power limit (i.e., $u_{bat}$<battPowerLimit), battery power setpoint generator 518 may replace the battery power setpoint $u_{bat}$ with the negative of the battery power limit.

In some embodiments, battery power setpoint generator 518 causes frequency regulation controller 516 to update the frequency regulation setpoint $u_{FR}$ in response to replacing the battery power setpoint $u_{bat}$ with the battery power limit battPowerLimit or the negative of the battery power limit −battPowerLimit. For example, if the battery power setpoint $u_{bat}$ is replaced with the positive battery power limit battPowerLimit, frequency regulation controller 516 may update the frequency regulation setpoint $u_{FR}$ using the following equation:

$$u_{FR}(k) = \text{battPowerLimit} - \hat{u}_{RR_T}(k)$$

Similarly, if the battery power setpoint $u_{bat}$ is replaced with the negative battery power limit −battPowerLimit, frequency regulation controller 516 may update the frequency regulation setpoint $u_{FR}$ using the following equation:

$$u_{FR}(k) = -\text{battPowerLimit} - \hat{u}_{RR_T}(k)$$

These updates ensure that the amount of power used for ramp rate control $\hat{u}_{RR_T}(k)$ and the amount of power used for frequency regulation $u_{FR}(k)$ can be added together to calculate the battery power setpoint $u_{bat}$. Battery power setpoint generator 518 may provide the battery power setpoint $u_{bat}$ to battery power inverter 308 and to PV power setpoint generator 520.

Generating PV Power Setpoints

Still referring to FIG. 5, controller 314 is shown to include a PV power setpoint generator 520. PV power setpoint generator 520 may be configured to generate the PV power setpoint $u_{PV}$ for PV field power inverter 304. The PV power setpoint $u_{PV}$ is used by PV field power inverter 304 to control an amount of power from PV field 302 to provide to POI 310.

In some embodiments, PV power setpoint generator 520 sets a default PV power setpoint $u_{PV}(k)$ for instant k based on the previous value of the PV power $P_{PV}(k-1)$ at instant k−1. For example, PV power setpoint generator 520 may increment the previous PV power $P_{PV}(k-1)$ with the compliance limit as shown in the following equation:

$$u_{PV}(k) = P_{PV}(k-1) + \frac{0.1 P_{cap}}{60/T} - \lambda \sigma$$

This guarantees compliance with the ramp rate compliance limit and gradual ramping of the PV power output to energy grid 312. The default PV power setpoint may be useful to guarantee ramp rate compliance when the system is turned on, for example, in the middle of a sunny day or when an up-ramp in the PV power output $P_{PV}$ is to be handled by limiting the PV power at PV power inverter 304 instead of charging battery 306.

In some embodiments, PV power setpoint generator 520 updates the PV power setpoint $u_{PV}(k)$ based on the value of the battery power setpoint $u_{bat}(k)$ so that the total power provided to POI 310 does not exceed a POI power limit. For example, PV power setpoint generator 520 may use the PV power setpoint $u_{PV}(k)$ and the battery power setpoint $u_{bat}(k)$ to calculate the total power $P_{POI}(k)$ at point of intersection 310 using the following equation:

$$P_{POI}(k) = u_{bat}(k) + u_{PV}(k)$$

PV power setpoint generator 520 may compare the calculated power $P_{POI}(k)$ with a power limit for POI 310 (i.e., POIPowerLimit). If the calculated power $P_{POI}(k)$ exceeds the POI power limit (i.e., $P_{POI}(k)$>POIPowerLimit), PV power setpoint generator 520 may replace the calculated power $P_{POI}(k)$ with the POI power limit. PV power setpoint generator 520 may update the PV power setpoint $u_{PV}(k)$ using the following equation:

$$u_{PV}(k) = \text{POIPowerLimit} - u_{bat}(k)$$

This ensures that the total power provided to POI 310 does not exceed the POI power limit by causing PV field power inverter 304 to limit the PV power. PV power setpoint generator 520 may provide the PV power setpoint $u_{PV}$ to PV field power inverter 304.

Figure 8:
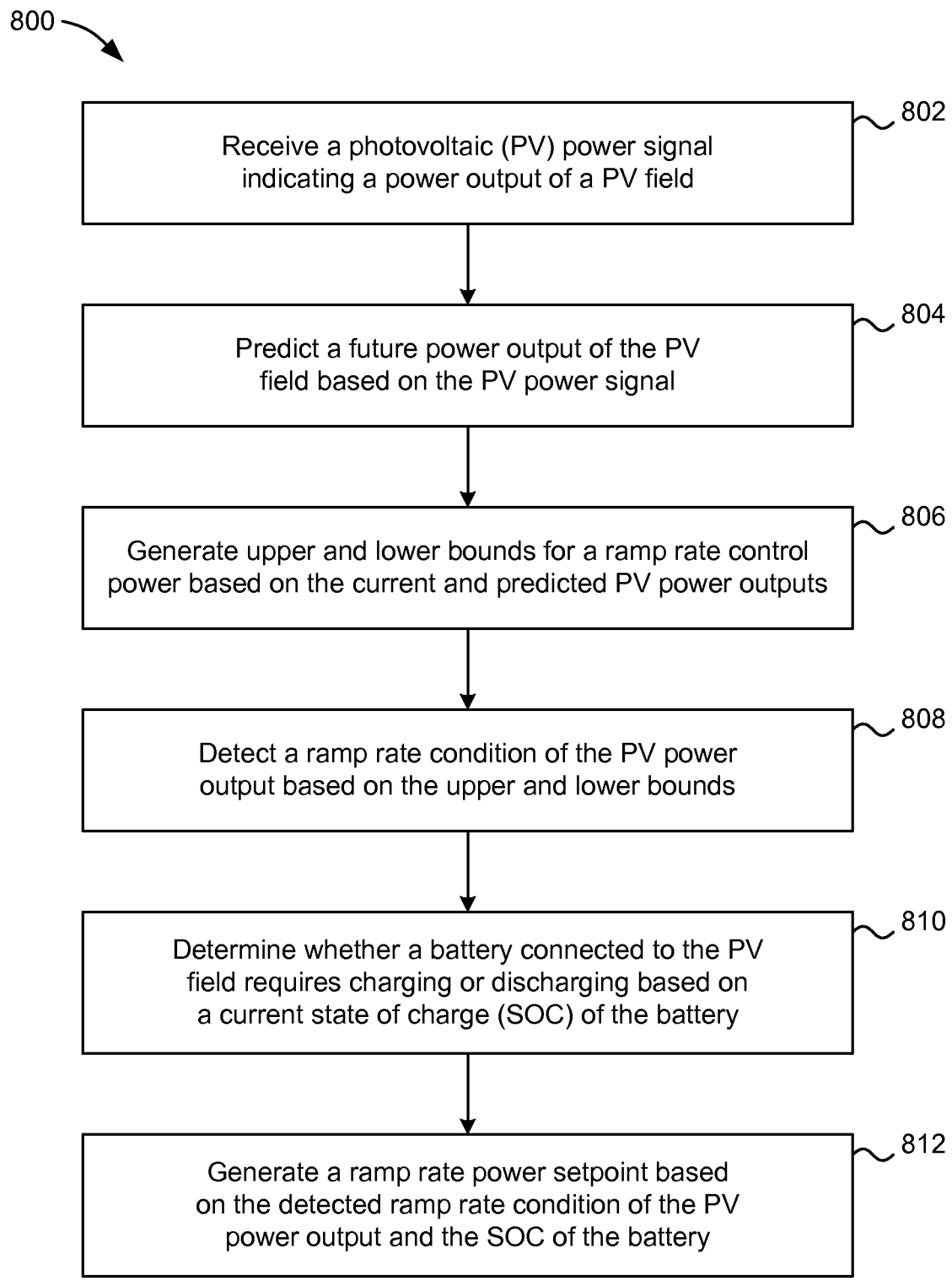
FIG. 8 is a flowchart of a process for generating ramp rate power setpoints which may be performed by the controller of FIG. 3A, according to an exemplary embodiment.

Frequency Regulation and Ramp Rate Control Processes Generating Ramp Rate Power Setpoints Referring now to FIG. 8, a flowchart of a process 800 for generating a ramp rate power setpoint is shown, according to an exemplary embodiment. Process 800 may be performed by one or more components of controller 314 (e.g., PV power predictor, 512 ramp rate controller 514, etc.) to generate the ramp rate power setpoint $\hat{u}_{RR_T}(k)$. A more detailed version of process 800 is described with reference to FIGS. 9A-9D.

Process 800 is shown to include receiving a photovoltaic (PV) power signal indicating a power output $P_{PV}$ of a PV field (step 802) and predicting a future power output of the PV field based on the PV power signal (step 804). Steps 802-804 may be performed by PV power predictor 512, as described with reference to FIG. 5. Step 804 may include performing a time series analysis of the PV power signal at each instant k to predict the value of the PV power output $\hat{P}_{PV}(k+1)$ at the next instant k+1. In some embodiments, step 804 includes using a Kalman filter to perform an iterative process to predict $\hat{P}_{PV}(k+1)$ based on the current and previous values of $P_{PV}$ (e.g., $P_{PV}(k)$, $P_{PV}(k-1)$, etc.).

Process 800 is shown to include generating upper and lower bounds for a ramp rate control power based on the current and predicted power outputs (step 806). Step 806 may be performed by ramp rate controller 514, as described with reference to FIG. 5. The upper and lower bounds place upper and lower limits on the ramp rate control power $\hat{u}_{RR_T}(k)$, as shown in the following equation:

$$lb_{RR_T} \leq \hat{u}_{RR_T}(k) \leq ub_{RR_T}$$

where $lb_{RR_T}$ is the lower bound and $ub_{RR_T}$ is the upper bound. In some embodiments, step 806 includes calculating the upper bound $ub_{RR_T}$ and the lower bound $lb_{RR_T}$ using the following equations:

$$lb_{RR_T} = -\left(\hat{P}_{PV}(k+1) - P_{PV}(k)\right) + \hat{u}_{RR_T}(k-1) - \frac{0.1 P_{cap}}{60/T} + \lambda\sigma$$

$$ub_{RR_T} = -\left(\hat{P}_{PV}(k+1) - P_{PV}(k)\right) + \hat{u}_{RR_T}(k-1) + \frac{0.1 P_{cap}}{60/T} - \lambda\sigma$$

where $\hat{P}_{PV}(k+1)$ is the value of the PV power output at instant k+1 predicted in step 804, $P_{PV}(k)$ is the current value of the PV power output at instant k, $\hat{u}_{RR_T}(k-1)$ is the previous value of the ramp rate control power determined for instant k−1, $P_{cap}$ is the rated capacity of the PV field, T is the time interval over which the ramp rate is calculated (e.g., two seconds, 100 milliseconds, microseconds, etc.), σ is the uncertainty of the predicted PV power output $\hat{P}_{PV}(k+1)$, and λ is a scaling factor of the uncertainty in the PV power prediction.

Still referring to FIG. 8, process 800 is shown to include detecting a ramp rate condition of the PV power output based on the upper and lower bounds (step 808). Step 808 may include determining whether the PV power output is currently ramping-up, ramping-down, or not ramping. Ramping-up may occur when the PV power output $P_{PV}$ is increasing at a rate that exceeds the ramp rate compliance limit. Ramping-down may occur when the PV power output $P_{PV}$ is decreasing at a rate that exceeds the ramp rate compliance limit. If the PV power output $P_{PV}$ is neither ramping-up nor ramping-down the PV power output may be considered to be not ramping (e.g., not changing or changing at a rate within the ramp rate compliance limit).

Advantageously, the values of the upper bound $ub_{RR_T}$ and the lower bound $lb_{RR_T}$ can be used to determine the ramp rate condition. For example, if both the upper bound $ub_{RR_T}$ and the lower bound $lb_{RR_T}$ are positive (i.e., $lb_{RR_T} > 0$), the ramp rate control power $\hat{u}_{RR_T}(k)$ must also be positive. This indicates that power will be drawn from the battery in order to compensate for a ramping-down of the PV power output. Conversely, if both the upper bound $ub_{RR_T}$ and the lower bound $lb_{RR_T}$ are negative (i.e., $ub_{RR_T} < 0$), the ramp rate control power $\hat{u}_{RR_T}(k)$ must also be negative. This indicates that power will be stored in the battery (or dissipated by PV field power inverter 304) in order to compensate for a ramping-up of the PV power output. If the upper bound $ub_{RR_T}$ is positive and the lower bound $lb_{RR_T}$ is negative, the ramp rate control power $\hat{u}_{RR_T}(k)$ can have a value of zero. This indicates ramp rate control is not required since the PV power output is neither ramping-up nor ramping-down.

Still referring to FIG. 8, process 800 is shown to include determining whether a battery connected to the PV field requires charging or discharging based on a current state-of-charge (SOC) of the battery (step 810). Step 810 may include comparing the current SOC of the battery (i.e., SOC) to a SOC setpoint (i.e., $SOC_{sp}$). If the difference between the SOC of the battery and the SOC setpoint exceeds a threshold value (i.e., $SOC_{tol}$), charging or discharging may be required. For example, charging may be required if the current SOC of the battery is less than the SOC setpoint by an amount exceeding the threshold (i.e., $SOC - SOC_{sp} < - SOC_{tol}$). Conversely, discharging may be required if the current SOC of the battery is greater than the SOC setpoint by an amount exceeding the threshold (i.e., $SOC - SOC_{sp} > - SOC_{tol}$). If the difference between the SOC of the battery and the SOC setpoint does not exceed the threshold value (i.e., $|SOC - SOC_{sp}| \leq SOC_{tol}$), neither charging nor discharging may be required to maintain the desired state-of-charge. However, the battery may still be charged or discharged to ensure that the ramp rate remains within compliance limits, as previously described.

Process 800 is shown to include generating a ramp rate power setpoint based on the detected ramp rate condition of the PV power output (e.g., ramping-up, ramping-down, not ramping) and the SOC of the battery (step 812). If the PV power output is not ramping, there is not a need to charge or discharge the battery for ramp rate control. If the SOC of the battery is within a desirable range (e.g., a range around 50% charge), there is not a need to charge or discharge the battery. If both of these conditions are met, the ramp rate power setpoint $\hat{u}_{RR_T}(k)$ may be set to zero:

$$\hat{u}_{RR_T}(k) = 0$$

However, if the SOC of the battery is greater than the upper limit of the desirable range while not ramping, discharging the battery may be desirable and the ramp rate power setpoint $\hat{u}_{RR_T}(k)$ may be set to a positive value. The value of the ramp rate setpoint $\hat{u}_{RR_T}(k)$ may be a fraction of the upper bound $ub_{RR_T}$, which may be dependent on how far the SOC is from the upper limit of the desirable range, as shown in the following equation:

$$\hat{u}_{RR_T}(k)(ub_{RR_T})(SOC - SOC_{sp} - SOC_{tol})(SOC_{gain})$$

Conversely, if the SOC of the battery is less than the lower limit of the desirable range while not ramping, charging the battery may be desirable and the ramp rate power setpoint $\hat{u}_{RR_T}(k)$ may be set to a negative value. The value of the ramp rate setpoint $\hat{u}_{RR_T}(k)$ may be a fraction of the lower bound $lb_{RR_T}$, which may be dependent on how far the SOC is from the lower limit of the desirable range, as shown in the following equation:

$$\hat{u}_{RR_T}(k) = (-lb_{RR_T})(SOC - SOC_{sp} + SOC_{tol})(SOC_{gain})$$

If the PV power output is ramping-up, the upper bound $ub_{RR_T}$ and the lower bound $lb_{RR_T}$ are both negative, which may indicate a need to charge the battery. During an up-ramp, in addition to the option of charging the battery, PV field power inverter 304 may be used to limit the output power of PV field 302 (e.g., by limiting $P_{PV}$) and guarantee compliance with the ramp rate limit. If the SOC of the battery is within or above the desirable range during an up-ramp, the battery does not need to be charged. Therefore, the ramp rate power $\hat{u}_{RR_T}(k)$ can be set to zero, as shown in the following equation:

$$\hat{u}_{RR_T}(k) = 0$$

and the PV power setpoint $u_{PV}$ can be used to control the ramp rate. In some embodiments, the ramp rate power $\hat{u}_{RR_T}(k)$ is set to zero only if the ramp rate compliance limit will not be violated. This criterion may be useful to prevent non-compliance under the circumstance when the battery is charging during an up-ramp and ramp rate control is switched to PV field power inverter 304 when the desired SOC of the battery is reached.

Conversely, if the SOC of the battery is below the desirable range during an up-ramp, the battery may be charged at a rate that is at least equal to the upper bound $ub_{RR_T}$ plus a fraction of the difference between the upper and lower bounds, which may be dependent on how far the SOC is from the lower limit of the desirable range, as shown in the following equation:

$$\hat{u}_{RR_T}(k)(ub_{RR_T} - lb_{RR_T})(SOC - SOC_{sp} - SOC_{tol})(SOC + ub_{RR_T})$$

If the PV power output is ramping-down, the upper bound $ub_{RR_T}$ and the lower bound $lb_{RR_T}$ are both positive, which may indicate a need to discharge the battery. During a down-ramp, if the SOC of the battery is below or within the desirable range, the minimum amount of power required to comply with the ramp rate limit may be discharged by the battery, as shown in the following equation:

$$\hat{u}_{RR_T}(k) = lb_{RR_T}$$

However, if the SOC is above the upper limit of the desirable range during a down-ramp, the ramp rate control power $\hat{u}_{RR_T}(k)$ may be set to either the upper bound $ub_{RR_T}$ or the lower bound plus a fraction of the difference between the upper bound and the lower bound, as shown in the following equation:

$$\hat{u}_{RR_T}(k) = \min\left(\frac{(ub_{RR_T} - lb_{RR_T})(SOC - SOC_{sp} - SOC_{tol})(SOC_{gain}) + lb_{RR_T}}{ub_{RR_T}}\right)$$

In some embodiments, process 800 includes adjusting ramp rate power setpoint $\hat{u}_{RR_T}(k)$ determined in step 812 to ensure that the battery power limit is respected. For example, if the ramp rate power setpoint $\hat{u}_{RR_T}(k)$ would exceed the battery power limit battPowerLimit, the ramp rate power setpoint may be reduced to be equal to the battery power limit. Similarly, if the ramp rate power setpoint $\hat{u}_{RR_T}(k)$ is less than the negative battery power limit –battPowerLimit, the ramp rate power setpoint may be increased to be equal to the negative battery power limit.

Referring now to FIGS. 9A-9D, another process 900 for generating a ramp rate power setpoint is shown, according to an exemplary embodiment. Process 900 may be performed by one or more components of controller 314 (e.g., PV power predictor, 512 ramp rate controller 514, etc.) to generate the ramp rate power setpoint $\hat{u}_{RR_T}(k)$. Process 900 is a more detailed version of process 800 described with reference to FIG. 8.

Figure 9A:
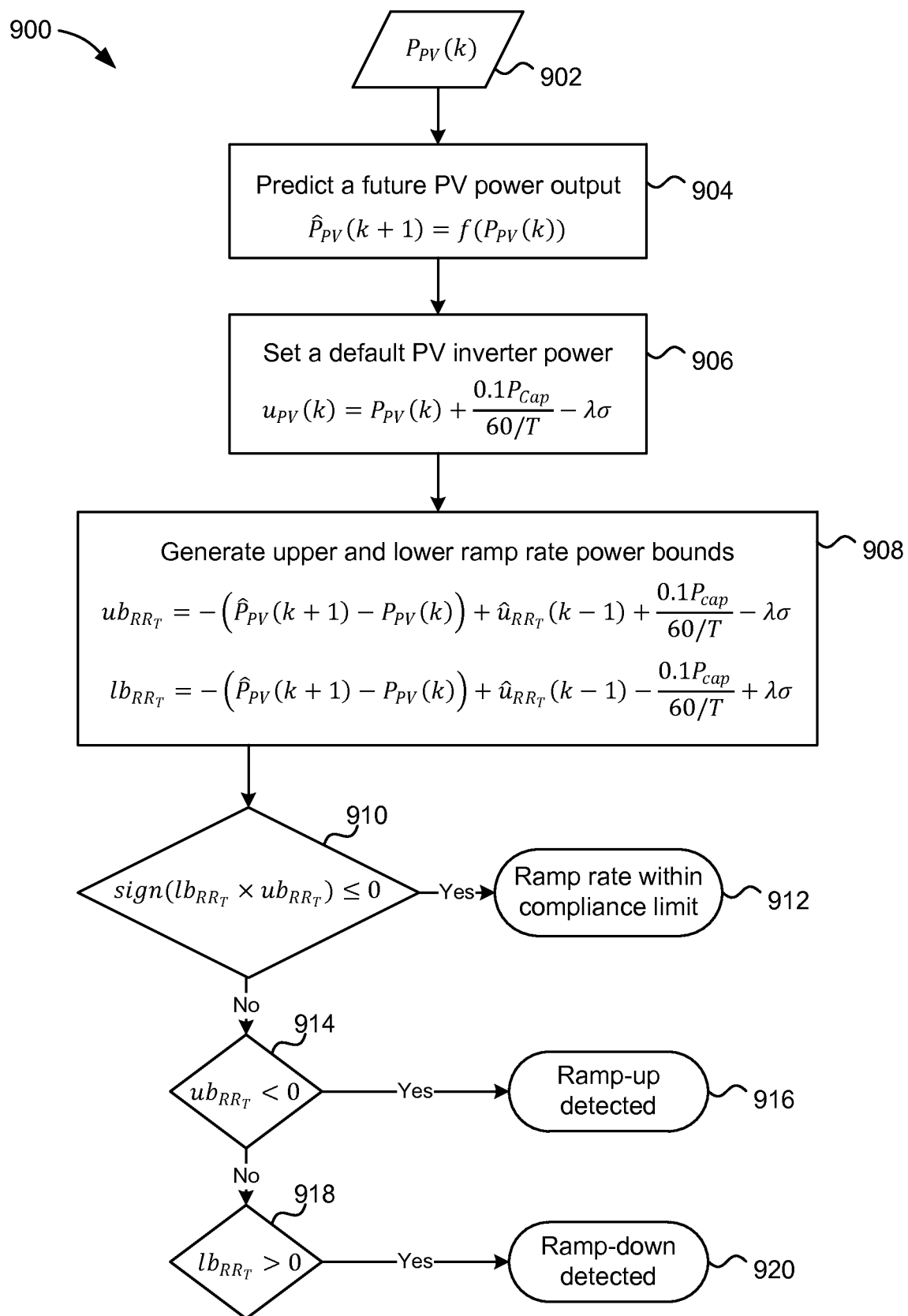
FIGS. 9A-9D are flowcharts of another process for generating ramp rate power setpoints which may be performed by the controller of FIG. 3A, according to an exemplary embodiment.

Referring particularly to FIG. 9A, process 900 is shown to include receiving a photovoltaic (PV) power measurement $P_{PV}(k)$ (step 902) and using the PV power measurement $P_{PV}(k)$ to predict a future PV power output $\hat{P}_{PV}(k+1)$ (step 904). Steps 902-904 may be performed by PV power predictor 512, as described with reference to FIG. 5. The future PV power output $\hat{P}_{PV}(k+1)$ may be a function of the PV power measurement $P_{PV}(k)$ as shown in the following equation:

$$\hat{P}_{PV}(k+1) = f(P_{PV}(k))$$

Step 904 may include performing a time series analysis of the PV power signal at each instant k to predict the value of the PV power output $\hat{P}_{PV}(k+1)$ at the next instant k+1. In some embodiments, step 904 includes using a Kalman filter to perform an iterative process to predict $\hat{P}_{PV}(k+1)$ based on the current and previous values of $P_{PV}$ (e.g., $P_{PV}(k)$, $P_{PV}(k-1)$, etc.).

Process 900 is shown to include setting a default PV inverter power setpoint $u_{PV}(k)$ (step 906). In some embodiments, the default PV inverter power setpoint $u_{PV}(k)$ is a function of the PV power measurement $P_{PV}$. For example, the default PV inverter power $u_{PV}(k)$ setpoint may be the current PV power measurement incremented by the compliance limit, as shown in the following equation:

$$u_{PV}(k) = P_{PV}(k) + \frac{0.1 P_{cap}}{60/T} - \lambda\sigma$$

where $P_{cap}$ is the rated power capacity of the PV field, T is the time interval over which the ramp rate is calculated (e.g., two seconds, microseconds, etc.), σ is the uncertainty of the predicted PV power output $\hat{P}_{PV}(k+1)$, and λ is a scaling factor of the uncertainty in the PV power prediction. This guarantees compliance and gradual ramping of the PV power output to the grid and may be useful to prevent the ramp rate compliance limit from being exceeded when the system is first turned on or when an up-ramp is handled using PV field power inverter 304 instead of charging battery 306.

Still referring to FIG. 9A, process 900 is shown to include generating upper and lower ramp rate power bounds $ub_{RR_T}$ and $lb_{RR_T}$ (step 908). The upper and lower bounds place upper and lower limits on the ramp rate control power $\hat{u}_{RR_T}(k)$. In some embodiments, the upper and lower bounds $ub_{RR_T}$ and $lb_{RR_T}$ are calculated using the following equations:

$$lb_{RR_T} = -(\hat{P}_{PV}(k+1) - P_{PV}(k)) + \hat{u}_{RR_T}(k-1) - \frac{0.1 P_{cap}}{60/T} + \lambda\sigma$$

$$ub_{RR_T} = -(\hat{P}_{PV}(k+1) - P_{PV}(k)) + \hat{u}_{RR_T}(k-1) + \frac{0.1 P_{cap}}{60/T} - \lambda\sigma$$

Advantageously, the values of the upper bound $ub_{RR_T}$ and the lower bound $lb_{RR_T}$ can be used to determine whether the PV power output is ramping-up, ramping-down, or not ramping.

Process 900 is shown to include determining whether the upper bound $ub_{RR_T}$ and the lower bound $lb_{RR_T}$ have opposite signs (step 910). The upper bound $ub_{RR_T}$ and the lower bound $lb_{RR_T}$ may have opposite signs when the upper bound $ub_{RR_T}$ is positive and the lower bound $lb_{RR_T}$ is negative. The sign ( ) function in step 910 returns the value 1 when the product of the upper bound $ub_{RR_T}$ and the lower bound $lb_{RR_T}$ is positive (i.e., the upper bound $ub_{RR_T}$ and the lower bound $lb_{RR_T}$ have the same sign) and returns –1 when the product of the upper bound $ub_{RR_T}$ and the lower bound $lb_{RR_T}$ is negative (i.e., the upper bound $ub_{RR_T}$ and the lower bound $lb_{RR_T}$ have opposite signs).

If the upper bound $ub_{RR_T}$ is positive and the lower bound $lb_{RR_T}$ is negative, the ramp rate control power $u_{RR_T}(k)$ can have a value of zero. This indicates ramp rate control is not required since the PV power output is neither ramping-up nor ramping-down. In response to a determination that the upper bound $ub_{RR_T}$ and the lower bound $lb_{RR_T}$ have opposite signs (i.e., the result of step 910 is "yes"), process 900 proceeds to determining that the ramp rate is within the compliance limit (step 912). In response to a determination that the upper bound $ub_{RR_T}$ and the lower bound $lb_{RR_T}$ do not have opposite signs (i.e., the result of step 910 is "no"), process 900 proceeds to step 914.

Process 900 is shown to include determining whether the upper bound $ub_{RR_T}$ is negative (step 914). The upper bound $ub_{RR_T}$ is negative when both the upper bound $ub_{RR_T}$ and the lower bound $lb_{RR_T}$ are negative, which requires the ramp rate control power $u_{RR_T}(k)$ to also be negative. This indicates that power will be stored in the battery (or limited by PV field power inverter 304) in order to compensate for a ramping-up of the PV power output. In response to a determination that the upper bound $ub_{RR_T}$ is negative (i.e., the result of step 914 is "yes"), process 900 proceeds to determining that a ramp-up is detected (step 916). In response to a determination that the upper bound $ub_{RR_T}$ is not negative (i.e., the result of step 914 is "no"), process 900 proceeds to step 918.

Process 900 is shown to include determining whether the lower bound $lb_{RR_T}$ is positive (step 918). The lower bound $lb_{RR_T}$ is positive when both the upper bound $ub_{RR_T}$ and the lower bound $lb_{RR_T}$ are positive, which requires the ramp rate control power $\hat{u}_{RR_T}(k)$ to also be positive. This indicates that power will be drawn from the battery in order to compensate for a ramping-down of the PV power output. In response to a determination that the lower bound $lb_{RR_T}$ is positive (i.e., the result of step 918 is "yes"), process 900 proceeds to determining that a ramp-down is detected (step 920).

Figure 9B:
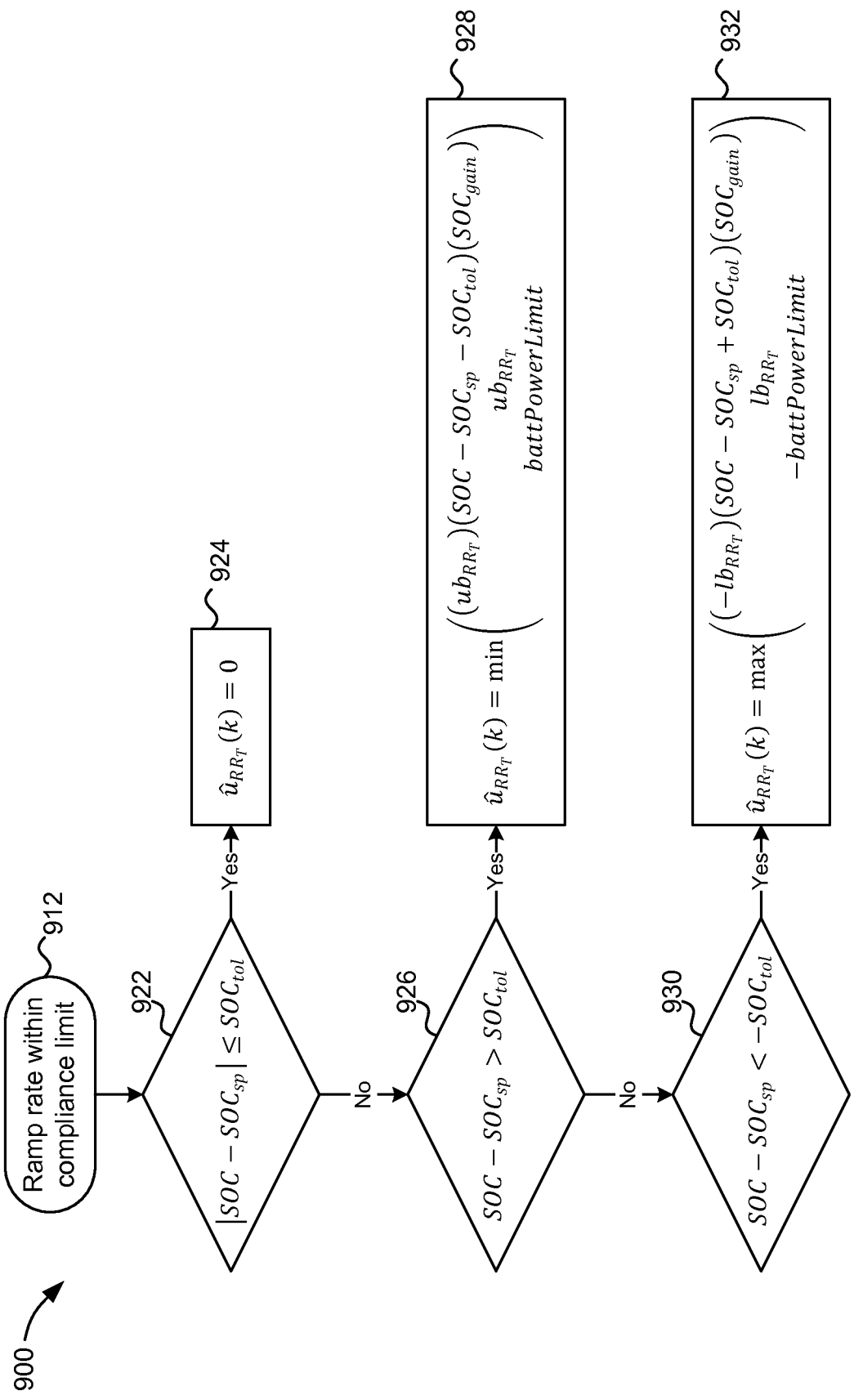

Referring now to FIG. 9B, several steps 922-932 of process 900 are shown, according to an exemplary embodiment. Steps 922-932 may be performed in response to a determination that the ramp rate is within the compliance limit (step 912), indicating that ramp rate control is not required. Steps 922-932 can be used to determine a ramp rate control power that charges or discharges the battery in order to maintain the state-of-charge (SOC) of the battery within a desirable range (e.g., a SOC setpoint±a tolerance).

Process 900 is shown to include determining whether the difference between the state-of-charge of the battery SOC and a setpoint state-of-charge $SOC_{sp}$ is within a range defined by a state-of-charge tolerance $SOC_{tol}$ (i.e., $|SOC - SOC_{sp}| \leq SOC_{tol}$) (step 922). If the absolute value of the difference between SOC and $SOC_{sp}$ is less than or equal to $SOC_{tol}$ (i.e., the result of step 922 is "yes"), process 900 proceeds to setting the ramp rate power setpoint to zero (step 924). Step 924 may be performed when ramp rate control is not required and when the SOC of the battery is already within the desirable range. In response to a determination that SOC differs from $SOC_{sp}$ by more than $SOC_{tol}$ (i.e., the result of step 922 is "no"), process 900 proceeds to step 926.

Process 900 is shown to include determining whether the state-of-charge of the battery SOC exceeds the setpoint state-of-charge $SOC_{sp}$ by more than the state-of-charge tolerance $SOC_{tol}$ (step 926). If $SOC - SOC_{sp} > SOC_{tol}$ (i.e., the result of step 926 is "yes"), it may be desirable to discharge the battery to move SOC closer to $SOC_{sp}$ and process 900 may proceed to step 928. In step 928, the ramp rate power setpoint $\hat{u}_{RR_T}(k)$ is set to the minimum of the battery power limit battPowerLimit, the upper bound $ub_{RR_T}$, and a fraction of the upper bound $ub_{RR_T}$, as shown in the following equation:

$$\hat{u}_{RR_T}(k) = \min \begin{pmatrix} (ub_{RR_T})(SOC - SOC_{sp} - SOC_{tol})(SOC_{gain}) \\ ub_{RR_T} \\ battPowerLimit \end{pmatrix}$$

where the fraction of the upper bound $ub_{RR_T}$ is based on the difference between SOC and the upper limit on the setpoint tolerance range (i.e., $SOC - SOC_{sp} - SOC_{tol}$) multiplied by a gain value $SOC_{gain}$.

Process 900 is shown to include determining whether the setpoint state-of-charge $SOC_{sp}$ exceeds the state-of-charge of the battery SOC by more than the state-of-charge tolerance $SOC_{tol}$ (step 930). If $SOC - SOC_{sp} < -SOC_{tol}$ (i.e., the result of step 930 is "yes"), it may be desirable to charge the battery to move SOC closer to $SOC_{sp}$ and process 900 may proceed to step 932. In step 932, the ramp rate power setpoint $\hat{u}_{RR_T}(k)$ is set to the maximum of the negative battery power limit $-$battPowerLimit, the lower bound $lb_{RR_T}$, and a fraction of the lower bound $lb_{RR_T}$, as shown in the following equation:

$$\hat{u}_{RR_T}(k) = \max \begin{pmatrix} (-lb_{RR_T})(SOC - SOC_{sp} + SOC_{tol})(SOC_{gain}) \\ lb_{RR_T} \\ -battPowerLimit \end{pmatrix}$$

where the fraction of the lower bound $lb_{RR_T}$ is based on the difference between SOC and the lower limit on the setpoint tolerance range (i.e., $SOC - SOC_{sp} + SOC_{tol}$) multiplied by a gain value $SOC_{gain}$.

Figure 9C:
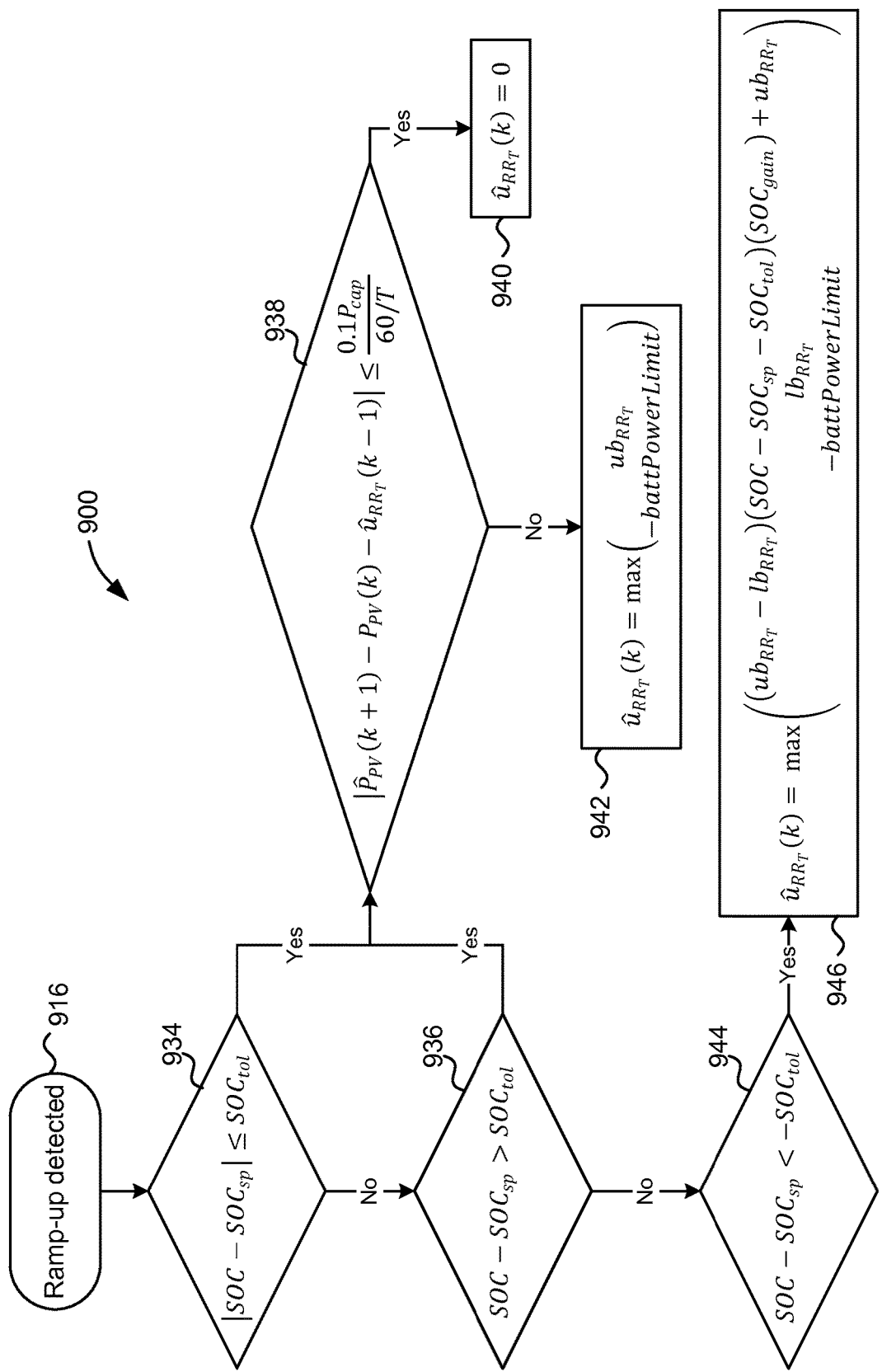

Referring now to FIG. 9C, several steps 934-946 of process 900 are shown, according to an exemplary embodiment. Steps 934-946 may be performed in response to detecting a ramp-up condition in step 916. This indicates that both the upper bound $ub_{RR_T}$ and lower bound $lb_{RR_T}$ are negative and that ramp rate control is required to prevent the PV power output from increasing at a rate that exceeds the ramp rate compliance limit. Steps 934-946 can be used to determine a ramp rate control power $\hat{u}_{RR_T}(k)$ that prevents the ramp rate from exceeding the compliance limit while maintaining the stage of charge of the battery within a desirable range (e.g., a SOC setpoint±a tolerance).

Process 900 is shown to include determining whether the SOC of the battery is within the desirable range (i.e., $|SOC - SOC_{sp}| \leq SOC_{tol}$) (step 934) or above the desirable range (i.e., $SOC - SOC_{sp} > SOC_{tol}$) (step 936). During a ramp-up condition, ramp rate control can be performed by charging the battery and/or limiting the PV power at PV field power inverter 304. A positive determination in either of steps 934-936 indicates that the battery does not require charging and that ramp rate control can be performed by adjusting the power setpoint for PV field power inverter 304.

In response to a determination that the current SOC of the battery is within or above the desirable range (i.e., the result of step 934 or 936 is "yes"), process 900 proceeds to step 938. Step 938 may include determining whether the ramp rate would be within the compliance limit if the ramp rate control power $\hat{u}_{RR_T}(k)$ is set to zero. This determination can be made using the following equation:

$$|\hat{P}_{PV}(k+1) - P_{PV}(k) - \hat{u}_{RR_T}(k-1)| \leq \frac{0.1 P_{cap}}{60/T}$$

where the left side of the equation represents the ramp rate with $\hat{u}_{RR_T}(k) = 0$ and the right side of the equation represents the ramp rate compliance limit.

If the ramp rate control power $\hat{u}_{RR_T}(k)$ can be set to zero without violating the compliance limit (i.e., the result of step 938 is "yes"), process 900 may set $u_{RR_T}(k) = 0$ (step 940). However, if the ramp rate control power $\hat{u}_{RR_T}(k)$ cannot be set to zero without violating the compliance limit (i.e., the result of step 938 is "no"), process 900 may set $\hat{u}_{RR_T}(k)$ to the maximum of the upper bound $ub_{RR_T}$ and the negative battery power limit $-$battPowerLimit (step 942), as shown in the following equation:

$$\hat{u}_{RR_T}(k) = \max \begin{pmatrix} ub_{RR_T} \\ -battPowerLimit \end{pmatrix}$$

Still referring to FIG. 9C, process 900 is shown to include determining whether the state-of-charge of the battery is below the desirable range (i.e., $SOC - SOC_{sp} < -SOC_{tol}$) (step 944). The lower bound of the desirable range may be defined by $SOC_{sp}-SOC_{tol}$. If the current SOC of the battery is less than the lower bound of the desirable range, it may be desirable to charge the battery. In response to a determination that the current SOC of the battery is less than the lower bound of the desirable range (i.e., the result of step 944 is "yes"), process 900 proceeds to step 946.

Step 946 may include setting the ramp rate control power $\hat{u}_{RR_T}(k)$ to the maximum of the negative battery power limit −battPowerLimit, the lower bound $lb_{RR_T}$, and the upper bound $ub_{RR_T}$ plus a fraction of the difference between the upper bound and the lower bound, as shown in the following equation:

$$\hat{u}_{RR_T}(k) = \max\begin{Bmatrix} (ub_{RR_T} - lb_{RR_T})(SOC - SOC_{sp} + SOC_{tol})(SOC_{gain}) + ub_{RR_T} \\ lb_{RR_T} \\ -battPowerLimit \end{Bmatrix}$$

where the fraction is based on the difference between SOC and the lower limit of the setpoint tolerance range (i.e., $SOC-SOC_{sp}-SOC_{tol}$) multiplied by a gain value $SOC_{gain}$.

Figure 9D:
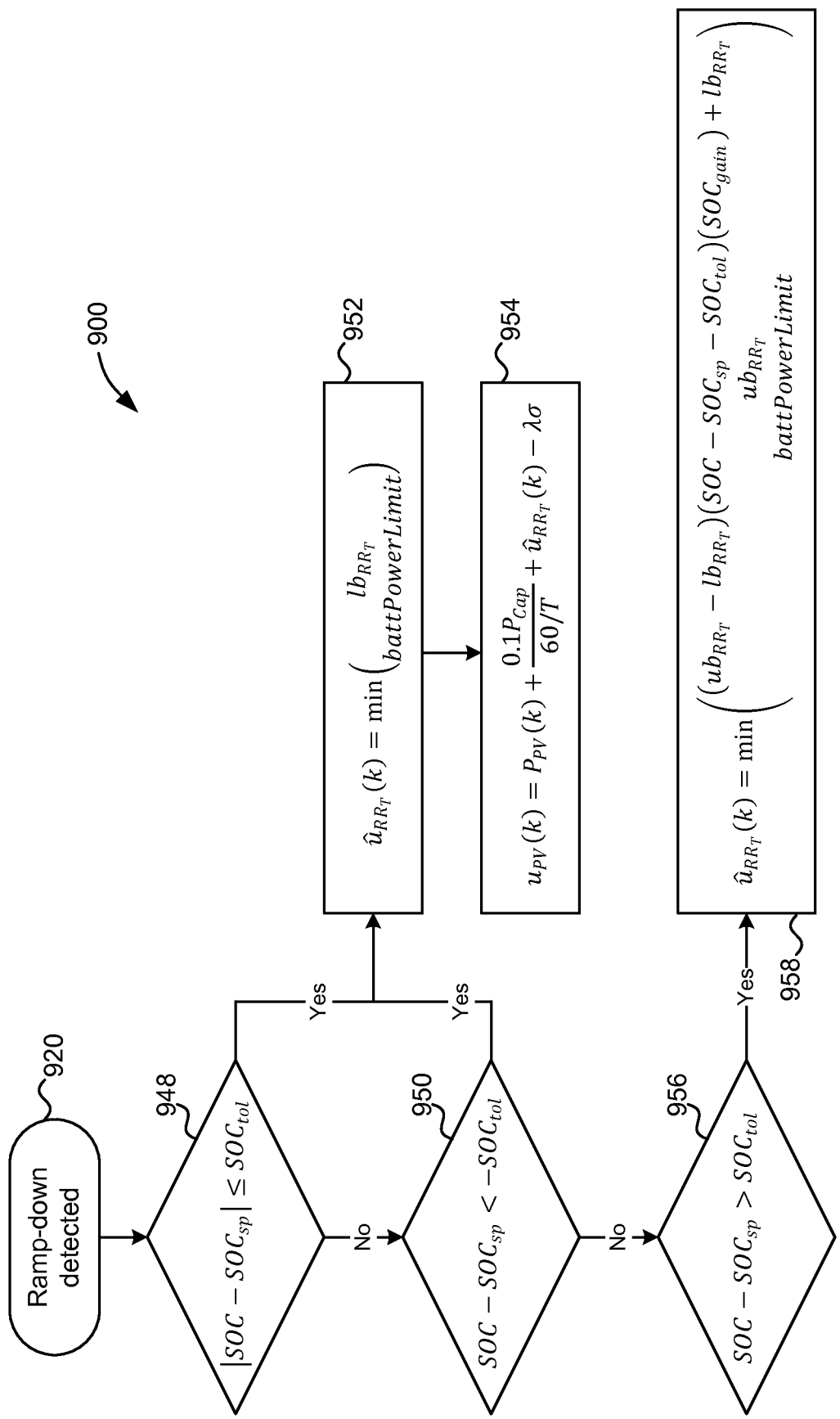

Referring now to FIG. 9D, several steps 948-958 of process 900 are shown, according to an exemplary embodiment. Steps 948-958 may be performed in response to detecting a ramp-down condition in step 920. This indicates that both the upper bound $ub_{RR_T}$ and lower bound $lb_{RR_T}$ are positive and that ramp rate control is required to prevent the PV power output from decreasing at a rate that exceeds the ramp rate compliance limit. Steps 948-958 can be used to determine a ramp rate control power $\hat{u}_{RR_T}(k)$ that prevents the ramp rate from exceeding the compliance limit while maintaining the stage of charge of the battery within a desirable range (e.g., a SOC setpoint±a tolerance).

Process 900 is shown to include determining whether the SOC of the battery is within the desirable range (i.e., $|SOC-SOC_{sp}|<SOC_{tol}$) (step 948) or below the desirable range (i.e., $SOC-SOC_{sp}<-SOC_{tol}$) (step 950). During a ramp-down condition, ramp rate control can be performed by discharging the battery. A positive determination in either of steps 948-950 indicates that the battery does not require discharging to achieve the desired state-of-charge. Accordingly, ramp rate control may be performed by discharging as little energy as possible from the battery in order to comply with the ramp rate limit.

In response to a determination that the current SOC of the battery is within or below the desirable range (i.e., the result of step 948 or 950 is "yes"), process 900 proceeds to step 952. Step 952 may include setting $\hat{u}_{RR_T}(k)$ to the minimum of the lower bound $lb_{RR_T}$ and the battery power limit battPowerLimit, as shown in the following equation:

$$\hat{u}_{RR_T}(k) = \min\begin{pmatrix} lb_{RR_T} \\ battPowerLimit \end{pmatrix}$$

In some embodiments, process 900 includes updating the default PV power setpoint $u_{PV}(k)$ based on the ramp rate control power $\hat{u}_{RR_T}(k)$ (step 954). Step 954 may include setting the PV power setpoint to the default value set in step 906 plus the ramp rate control power $\hat{u}_{RR_T}(k)$ determined in step 952, as shown in the following equation:

$$u_{PV}(k) = P_{PV}(k) + \frac{0.1P_{Cap}}{60/T} + \hat{u}_{RR_T}(k) - \lambda\sigma$$

Advantageously, this allows power to pass at a future instant when an up-ramp or an increase in available PV power is about to start.

Still referring to FIG. 9D, process 900 is shown to include determining whether the state-of-charge of the battery is above the desirable range (i.e., $SOC-SOC_{sp}>SOC_{tol}$) (step 956). The upper bound of the desirable range may be defined by $SOC_{sp}+SOC_{tol}$. If the current SOC of the battery is greater than the upper bound of the desirable range, it may be desirable to discharge the battery. In response to a determination that the current SOC of the battery is greater than the upper bound of the desirable range (i.e., the result of step 956 is "yes"), process 900 proceeds to step 958.

Step 958 may include setting the ramp rate control power $\hat{u}_{RR_T}(k)$ to the minimum of the battery power limit battPowerLimit, the upper bound $ub_{RR_T}$, and the lower bound $ub_{RR_T}$ plus a fraction of the difference between the upper bound and the lower bound, as shown in the following equation:

$$\hat{u}_{RR_T}(k) = \min\begin{Bmatrix} (ub_{RR_T} - lb_{RR_T})(SOC - SOC_{sp} - SOC_{tol})(SOC_{gain}) + lb_{RR_T} \\ ub_{RR_T} \\ battPowerLimit \end{Bmatrix}$$

where the fraction is based on the difference between SOC and the upper limit of the setpoint tolerance range (i.e., $SOC-SOC_{sp}-SOC_{tol}$) multiplied by a gain value $SOC_{gain}$.

Generating Battery Power and PV Power Setpoints

Figure 10:
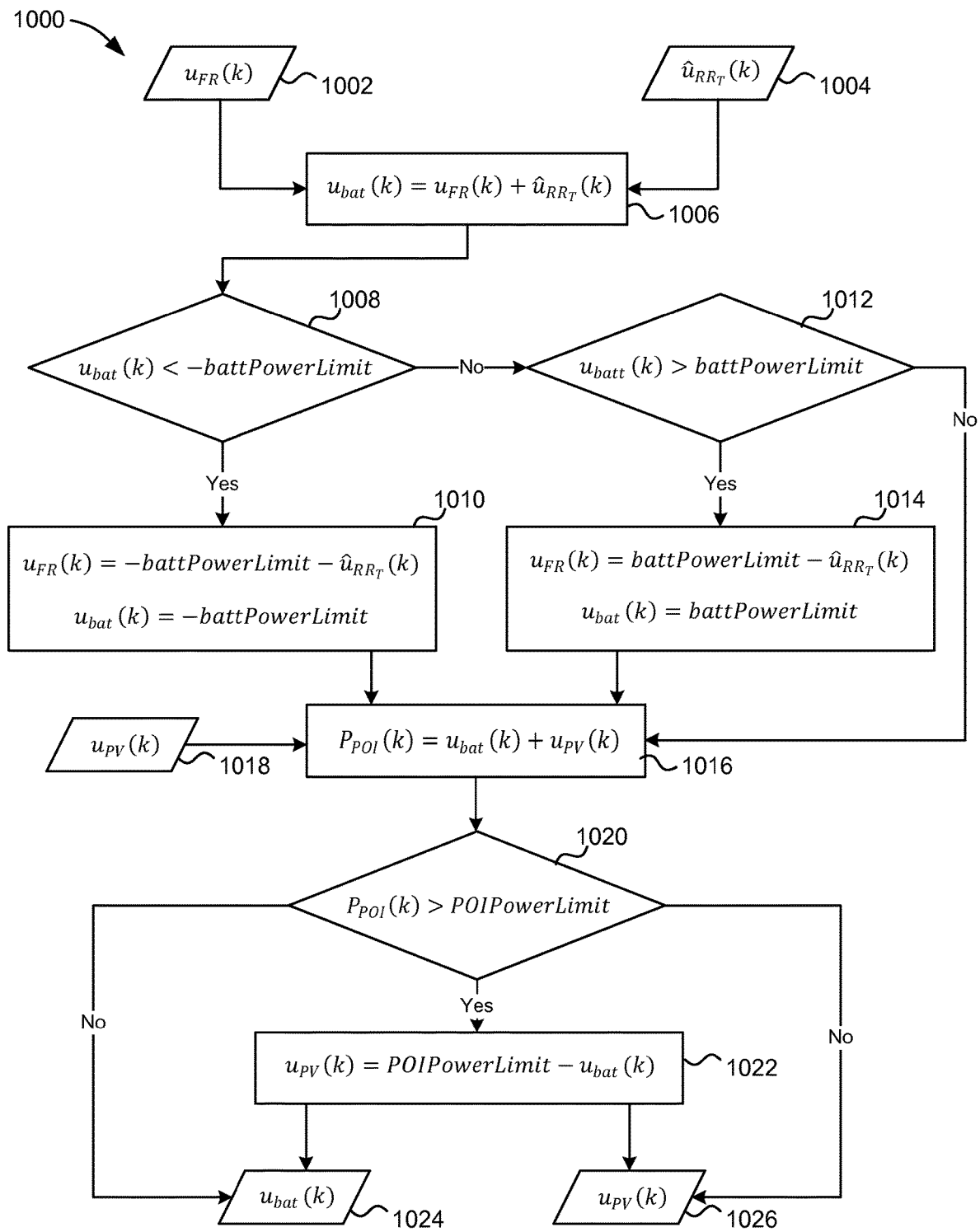
FIG. 10 is a flowchart of a process for generating battery power setpoints and PV power setpoints which may be performed by the controller of FIG. 3A, according to an exemplary embodiment.

Referring now to FIG. 10, a flowchart of a process 1000 for generating battery power setpoints and PV power setpoints is shown, according to an exemplary embodiment. Process 1000 may be performed by one or more components of controller 314 (e.g., battery power setpoint generator 518, PV power setpoint generator 520, etc.) to generate the battery power setpoint $u_{bat}(k)$ and the PV power setpoint $u_{PV}(k)$.

Process 1000 is shown to include receiving a frequency regulation setpoint $u_{FR}(k)$ (step 1002) and receiving a ramp rate control setpoint $\hat{u}_{RR_T}(k)$ (step 1004). The frequency regulation setpoint $u_{FR}(k)$ may be generated by frequency regulation controller 516, as described with reference to FIG. 5, and provided as an input to process 1000. The ramp rate control setpoint $\hat{u}_{RR_T}(k)$ may be generated by ramp rate controller 514 using processes 800-900, as described with reference to FIGS. 8-9.

Process 1000 is shown to include calculating a battery power setpoint $u_{bat}(k)$ (step 1006). The battery power setpoint $u_{bat}(k)$ may be generated by adding the frequency regulation setpoint and the ramp rate control setpoint, as shown in the following equation:

$$u_{bat}(k)=u_{FR}(k)+\hat{u}_{RR_T}(k)$$

Process 1000 is shown to include determining whether the battery power setpoint $u_{bat}(k)$ exceeds a battery power limit battPowerLimit (i.e., $u_{bat}(k)$>battPowerLimit) (step 1012). In some embodiments, the battery power limit is the maximum rate at which the battery can discharge stored energy. The battery power setpoint $u_{bat}(k)$ may exceed the battery power limit battPowerLimit when the battery cannot discharge fast enough to meet the battery power setpoint.

In response to a determination that the battery power setpoint $u_{bat}(k)$ is greater than the battery power limit battPowerLimit, (i.e., the result of step 1012 is "yes"), process 1000 may proceed to step 1014. Step 1014 may include replacing the battery power setpoint $u_{batt}$ with the battery power limit, as shown in the following equation:

$$u_{bat}(k)=\text{battPowerLimit}$$

In some embodiments, step 1014 includes updating the frequency regulation setpoint to be the difference between the battery power limit and the ramp rate control setpoint, as shown in the following equation:

$$u_{FR}(k)=\text{battPowerLimit}-\hat{u}_{RR_T}(k)$$

Process 1000 is shown to include determining whether the battery power setpoint $u_{bat}(k)$ is less than the negative battery power limit battPowerLimit (i.e., $u_{bat}(k)<-\text{battPowerLimit}$) (step 1008). In some embodiments, the negative battery power limit is the maximum rate at which the battery can charge. The battery power setpoint $u_{bat}(k)$ may be less than the negative battery power limit −battPowerLimit when the battery cannot charge fast enough to meet the battery power setpoint.

In response to a determination that the battery power setpoint $u_{bat}(k)$ is less than the negative battery power limit −battPowerLimit, (i.e., the result of step 1008 is "yes"), process 1000 may proceed to step 1010. Step 1010 may include replacing the battery power setpoint $u_{batt}$ with the negative battery power limit, as shown in the following equation:

$$u_{bat}(k)=-\text{battPowerLimit}$$

In some embodiments, step 1010 includes updating the frequency regulation setpoint to be the difference between the negative battery power limit and the ramp rate control setpoint, as shown in the following equation:

$$u_{FR}(k)=\text{battPowerLimit}-\hat{u}_{RR_T}(k)$$

In some instances, the battery power setpoint $u_{bat}(k)$ is between the negative battery power limit and the battery power limit, as shown in the following inequality:

$$-\text{battPowerLimit} \leq u_{bat}(k) \leq \text{battPowerLimit}$$

If the battery power setpoint $u_{bat}(k)$ is between the negative battery power limit and the battery power limit, process 1000 may proceed from step 1012 directly to step 1016 without performing steps 1010 or 1014.

Still referring to FIG. 10, process 1000 is shown to include receiving the PV power setpoint $u_{PV}(k)$ (step 1018) and calculating the power $P_{POI}(k)$ at the point of intersection (POI) (step 1016). The POI power $P_{POI}(k)$ may be calculated by adding the battery power $u_{bat}(k)$ and the PV power setpoint $u_{PV}(k)$, as shown in the following equation:

$$P_{POI}(k)=u_{bat}(k)+u_{PV}(k)$$

Process 1000 is shown to include determining whether the POI power $P_{POI}(k)$ exceeds a POI power limit (i.e., $P_{POI}(k)>\text{POIPowerLimit}$) (step 1020). The POI power limit may be the maximum allowable power at POI 310. In response to a determination that the POI power exceeds the POI power limit (i.e., the result of step 1020 is "yes"), process 1000 may proceed to step 1022. Step 1022 may include adjusting the PV power setpoint $u_{PV}(k)$ to be the difference between the POI power limit and the battery power setpoint, as shown in the following equation:

$$u_{PV}(k)=\text{POIPowerLimit}-u_{bat}(k)$$

This ensures that the POI power (i.e., $u_{bat}(k)+u_{PV}(k)$) does not exceed the POI power limit.

Process 1000 is shown to include providing the battery power setpoint $u_{bat}(k)$ and the PV power setpoint $u_{PV}(k)$ as control outputs (steps 1024 and 1026). For example, the battery power setpoint $u_{bat}(k)$ may be provided to battery power inverter 308 for use in controlling the power charged or discharged from battery 306. The PV power setpoint $u_{PV}(k)$ may be provided to PV field power inverter 304 for use in controlling the power output of PV field 302.

Electrical Energy Storage System With Frequency Response Optimization

Figure 13:
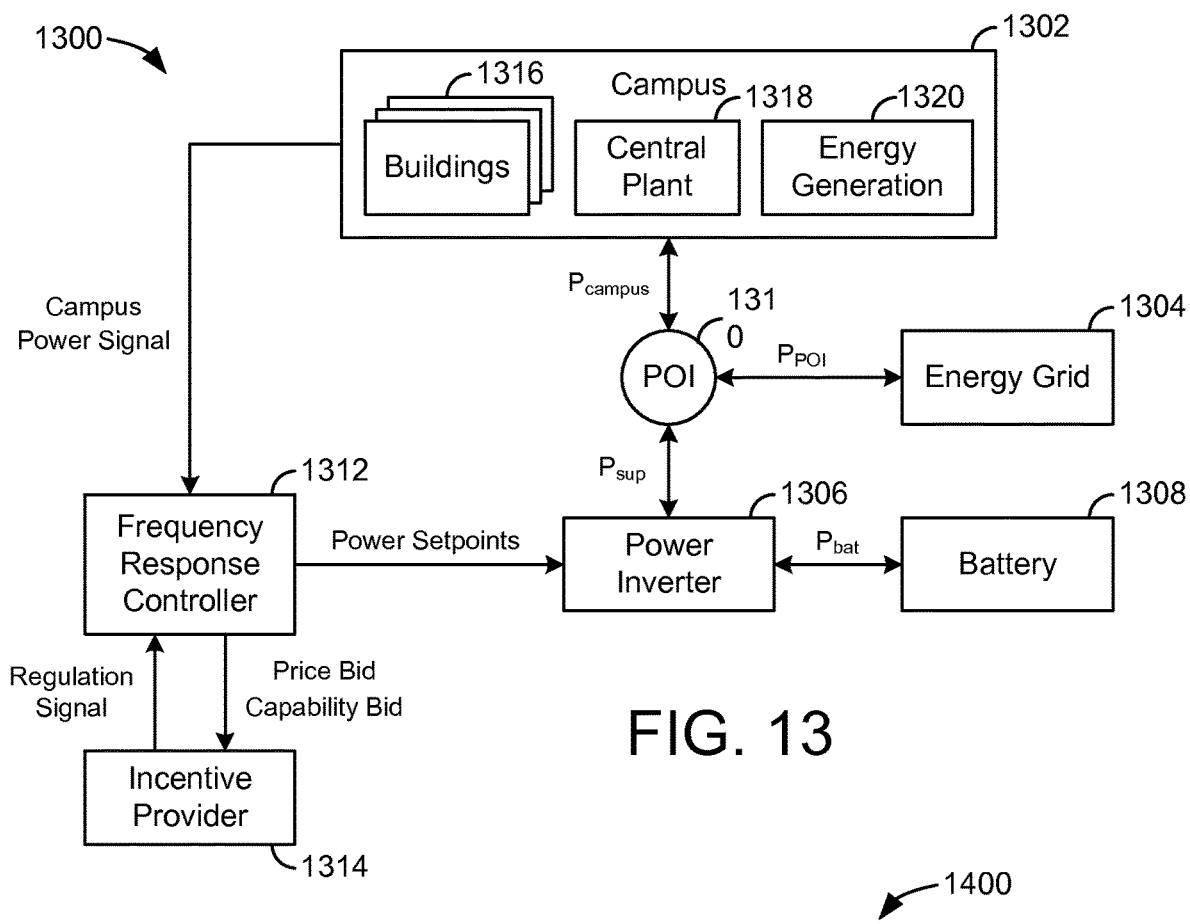
FIG. 13 is a block diagram of a frequency response optimization system, according to an exemplary embodiment.

Referring now to FIG. 13, a frequency response optimization system 1300 is shown, according to an exemplary embodiment. System 1300 is shown to include a campus 1302 and an energy grid 1304. Campus 1302 may include one or more buildings 1316 that receive power from energy grid 1304. Buildings 1316 may include equipment or devices that consume electricity during operation. For example, buildings 1316 may include HVAC equipment, lighting equipment, security equipment, communications equipment, vending machines, computers, electronics, elevators, or other types of building equipment. In some embodiments, buildings 1316 are served by a building management system (BMS). A BMS is, in general, a system of devices configured to control, monitor, and manage equipment in or around a building or building area. A BMS can include, for example, a HVAC system, a security system, a lighting system, a fire alerting system, and/or any other system that is capable of managing building functions or devices. An exemplary building management system which may be used to monitor and control buildings 1316 is described in U.S. patent application Ser. No. 14/717,593.

In some embodiments, campus 1302 includes a central plant 1318. Central plant 1318 may include one or more subplants that consume resources from utilities (e.g., water, natural gas, electricity, etc.) to satisfy the loads of buildings 1316. For example, central plant 1318 may include a heater subplant, a heat recovery chiller subplant, a chiller subplant, a cooling tower subplant, a hot thermal energy storage (TES) subplant, and a cold thermal energy storage (TES) subplant, a steam subplant, and/or any other type of subplant configured to serve buildings 1316. The subplants may be configured to convert input resources (e.g., electricity, water, natural gas, etc.) into output resources (e.g., cold water, hot water, chilled air, heated air, etc.) that are provided to buildings 1316. An exemplary central plant which may be used to satisfy the loads of buildings 1316 is described U.S. patent application Ser. No. 14/634,609, titled "High Level Central Plant Optimization" and filed Feb. 27, 2015, the entire disclosure of which is incorporated by reference herein.

In some embodiments, campus 1302 includes energy generation 1320. Energy generation 1320 may be configured to generate energy that can be used by buildings 1316, used by central plant 1318, and/or provided to energy grid 1304. In some embodiments, energy generation 1320 generates electricity. For example, energy generation 1320 may include an electric power plant, a photovoltaic energy field, or other types of systems or devices that generate electricity. The electricity generated by energy generation 1320 can be used internally by campus 1302 (e.g., by buildings 1316 and/or campus 1318) to decrease the amount of electric power that campus 1302 receives from outside sources such as energy grid 1304 or battery 1308. If the amount of electricity generated by energy generation 1320 exceeds the electric power demand of campus 1302, the excess electric power can be provided to energy grid 1304 or stored in battery 1308. The power output of campus 1302 is shown in FIG. 13 as $P_{campus}$. $P_{campus}$ may be positive if campus 1302 is outputting electric power or negative if campus 1302 is receiving electric power.

Still referring to FIG. 13, system 1300 is shown to include a power inverter 1306 and a battery 1308. Power inverter 1306 may be configured to convert electric power between direct current (DC) and alternating current (AC). For example, battery 1308 may be configured to store and output DC power, whereas energy grid 1304 and campus 1302 may be configured to consume and generate AC power. Power inverter 1306 may be used to convert DC power from battery 1308 into a sinusoidal AC output synchronized to the grid frequency of energy grid 1304. Power inverter 1306 may also be used to convert AC power from campus 1302 or energy grid 1304 into DC power that can be stored in battery 1308. The power output of battery 1308 is shown as $P_{bat}$. $P_{bat}$ may be positive if battery 1308 is providing power to power inverter 1306 or negative if battery 1308 is receiving power from power inverter 1306.

In some instances, power inverter 1306 receives a DC power output from battery 1308 and converts the DC power output to an AC power output that can be fed into energy grid 1304. Power inverter 1306 may synchronize the frequency of the AC power output with that of energy grid 1304 (e.g., 50 Hz or 60 Hz) using a local oscillator and may limit the voltage of the AC power output to no higher than the grid voltage. In some embodiments, power inverter 1306 is a resonant inverter that includes or uses LC circuits to remove the harmonics from a simple square wave in order to achieve a sine wave matching the frequency of energy grid 1304. In various embodiments, power inverter 1306 may operate using high-frequency transformers, low-frequency transformers, or without transformers. Low-frequency transformers may convert the DC output from battery 1308 directly to the AC output provided to energy grid 1304. High-frequency transformers may employ a multi-step process that involves converting the DC output to high-frequency AC, then back to DC, and then finally to the AC output provided to energy grid 1304.

System 1300 is shown to include a point of interconnection (POI) 1310. POI 1310 is the point at which campus 1302, energy grid 1304, and power inverter 1306 are electrically connected. The power supplied to POI 1310 from power inverter 1306 is shown as $P_{sup}$. $P_{sup}$ may be defined as $P_{bat}+P_{loss}$, where $P_{batt}$ is the battery power and $P_{loss}$ is the power loss in the battery system (e.g., losses in power inverter 1306 and/or battery 1308). $P_{sup}$ may be positive is power inverter 1306 is providing power to POI 1310 or negative if power inverter 1306 is receiving power from POI 1310. $P_{campus}$ and $P_{sup}$ combine at POI 1310 to form $P_{POI}$. $P_{POI}$ may be defined as the power provided to energy grid 1304 from POI 1310. $P_{POI}$ may be positive if POI 1310 is providing power to energy grid 1304 or negative if POI 1310 is receiving power from energy grid 1304.

Still referring to FIG. 13, system 1300 is shown to include a frequency response controller 1312. Controller 1312 may be configured to generate and provide power setpoints to power inverter 1306. Power inverter 1306 may use the power setpoints to control the amount of power $P_{sup}$ provided to POI 1310 or drawn from POI 1310. For example, power inverter 1306 may be configured to draw power from POI 1310 and store the power in battery 1308 in response to receiving a negative power setpoint from controller 1312. Conversely, power inverter 1306 may be configured to draw power from battery 1308 and provide the power to POI 1310 in response to receiving a positive power setpoint from controller 1312. The magnitude of the power setpoint may define the amount of power $P_{sup}$ provided to or from power inverter 1306. Controller 1312 may be configured to generate and provide power setpoints that optimize the value of operating system 1300 over a time horizon.

In some embodiments, frequency response controller 1312 uses power inverter 1306 and battery 1308 to perform frequency regulation for energy grid 1304. Frequency regulation is the process of maintaining the stability of the grid frequency (e.g., 60 Hz in the United States). The grid frequency may remain stable and balanced as long as the total electric supply and demand of energy grid 1304 are balanced. Any deviation from that balance may result in a deviation of the grid frequency from its desirable value. For example, an increase in demand may cause the grid frequency to decrease, whereas an increase in supply may cause the grid frequency to increase. Frequency response controller 1312 may be configured to offset a fluctuation in the grid frequency by causing power inverter 1306 to supply energy from battery 1308 to energy grid 1304 (e.g., to offset a decrease in grid frequency) or store energy from energy grid 1304 in battery 1308 (e.g., to offset an increase in grid frequency).

In some embodiments, frequency response controller 1312 uses power inverter 1306 and battery 1308 to perform load shifting for campus 1302. For example, controller 1312 may cause power inverter 1306 to store energy in battery 1308 when energy prices are low and retrieve energy from battery 1308 when energy prices are high in order to reduce the cost of electricity required to power campus 1302. Load shifting may also allow system 1300 reduce the demand charge incurred. Demand charge is an additional charge imposed by some utility providers based on the maximum power consumption during an applicable demand charge period. For example, a demand charge rate may be specified in terms of dollars per unit of power (e.g., $/kW) and may be multiplied by the peak power usage (e.g., kW) during a demand charge period to calculate the demand charge. Load shifting may allow system 1300 to smooth momentary spikes in the electric demand of campus 1302 by drawing energy from battery 1308 in order to reduce peak power draw from energy grid 1304, thereby decreasing the demand charge incurred.

Still referring to FIG. 13, system 1300 is shown to include an incentive provider 1314. Incentive provider 1314 may be a utility (e.g., an electric utility), a regional transmission organization (RTO), an independent system operator (ISO), or any other entity that provides incentives for performing frequency regulation. For example, incentive provider 1314 may provide system 1300 with monetary incentives for participating in a frequency response program. In order to participate in the frequency response program, system 1300 may maintain a reserve capacity of stored energy (e.g., in battery 1308) that can be provided to energy grid 1304. System 1300 may also maintain the capacity to draw energy from energy grid 1304 and store the energy in battery 1308. Reserving both of these capacities may be accomplished by managing the state-of-charge of battery 1308.

Frequency response controller 1312 may provide incentive provider 1314 with a price bid and a capability bid. The price bid may include a price per unit power (e.g., $/MW) for reserving or storing power that allows system 1300 to participate in a frequency response program offered by incentive provider 1314. The price per unit power bid by frequency response controller 1312 is referred to herein as the "capability price." The price bid may also include a price for actual performance, referred to herein as the "performance price." The capability bid may define an amount of power (e.g., MW) that system 1300 will reserve or store in battery 1308 to perform frequency response, referred to herein as the "capability bid."

Incentive provider 1314 may provide frequency response controller 1312 with a capability clearing price $CP_{cap}$, a performance clearing price $CP_{perf}$, and a regulation award $Reg_{award}$, which correspond to the capability price, the performance price, and the capability bid, respectively. In some embodiments, $CP_{cap}$, $CP_{perf}$, and $Reg_{award}$ are the same as the corresponding bids placed by controller 1312. In other embodiments, $CP_{cap}$, $CP_{perf}$, and $Reg_{award}$ may not be the same as the bids placed by controller 1312. For example, $CP_{cap}$, $CP_{perf}$, and $Reg_{award}$ may be generated by incentive provider 1314 based on bids received from multiple participants in the frequency response program. Controller 1312 may use $CP_{cap}$, $CP_{perf}$, and $Reg_{award}$ to perform frequency regulation.

Frequency response controller 1312 is shown receiving a regulation signal from incentive provider 1314. The regulation signal may specify a portion of the regulation award $Reg_{award}$ that frequency response controller 1312 is to add or remove from energy grid 1304. In some embodiments, the regulation signal is a normalized signal (e.g., between $-1$ and 1) specifying a proportion of $Reg_{award}$. Positive values of the regulation signal may indicate an amount of power to add to energy grid 1304, whereas negative values of the regulation signal may indicate an amount of power to remove from energy grid 1304.

Frequency response controller 1312 may respond to the regulation signal by generating an optimal power setpoint for power inverter 1306. The optimal power setpoint may take into account both the potential revenue from participating in the frequency response program and the costs of participation. Costs of participation may include, for example, a monetized cost of battery degradation as well as the energy and demand charges that will be incurred. The optimization may be performed using sequential quadratic programming, dynamic programming, or any other optimization technique.

In some embodiments, controller 1312 uses a battery life model to quantify and monetize battery degradation as a function of the power setpoints provided to power inverter 1306. Advantageously, the battery life model allows controller 1312 to perform an optimization that weighs the revenue generation potential of participating in the frequency response program against the cost of battery degradation and other costs of participation (e.g., less battery power available for campus 1302, increased electricity costs, etc.). An exemplary regulation signal and power response are described in greater detail with reference to FIG. 14.

Figure 14:
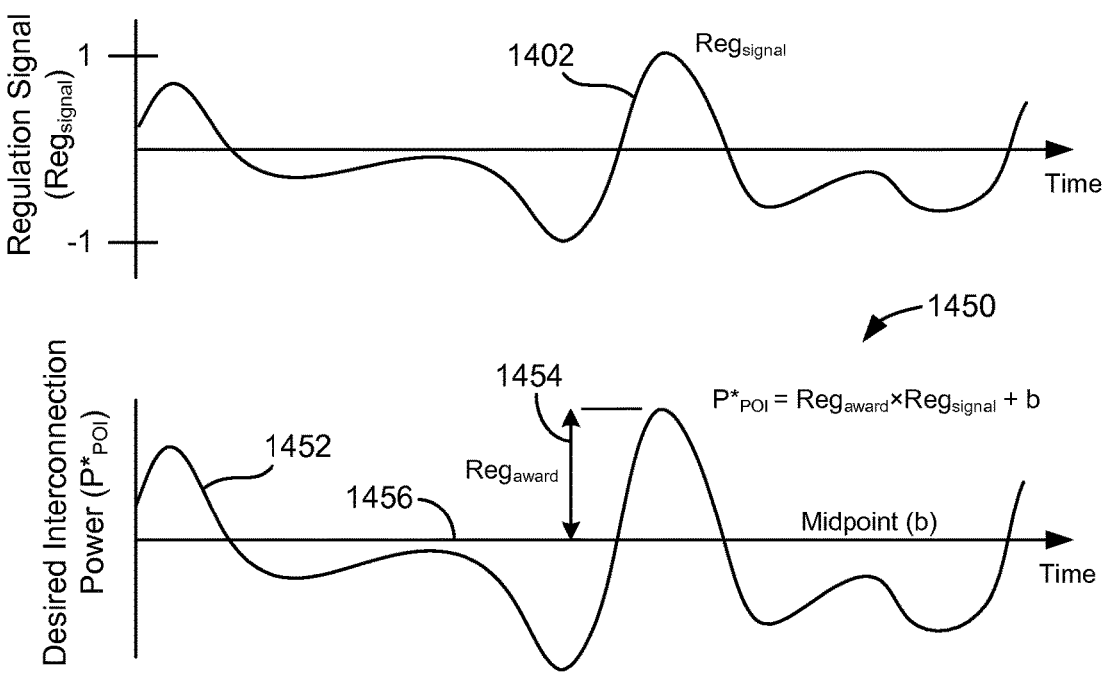
FIG. 14 is a graph of a regulation signal which may be provided to the frequency response optimization system of FIG. 13 and a frequency response signal which may be generated by frequency response optimization system of FIG. 13, according to an exemplary embodiment.

Referring now to FIG. 14, a pair of frequency response graphs 1400 and 1450 are shown, according to an exemplary embodiment. Graph 1400 illustrates a regulation signal $Reg_{signal}$ 1402 as a function of time. $Reg_{signal}$ 1402 is shown as a normalized signal ranging from $-1$ to 1 (i.e., $-1 < Reg_{signal} \leq 1$). $Reg_{signal}$ 1402 may be generated by incentive provider 1314 and provided to frequency response controller 1312. $Reg_{signal}$ 1402 may define a proportion of the regulation award $Reg_{award}$ 1454 that controller 1312 is to add or remove from energy grid 1304, relative to a baseline value referred to as the midpoint b 1456. For example, if the value of $Reg_{award}$ 1454 is 10 MW, a regulation signal value of 0.5 (i.e., $Reg_{signal}$=0.5) may indicate that system 1300 is requested to add 5 MW of power at POI 1310 relative to midpoint b (e.g., $P_{POI}^*$=10 MW×0.5+b), whereas a regulation signal value of $-0.3$ may indicate that system 1300 is requested to remove 3 MW of power from POI 1310 relative to midpoint b (e.g., $P_{POI}^*$=10 MW×0.3+b).

Graph 1450 illustrates the desired interconnection power $P_{POI}^*$ 1452 as a function of time. $P_{POI}^*$ 1452 may be calculated by frequency response controller 1312 based on $Reg_{signal}$ 1402, $Reg_{award}$ 1454, and a midpoint b 1456. For example, controller 1312 may calculate $P_{POI}^*$ 1452 using the following equation:

$$P_{POI}^* = Reg_{award} \times Reg_{signal} + b$$

where $P_{POI}^*$ represents the desired power at POI 1310 (e.g., $P_{POI}^* = P_{sup} + P_{campus}$) and b is the midpoint. Midpoint b may be defined (e.g., set or optimized) by controller 1312 and may represent the midpoint of regulation around which the load is modified in response to $Reg_{signal}$ 1402. Optimal adjustment of midpoint b may allow controller 1312 to actively participate in the frequency response market while also taking into account the energy and demand charge that will be incurred.

In order to participate in the frequency response market, controller 1312 may perform several tasks. Controller 1312 may generate a price bid (e.g., \$/MW) that includes the capability price and the performance price. In some embodiments, controller 1312 sends the price bid to incentive provider 1314 at approximately 15:30 each day and the price bid remains in effect for the entirety of the next day. Prior to beginning a frequency response period, controller 1312 may generate the capability bid (e.g., MW) and send the capability bid to incentive provider 1314. In some embodiments, controller 1312 generates and sends the capability bid to incentive provider 1314 approximately 1.5 hours before a frequency response period begins. In an exemplary embodiment, each frequency response period has a duration of one hour; however, it is contemplated that frequency response periods may have any duration.

At the start of each frequency response period, controller 1312 may generate the midpoint b around which controller 1312 plans to perform frequency regulation. In some embodiments, controller 1312 generates a midpoint b that will maintain battery 1308 at a constant state-of-charge (SOC) (i.e. a midpoint that will result in battery 1308 having the same SOC at the beginning and end of the frequency response period). In other embodiments, controller 1312 generates midpoint b using an optimization procedure that allows the SOC of battery 1308 to have different values at the beginning and end of the frequency response period. For example, controller 1312 may use the SOC of battery 1308 as a constrained variable that depends on midpoint b in order to optimize a value function that takes into account frequency response revenue, energy costs, and the cost of battery degradation. Exemplary processes for calculating and/or optimizing midpoint b under both the constant SOC scenario and the variable SOC scenario are described in detail in U.S. Provisional Patent Application No. 62/239,233 filed Oct. 8, 2015, the entire disclosure of which is incorporated by reference herein.

During each frequency response period, controller 1312 may periodically generate a power setpoint for power inverter 1306. For example, controller 1312 may generate a power setpoint for each time step in the frequency response period. In some embodiments, controller 1312 generates the power setpoints using the equation:

$$P_{POI}^* = Reg_{award} \times Reg_{signal} + b$$

where $P_{POI}^* = P_{sup} + P_{campus}$ Positive values of $P_{POI}^*$ indicate energy flow from POI 1310 to energy grid 1304. Positive values of $P_{sup}$ and $P_{campus}$ indicate energy flow to POI 1310 from power inverter 1306 and campus 1302, respectively. In other embodiments, controller 1312 generates the power setpoints using the equation:

$$P_{POI}* = Reg_{award} \times Res_{FR} + b$$

where $Res_{FR}$ is an optimal frequency response generated by optimizing a value function. Controller 1312 may subtract P campus from $P_{POI}*$ to generate the power setpoint for power inverter 1306 (i.e., $P_{sup} = P_{POI}* - P_{campus}$) The power setpoint for power inverter 1306 indicates the amount of power that power inverter 1306 is to add to POI 1310 (if the power setpoint is positive) or remove from POI 1310 (if the power setpoint is negative). Exemplary processes for calculating power inverter setpoints are described in detail in U.S. Provisional Patent Application No. 62/239,233.

Frequency Response Controller

Figure 15:
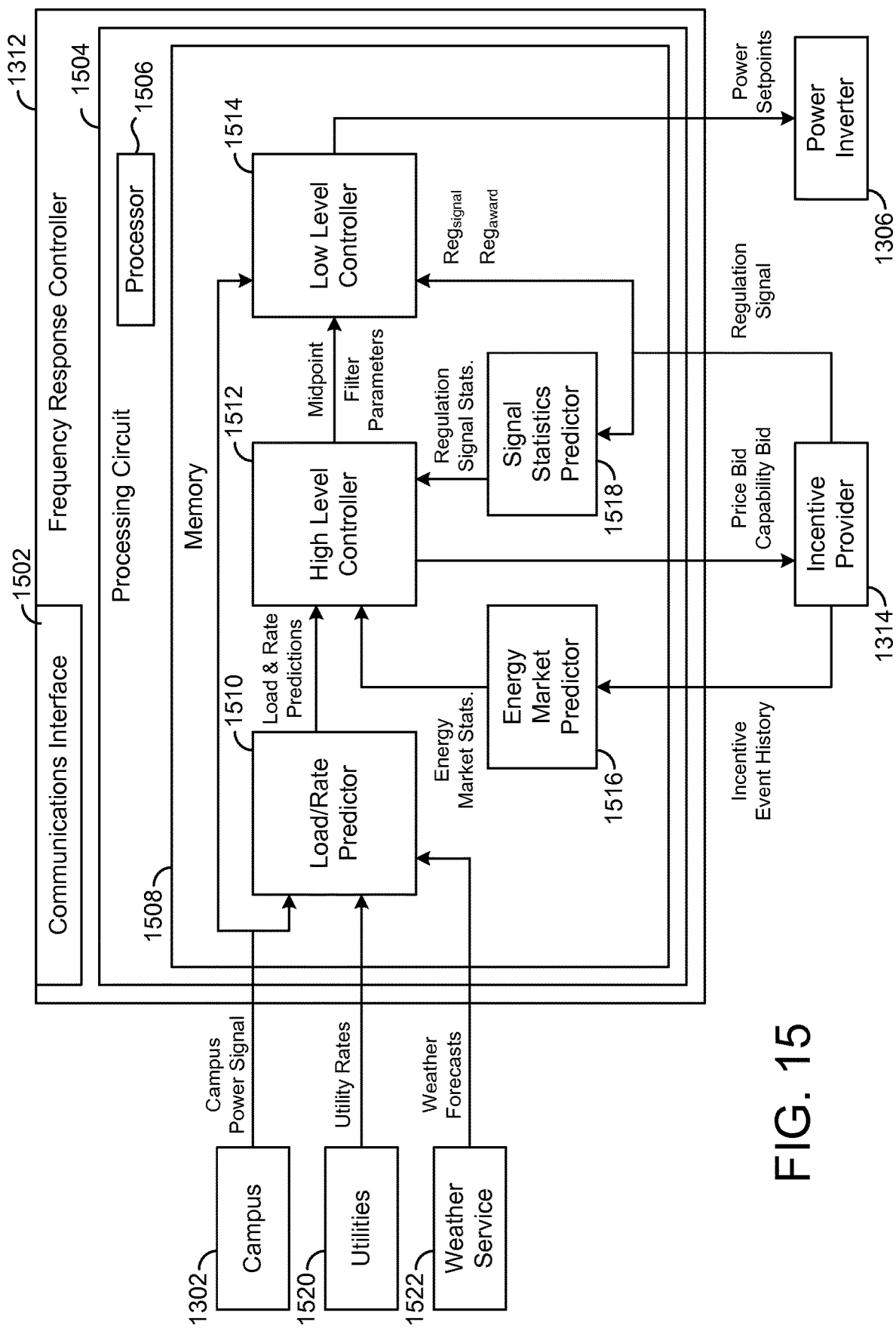
FIG. 15 is a block diagram of a frequency response controller which can be used to monitor and control the frequency response optimization system of FIG. 13, according to an exemplary embodiment.

Referring now to FIG. 15, a block diagram illustrating frequency response controller 1312 in greater detail is shown, according to an exemplary embodiment. Frequency response controller 1312 may be configured to perform an optimization process to generate values for the bid price, the capability bid, and the midpoint b. In some embodiments, frequency response controller 1312 generates values for the bids and the midpoint b periodically using a predictive optimization scheme (e.g., once every half hour, once per frequency response period, etc.). Controller 1312 may also calculate and update power setpoints for power inverter 1306 periodically during each frequency response period (e.g., once every two seconds).

In some embodiments, the interval at which controller 1312 generates power setpoints for power inverter 1306 is significantly shorter than the interval at which controller 1312 generates the bids and the midpoint b. For example, controller 1312 may generate values for the bids and the midpoint b every half hour, whereas controller 1312 may generate a power setpoint for power inverter 1306 every two seconds. The difference in these time scales allows controller 1312 to use a cascaded optimization process to generate optimal bids, midpoints b, and power setpoints.

In the cascaded optimization process, a high level controller 1512 determines optimal values for the bid price, the capability bid, and the midpoint b by performing a high level optimization. High level controller 1512 may select midpoint b to maintain a constant state-of-charge in battery 1308 (i.e., the same state-of-charge at the beginning and end of each frequency response period) or to vary the state-of-charge in order to optimize the overall value of operating system 1300 (e.g., frequency response revenue minus energy costs and battery degradation costs). High level controller 1512 may also determine filter parameters for a signal filter (e.g., a low pass filter) used by a low level controller 1514.

Low level controller 1514 uses the midpoint b and the filter parameters from high level controller 1512 to perform a low level optimization in order to generate the power setpoints for power inverter 1306. Advantageously, low level controller 1514 may determine how closely to track the desired power $P_{POI}*$ at the point of interconnection 1310. For example, the low level optimization performed by low level controller 1514 may consider not only frequency response revenue but also the costs of the power setpoints in terms of energy costs and battery degradation. In some instances, low level controller 1514 may determine that it is deleterious to battery 1308 to follow the regulation exactly and may sacrifice a portion of the frequency response revenue in order to preserve the life of battery 1308. The cascaded optimization process is described in greater detail below.

Still referring to FIG. 15, frequency response controller 1312 is shown to include a communications interface 1502 and a processing circuit 1504. Communications interface 1502 may include wired or wireless interfaces (e.g., jacks, antennas, transmitters, receivers, transceivers, wire terminals, etc.) for conducting data communications with various systems, devices, or networks. For example, communications interface 1502 may include an Ethernet card and port for sending and receiving data via an Ethernet-based communications network and/or a WiFi transceiver for communicating via a wireless communications network. Communications interface 1502 may be configured to communicate via local area networks or wide area networks (e.g., the Internet, a building WAN, etc.) and may use a variety of communications protocols (e.g., BACnet, IP, LON, etc.).

Communications interface 1502 may be a network interface configured to facilitate electronic data communications between frequency response controller 1312 and various external systems or devices (e.g., campus 1302, energy grid 1304, power inverter 1306, incentive provider 1314, utilities 1520, weather service 1522, etc.). For example, frequency response controller 1312 may receive inputs from incentive provider 1314 indicating an incentive event history (e.g., past clearing prices, mileage ratios, participation requirements, etc.) and a regulation signal. Controller 1312 may receive a campus power signal from campus 1302, utility rates from utilities 1520, and weather forecasts from weather service 1522 via communications interface 1502. Controller 1312 may provide a price bid and a capability bid to incentive provider 1314 and may provide power setpoints to power inverter 1306 via communications interface 1502.

Still referring to FIG. 15, processing circuit 1504 is shown to include a processor 1506 and memory 1508. Processor 1506 may be a general purpose or specific purpose processor, an application specific integrated circuit (ASIC), one or more field programmable gate arrays (FPGAs), a group of processing components, or other suitable processing components. Processor 1506 may be configured to execute computer code or instructions stored in memory 1508 or received from other computer readable media (e.g., CDROM, network storage, a remote server, etc.).

Memory 1508 may include one or more devices (e.g., memory units, memory devices, storage devices, etc.) for storing data and/or computer code for completing and/or facilitating the various processes described in the present disclosure. Memory 1508 may include random access memory (RAM), read-only memory (ROM), hard drive storage, temporary storage, non-volatile memory, flash memory, optical memory, or any other suitable memory for storing software objects and/or computer instructions. Memory 1508 may include database components, object code components, script components, or any other type of information structure for supporting the various activities and information structures described in the present disclosure. Memory 1508 may be communicably connected to processor 1506 via processing circuit 1504 and may include computer code for executing (e.g., by processor 1506) one or more processes described herein.

Still referring to FIG. 15, frequency response controller 1312 is shown to include a load/rate predictor 1510. Load/rate predictor 1510 may be configured to predict the electric load of campus 1302 (i.e., $\hat{P}_{campus}$) for each time step k (e.g., k=1 ... n) within an optimization window. Load/rate predictor 1510 is shown receiving weather forecasts from a weather service 1522. In some embodiments, load/rate predictor 1510 predicts $\hat{P}_{campus}$ as a function of the weather forecasts. In some embodiments, load/rate predictor 1510 uses feedback from campus 1302 to predict $\hat{P}_{campus}$. Feedback from campus 1302 may include various types of sensory inputs (e.g., temperature, flow, humidity, enthalpy, etc.) or other data relating to buildings 1316, central plant 1318, and/or energy generation 1320 (e.g., inputs from a HVAC system, a lighting control system, a security system, a water system, a PV energy system, etc.). Load/rate predictor 1510 may predict one or more different types of loads for campus 1302. For example, load/rate predictor 1510 may predict a hot water load, a cold water load, and/or an electric load for each time step k within the optimization window.

In some embodiments, load/rate predictor 1510 receives a measured electric load and/or previous measured load data from campus 1302. For example, load/rate predictor 1510 is shown receiving a campus power signal from campus 1302. The campus power signal may indicate the measured electric load of campus 1302. Load/rate predictor 1510 may predict one or more statistics of the campus power signal including, for example, a mean campus power $\mu_{campus}$ and a standard deviation of the campus power $\sigma_{campus}$. Load/rate predictor 1510 may predict $\hat{P}_{campus}$ as a function of a given weather forecast ($\hat{\varphi}_w$), a day type (clay), the time of day (t), and previous measured load data ($Y_{k-1}$). Such a relationship is expressed in the following equation:

$$\hat{P}_{campus} = f(\hat{\varphi}_w, day, t | Y_{k-1})$$

In some embodiments, load/rate predictor 1510 uses a deterministic plus stochastic model trained from historical load data to predict $\hat{P}_{campus}$. Load/rate predictor 1510 may use any of a variety of prediction methods to predict $\hat{P}_{campus}$ (e.g., linear regression for the deterministic portion and an AR model for the stochastic portion). In some embodiments, load/rate predictor 1510 makes load/rate predictions using the techniques described in U.S. patent application Ser. No. 14/717,593.

Load/rate predictor 1510 is shown receiving utility rates from utilities 1520. Utility rates may indicate a cost or price per unit of a resource (e.g., electricity, natural gas, water, etc.) provided by utilities 1520 at each time step k in the optimization window. In some embodiments, the utility rates are time-variable rates. For example, the price of electricity may be higher at certain times of day or days of the week (e.g., during high demand periods) and lower at other times of day or days of the week (e.g., during low demand periods). The utility rates may define various time periods and a cost per unit of a resource during each time period. Utility rates may be actual rates received from utilities 1520 or predicted utility rates estimated by load/rate predictor 1510.

In some embodiments, the utility rates include demand charges for one or more resources provided by utilities 1520. A demand charge may define a separate cost imposed by utilities 1520 based on the maximum usage of a particular resource (e.g., maximum energy consumption) during a demand charge period. The utility rates may define various demand charge periods and one or more demand charges associated with each demand charge period. In some instances, demand charge periods may overlap partially or completely with each other and/or with the prediction window. Advantageously, frequency response controller 1312 may be configured to account for demand charges in the high level optimization process performed by high level controller 1512. Utilities 1520 may be defined by time-variable (e.g., hourly) prices, a maximum service level (e.g., a maximum rate of consumption allowed by the physical infrastructure or by contract) and, in the case of electricity, a demand charge or a charge for the peak rate of consumption within a certain period. Load/rate predictor 1510 may store the predicted campus power $\hat{P}_{campus}$ and the utility rates in memory 1508 and/or provide the predicted campus power $\hat{P}_{campus}$ and the utility rates to high level controller 1512.

Still referring to FIG. 15, frequency response controller 1312 is shown to include an energy market predictor 1516 and a signal statistics predictor 1518. Energy market predictor 1516 may be configured to predict energy market statistics relating to the frequency response program. For example, energy market predictor 1516 may predict the values of one or more variables that can be used to estimate frequency response revenue. In some embodiments, the frequency response revenue is defined by the following equation:

$$Rev = PS(CP_{cap} + MR \cdot CP_{perf})Reg_{award}$$

where Rev is the frequency response revenue, $CP_{cap}$ is the capability clearing price, MR is the mileage ratio, and $CP_{perf}$ is the performance clearing price. PS is a performance score based on how closely the frequency response provided by controller 1312 tracks the regulation signal. Energy market predictor 1516 may be configured to predict the capability clearing price $CP_{cap}$, the performance clearing price $CP_{perf}$, the mileage ratio MR, and/or other energy market statistics that can be used to estimate frequency response revenue. Energy market predictor 1516 may store the energy market statistics in memory 1508 and/or provide the energy market statistics to high level controller 1512.

Signal statistics predictor 1518 may be configured to predict one or more statistics of the regulation signal provided by incentive provider 1314. For example, signal statistics predictor 1518 may be configured to predict the mean $\mu_{FR}$, standard deviation $\sigma_{FR}$, and/or other statistics of the regulation signal. The regulation signal statistics may be based on previous values of the regulation signal (e.g., a historical mean, a historical standard deviation, etc.) or predicted values of the regulation signal (e.g., a predicted mean, a predicted standard deviation, etc.).

In some embodiments, signal statistics predictor 1518 uses a deterministic plus stochastic model trained from historical regulation signal data to predict future values of the regulation signal. For example, signal statistics predictor 1518 may use linear regression to predict a deterministic portion of the regulation signal and an AR model to predict a stochastic portion of the regulation signal. In some embodiments, signal statistics predictor 1518 predicts the regulation signal using the techniques described in U.S. patent application Ser. No. 14/717,593. Signal statistics predictor 1518 may use the predicted values of the regulation signal to calculate the regulation signal statistics. Signal statistics predictor 1518 may store the regulation signal statistics in memory 1508 and/or provide the regulation signal statistics to high level controller 1512.

Still referring to FIG. 15, frequency response controller 1312 is shown to include a high level controller 1512. High level controller 1512 may be configured to generate values for the midpoint b and the capability bid $Reg_{award}$. In some embodiments, high level controller 1512 determines a midpoint b that will cause battery 1308 to have the same state-of-charge (SOC) at the beginning and end of each frequency response period. In other embodiments, high level controller 1512 performs an optimization process to generate midpoint b and $Reg_{award}$. For example, high level controller 1512 may generate midpoint b using an optimization procedure that allows the SOC of battery 1308 to vary and/or have different values at the beginning and end of the frequency response period. High level controller 1512 may use the SOC of battery 1308 as a constrained variable that depends on midpoint b in order to optimize a value function that takes into account frequency response revenue, energy costs, and the cost of battery degradation. Both of these embodiments are described in greater detail with reference to FIG. 16.

High level controller 1512 may determine midpoint b by equating the desired power $P_{POI}^*$ at POI 1310 with the actual power at POI 1310 as shown in the following equation:

$$(Reg_{signal})(Reg_{award})b = P_{bat} + P_{loss} + P_{campus}$$

where the left side of the equation $(Reg_{signal})(Reg_{award})+b$ is the desired power $P_{POI}^*$ at POI 1310 and the right side of the equation is the actual power at POI 1310. Integrating over the frequency response period results in the following equation:

$$\int_{period} ((Reg_{signal})(Reg_{award}) + b)dt = \int_{period} (P_{bat} + P_{loss} + P_{campus})dt$$

For embodiments in which the SOC of battery 1308 is maintained at the same value at the beginning and end of the frequency response period, the integral of the battery power $P_{bat}$ over the frequency response period is zero (i.e., $\int P_{bat}dt=0$). Accordingly, the previous equation can be rewritten as follows:

$$b = \int_{period} P_{loss}dt + \int_{period} P_{campus}dt - Reg_{award}\int_{period} Reg_{signal}dt$$

where the term $\int P_{bat}dt$ has been omitted because $\int P_{bat}dt=0$. This is ideal behavior if the only goal is to maximize frequency response revenue. Keeping the SOC of battery 1308 at a constant value (and near 50%) will allow system 1300 to participate in the frequency market during all hours of the day.

High level controller 1512 may use the estimated values of the campus power signal received from campus 1302 to predict the value of $\int P_{campus}dt$ over the frequency response period. Similarly, high level controller 1512 may use the estimated values of the regulation signal from incentive provider 1314 to predict the value of $\int Reg_{signal}dt$ over the frequency response period. High level controller 1512 may estimate the value of $\int P_{loss}dt$ using a Thevinin equivalent circuit model of battery 1308 (described in greater detail with reference to FIG. 16). This allows high level controller 1512 to estimate the integral $\int P_{loss}dt$ as a function of other variables such as $Reg_{award}$, $Reg_{signal}$, $P_{campus}$, and midpoint b.

After substituting known and estimated values, the preceding equation can be rewritten as follows:

$$\frac{1}{4P_{max}}[E\{P_{campus}^2\} + Reg_{award}^2 E\{Reg_{signal}^2\} -$$

$$2 Reg_{award} E\{Reg_{signal}\}E\{P_{campus}\}]\Delta t +$$

-continued $$[Reg_{award}E\{Reg_{signal}\} - E\{P_{campus}\}]\Delta t +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

where the notation $E\{\ \}$ indicates that the variable within the brackets $\{\ \}$ is ergodic and can be approximated by the estimated mean of the variable. For example, the term $E\{Reg_{signal}\}$ can be approximated by the estimated mean of the regulation signal $\mu_{FR}$ and the term $E\{P_{campus}\}$ can be approximated by the estimated mean of the campus power signal $\mu_{campus}$. High level controller 1512 may solve the equation for midpoint b to determine the midpoint b that maintains battery 1308 at a constant state-of-charge.

For embodiments in which the SOC of battery 1308 is treated as a variable, the SOC of battery 1308 may be allowed to have different values at the beginning and end of the frequency response period. Accordingly, the integral of the battery power $P_{bat}$ over the frequency response period can be expressed as $\Delta SOC \cdot C_{des}$ as shown in the following equation:

$$\int_{period} P_{bat}dt = -\Delta SOC \cdot C_{des}$$

where $\Delta SOC$ is the change in the SOC of battery 1308 over the frequency response period and $C_{des}$ is the design capacity of battery 1308. The SOC of battery 1308 may be a normalized variable (i.e., $0 \leq SOC \leq 1$) such that the term $SOC \cdot C_{des}$ represents the amount of energy stored in battery 1308 for a given state-of-charge. The SOC is shown as a negative value because drawing energy from battery 1308 (i.e., a positive $P_{bat}$) decreases the SOC of battery 1308. The equation for midpoint b becomes:

$$b = \int_{period} P_{loss}dt + \int_{period} P_{campus}dt + \int_{period} P_{bat}dt - Reg_{award}\int_{period} Reg_{signal}dt$$

After substituting known and estimated values, the preceding equation can be rewritten as follows:

$$\frac{1}{4P_{max}}[E\{P_{campus}^2\} + Reg_{award}^2 +$$

$$E\{Reg_{signal}^2\} - 2Reg_{award}E\{Reg_{signal}\}E\{P_{campus}\}]\Delta t +$$

$$[Reg_{award}E\{Reg_{signal}\} + E\{P_{campus}\}]\Delta t + \Delta SOC \cdot C_{des} +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

High level controller 1512 may solve the equation for midpoint b in terms of $\Delta SOC$.

High level controller 1512 may perform an optimization to find optimal midpoints b for each frequency response period within an optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. The electricity cost is expressed as a positive value because drawing power from energy grid 1304 is represented as a negative power and therefore will result in negative value (i.e., a cost) in the objective function. The demand charge is expressed as a minimum for the same reason (i.e., the most negative power value represents maximum power draw from energy grid 1304).

High level controller 1512 may estimate the frequency response revenue $Rev(Reg_{award,k})$ as a function of the midpoints b. In some embodiments, high level controller 1512 estimates frequency response revenue using the following equation:

$$Rev(Reg_{award}) = Reg_{award}(CP_{cap} + MR \cdot CP_{perf})$$

where $CP_{cap}$, MR, and $CP_{perf}$ are the energy market statistics received from energy market predictor 1516 and $Reg_{award}$ is a function of the midpoint b. For example, high level controller 1512 may place a bid that is as large as possible for a given midpoint, as shown in the following equation:

$$Reg_{award} = P_{limit} - |b|$$

where $P_{limit}$ is the power rating of power inverter 1306. Advantageously, selecting $Reg_{award}$ as a function of midpoint b allows high level controller 1512 to predict the frequency response revenue that will result from a given midpoint b.

High level controller 1512 may estimate the cost of battery degradation $\lambda_{bat}$ as a function of the midpoints b. For example, high level controller 1512 may use a battery life model to predict a loss in battery capacity that will result from a set of midpoints b, power outputs, and/or other variables that can be manipulated by controller 1312. In some embodiments, the battery life model expresses the loss in battery capacity $C_{loss,add}$ as a sum of multiple piecewise linear functions, as shown in the following equation:

$$C_{loss,add} = f_1(T_{cell})f_2(SOC)f_3(DOD)f_4(PR)f_5(ER)C_{loss,nom}$$

where $T_{cell}$ is the cell temperature, SOC is the state-of-charge, DOD is the depth of discharge, PR is the average power ratio $$\left(\text{e.g., } PR = \text{avg}\left(\frac{P}{P_{des}}\right)\right),$$

and ER is me average effort ratio $$\left(\text{e.g., } ER = \text{avg}\left(\frac{\Delta P}{P_{des}}\right)\right)$$

of battery 1308. Each of these terms is described in greater detail with reference to FIG. 16. Advantageously, several of the terms in the battery life model depend on the midpoints b and power setpoints selected by controller 1312. This allows high level controller 1512 to predict a loss in battery capacity that will result from a given set of control outputs. High level controller 1512 may monetize the loss in battery capacity and include the monetized cost of battery degradation $\lambda_{bat}$ in the objective function J.

In some embodiments, high level controller 1512 generates a set of filter parameters for low level controller 1514. The filter parameters may be used by low level controller 1514 as part of a low-pass filter that removes high frequency components from the regulation signal. In some embodiments, high level controller 1512 generates a set of filter parameters that transform the regulation signal into an optimal frequency response signal $Res_{FR}$. For example, high level controller 1512 may perform a second optimization process to determine an optimal frequency response $Res_{FR}$ based on the optimized values for $Reg_{award}$ and midpoint b.

In some embodiments, high level controller 1512 determines the optimal frequency response $Res_{FR}$ by optimizing value function J with the frequency response revenue $Rev(Reg_{award})$ defined as follows:

$$Rev(Reg_{award}) = PS \cdot Reg_{award}(CP_{cap} + MR \cdot CP_{perf})$$

and with the frequency response $Res_{FR}$ substituted for the regulation signal in the battery life model. The performance score PS may be based on several factors that indicate how well the optimal frequency response $Res_{FR}$ tracks the regulation signal. Closely tracking the regulation signal may result in higher performance scores, thereby increasing the frequency response revenue. However, closely tracking the regulation signal may also increase the cost of battery degradation $\lambda_{bat}$. The optimized frequency response $Res_{FR}$ represents an optimal tradeoff between decreased frequency response revenue and increased battery life. High level controller 1512 may use the optimized frequency response $Res_{FR}$ to generate a set of filter parameters for low level controller 1514. These and other features of high level controller 1512 are described in greater detail with reference to FIG. 16.

Still referring to FIG. 15, frequency response controller 1312 is shown to include a low level controller 1514. Low level controller 1514 is shown receiving the midpoints b and the filter parameters from high level controller 1512. Low level controller 1514 may also receive the campus power signal from campus 1302 and the regulation signal from incentive provider 1314. Low level controller 1514 may use the regulation signal to predict future values of the regulation signal and may filter the predicted regulation signal using the filter parameters provided by high level controller 1512.

Low level controller 1514 may use the filtered regulation signal to determine optimal power setpoints for power inverter 1306. For example, low level controller 1514 may use the filtered regulation signal to calculate the desired interconnection power $P_{POI}^*$ using the following equation:

$$P_{POI}^* = Reg_{award} \cdot Reg_{filter} + b$$

where $Reg_{filter}$ is the filtered regulation signal. Low level controller 1514 may subtract the campus power $P_{campus}$ from the desired interconnection power $P_{POI}^*$ to calculate the optimal power setpoints $P_{SP}$ for power inverter 1306, as shown in the following equation:

$$P_{SP} = P_{POI} - P_{campus}$$

In some embodiments, low level controller 1514 performs an optimization to determine how closely to track $P_{POI}^*$. For example, low level controller 1514 may determine an optimal frequency response $Res_{FR}$ by optimizing value function J with the frequency response revenue $Rev(Reg_{award})$ defined as follows:

$$Rev(Reg_{award})=PS \cdot Reg_{award}(CP_{cap}+MR \cdot CP_{perf})$$

and with the frequency response $Res_{FR}$ substituted for the regulation signal in the battery life model. Low level controller 1514 may use the optimal frequency response $Res_{FR}$ in place of the filtered frequency response $Reg_{filter}$ to calculate the desired interconnection power $P_{POI}^*$ and power setpoints $P_{SP}$ as previously described. These and other features of low level controller 1514 are described in greater detail with reference to FIG. 17.

High Level Controller

Figure 16:
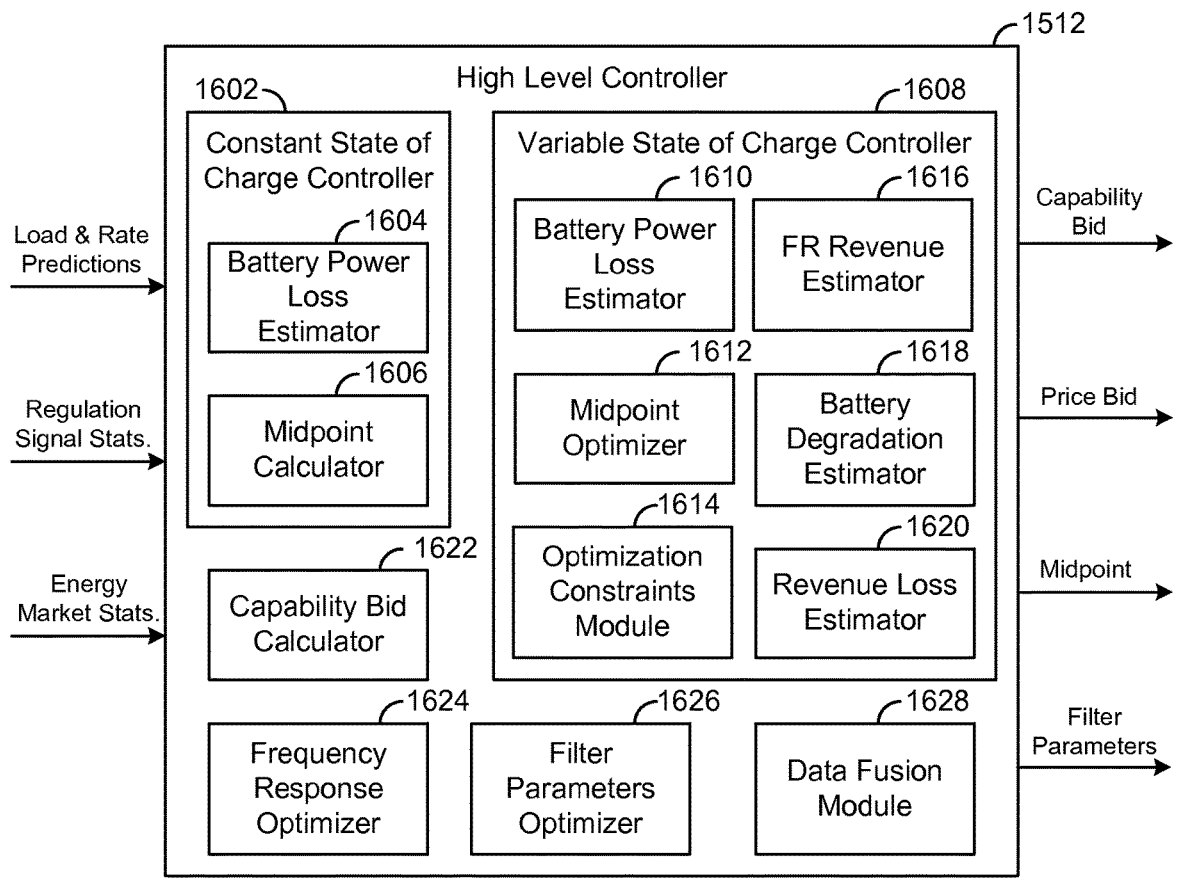
FIG. 16 is a block diagram of a high level controller which can be used in the frequency response optimization system of FIG. 13, according to an exemplary embodiment.

Referring now to FIG. 16, a block diagram illustrating high level controller 1512 in greater detail is shown, according to an exemplary embodiment. High level controller 1512 is shown to include a constant state-of-charge (SOC) controller 1602 and a variable SOC controller 1608. Constant SOC controller 1602 may be configured to generate a midpoint b that results in battery 1308 having the same SOC at the beginning and the end of each frequency response period. In other words, constant SOC controller 1608 may determine a midpoint b that maintains battery 1308 at a predetermined SOC at the beginning of each frequency response period. Variable SOC controller 1608 may generate midpoint b using an optimization procedure that allows the SOC of battery 1308 to have different values at the beginning and end of the frequency response period. In other words, variable SOC controller 1608 may determine a midpoint b that results in a net change in the SOC of battery 1308 over the duration of the frequency response period.

Constant State-of-Charge Controller

Constant SOC controller 1602 may determine midpoint b by equating the desired power $P_{POI}^*$ at POI 1310 with the actual power at POI 1310 as shown in the following equation:

$$(Reg_{signal})(Reg_{award})b=P_{bat}+P_{loss}+P_{campus}$$

where the left side of the equation $(Reg_{signal})(Reg_{award})+b$ is the desired power $P_{POI}^*$ at POI and the right side of the equation is the actual power at POI 1310. Integrating over the frequency response period results in the following equation:

$$\int_{period} ((Reg_{signal})(Reg_{award})+b)dt = \int_{period} (P_{bat}+P_{loss}+P_{campus})dt$$

Since the SOC of battery 1308 is maintained at the same value at the beginning and end of the frequency response period, the integral of the battery power $P_{bat}$ over the frequency response period is zero (i.e., $\int P_{bat}dt=0$). Accordingly, the previous equation can be rewritten as follows:

$$b = \int_{period} P_{loss}dt + \int_{period} P_{campus}dt - Reg_{award} \int_{period} Reg_{signal}dt$$

where the term $\int P_{bat}dt$ has been omitted because $\int P_{bat}dt=0$. This is ideal behavior if the only goal is to maximize frequency response revenue. Keeping the SOC of battery 1308 at a constant value (and near 50%) will allow system 1300 to participate in the frequency market during all hours of the day.

Constant SOC controller 1602 may use the estimated values of the campus power signal received from campus 1302 to predict the value of $\int P_{campus}dt$ over the frequency response period. Similarly, constant SOC controller 1602 may use the estimated values of the regulation signal from incentive provider 1314 to predict the value of $\int Reg_{signal}dt$ over the frequency response period. $Reg_{award}$ can be expressed as a function of midpoint b as previously described (e.g., $Reg_{award}=P_{limit}-|b|$). Therefore, the only remaining term in the equation for midpoint b is the expected battery power loss $\int P_{loss}$.

Constant SOC controller 1602 is shown to include a battery power loss estimator 1604. Battery power loss estimator 1604 may estimate the value of $\int P_{loss}dt$ using a Thevinin equivalent circuit model of battery 1308. For example, battery power loss estimator 1604 may model battery 1308 as a voltage source in series with a resistor. The voltage source has an open circuit voltage of $V_{OC}$ and the resistor has a resistance of $R_{TH}$. An electric current I flows from the voltage source through the resistor.

To find the battery power loss in terms of the supplied power $P_{sup}$, battery power loss estimator 1604 may identify the supplied power $P_{sup}$ as a function of the current I, the open circuit voltage $V_{OC}$, and the resistance $R_{TH}$ as shown in the following equation:

$$P_{sup}=V_{OC}I-I^2R_{TH}$$

which can be rewritten as:

$$\frac{I^2}{I_{SC}} - I + \frac{P'}{4} = 0$$

with the following substitutions:

$$I_{SC} = \frac{V_{OC}}{R_{TH}}, P' = \frac{P}{P_{max}}, P_{max} = \frac{V_{OC}^2}{4R_{TH}}$$

where P is the supplied power and $P_{max}$ is the maximum possible power transfer.

Battery power loss estimator 1604 may solve for the current I as follows:

$$I = \frac{I_{SC}}{2}(1-\sqrt{1-P'})$$

which can be converted into an expression for power loss $P_{loss}$ in terms of the supplied power P and the maximum possible power transfer $P_{max}$ as shown in the following equation:

$$P_{loss}=P_{max}(1-\sqrt{1-P'})^2$$

Battery power loss estimator 1604 may simplify the previous equation by approximating the expression $(1-\sqrt{1-P'})$ as a linear function about $P'=0$. This results in the following approximation for $P_{loss}$:

$$P_{loss} \approx P_{max}\left(\frac{P'}{2}\right)^2$$

which is a good approximation for powers up to one-fifth of the maximum power.

Battery power loss estimator 1604 may calculate the expected value of $\int P_{loss}dt$ over the frequency response period as follows:

$$\int_{period} P_{loss}dt = \int_{period} -P_{max}\left(\frac{Reg_{award}Reg_{signal}+b-P_{campus}}{2P_{max}}\right)^2 dt =$$

$$\frac{1}{4P_{max}}\left[2Reg_{award}\int_{period} P_{campus}Reg_{signal}dt - \int_{period} P_{campus}^2 dt - Reg_{award}^2 \int_{period} Reg_{signal}^2 dt\right] +$$

$$\frac{b}{2P_{max}}\left[\int_{period} P_{campus}^2 dt - reg_{award}\int_{period} Reg_{signal}dt\right] - \frac{b^2}{4P_{max}}\Delta t =$$

$$\frac{1}{4P_{max}}[E\{P_{campus}^2\} + Reg_{award}^2 E\{Reg_{signal}^2\} -$$

$$2Reg_{award}E\{Reg_{signal}\}E\{P_{campus}\}]\Delta t -$$

$$\frac{b}{2P_{max}}[Reg_{award}E\{Reg_{signal}\} - E\{P_{campus}\}]\Delta t - \frac{b^2}{4P_{max}}\Delta t$$

where the notation E{ } indicates that the variable within the brackets { } is ergodic and can be approximated by the estimated mean of the variable. This formulation allows battery power loss estimator 1604 to estimate $\int P_{loss}dt$ as a function of other variables such as $Reg_{award}$, $Reg_{signal}$, $P_{campus}$, midpoint b, and $P_{max}$.

Constant SOC controller 1602 is shown to include a midpoint calculator 1606. Midpoint calculator 1606 may be configured to calculate midpoint b by substituting the previous expression for $\int P_{loss}dt$ into the equation for midpoint b. After substituting known and estimated values, the equation for midpoint b can be rewritten as follows:

$$\frac{1}{4P_{max}}[E\{P_{campus}^2\} + Reg_{award}^2 E\{Reg_{signal}^2\} -$$

$$2Reg_{award}E\{Reg_{signal}\}E\{P_{campus}\}]\Delta t +$$

$$[Reg_{award}E\{Reg_{signal}\} - E\{P_{campus}\}]\Delta t +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

Midpoint calculator 1606 may solve the equation for midpoint b to determine the midpoint b that maintains battery 1308 at a constant state-of-charge.

Variable State-of-Charge Controller

Variable SOC controller 1608 may determine optimal midpoints b by allowing the SOC of battery 1308 to have different values at the beginning and end of a frequency response period. For embodiments in which the SOC of battery 1308 is allowed to vary, the integral of the battery power $P_{bat}$ over the frequency response period can be expressed as $-\Delta SOC \cdot C_{des}$ as shown in the following equation:

$$\int_{period} P_{bat}dt = -\Delta SOC \cdot C_{des}$$

where $\Delta SOC$ is the change in the SOC of battery 1308 over the frequency response period and $C_{des}$ is the design capacity of battery 1308. The SOC of battery 1308 may be a normalized variable (i.e., $0 \leq SOC \leq 1$) such that the term $SOC \cdot C_{des}$ represents the amount of energy stored in battery 1308 for a given state-of-charge. The SOC is shown as a negative value because drawing energy from battery 1308 (i.e., a positive $P_{bat}$) decreases the SOC of battery 1308. The equation for midpoint b becomes:

$$b = \int_{period} P_{loss}dt + \int_{period} P_{campus}dt + \int_{period} P_{bat}dt - Reg_{award}\int_{period} Reg_{signal}dt$$

Variable SOC controller 1608 is shown to include a battery power loss estimator 1610 and a midpoint optimizer 1612. Battery power loss estimator 1610 may be the same or similar to battery power loss estimator 1604. Midpoint optimizer 1612 may be configured to establish a relationship between the midpoint b and the SOC of battery 1308. For example, after substituting known and estimated values, the equation for midpoint b can be written as follows:

$$\frac{1}{4P_{max}}[E\{P_{campus}^2\} + Reg_{award}^2 +$$

$$E\{Reg_{signal}^2\} - 2Reg_{award}E\{Reg_{signal}\}E\{P_{campus}\}]\Delta t +$$

$$[Reg_{award}E\{Reg_{signal}\} + E\{P_{campus}\}]\Delta t + \Delta SOC \cdot C_{des} +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

Advantageously, the previous equation defines a relationship between midpoint b and the change in SOC of battery 1308. Midpoint optimizer 1612 may use this equation to determine the impact that different values of midpoint b have on the SOC in order to determine optimal midpoints b. This equation can also be used by midpoint optimizer 1612 during optimization to translate constraints on the SOC in terms of midpoint b. For example, the SOC of battery 1308 may be constrained between zero and 1 (e.g., $0 \leq SOC \leq 1$) since battery 1308 cannot be charged in excess of its maximum capacity or depleted below zero. Midpoint optimizer 1612 may use the relationship between $\Delta SOC$ and midpoint b to constrain the optimization of midpoint b to midpoint values that satisfy the capacity constraint.

Midpoint optimizer 1612 may perform an optimization to find optimal midpoints b for each frequency response period within the optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. Midpoint optimizer 1612 may use input from frequency response revenue estimator 1616 (e.g., a revenue model) to determine a relationship between midpoint b and $\text{Rev}(\text{Reg}_{award,k})$ Similarly, midpoint optimizer 1612 may use input from battery degradation estimator 1618 and/or revenue loss estimator 1620 to determine a relationship between midpoint b and the monetized cost of battery degradation $\lambda_{bat,k}$.

Still referring to FIG. 16, variable SOC controller 1608 is shown to include an optimization constraints module 1614. Optimization constraints module 1614 may provide one or more constraints on the optimization performed by midpoint optimizer 1612. The optimization constraints may be specified in terms of midpoint b or other variables that are related to midpoint b. For example, optimization constraints module 1614 may implement an optimization constraint specifying that the expected SOC of battery 1308 at the end of each frequency response period is between zero and one, as shown in the following equation:

$$0 \leq SOC_0 + \sum_{i=1}^{j} \Delta SOC_i \leq 1 \; \forall \; j = 1 \ldots h$$

where $SOC_0$ is the SOC of battery 1308 at the beginning of the optimization window, $\Delta SOC_i$ is the change in SOC during frequency response period i, and h is the total number of frequency response periods within the optimization window.

In some embodiments, optimization constraints module 1614 implements an optimization constraint on midpoint b so that the power at POI 1310 does not exceed the power rating of power inverter 1306. Such a constraint is shown in the following equation:

$$-P_{limit} \leq b_k P_{campus,max}^{(p)} \leq P_{limit}$$

where $P_{limit}$ is the power rating of power inverter 1306 and $P_{campus,max}^{(p)}$ is the maximum value of $P_{campus}$ at confidence level p. This constraint could also be implemented by identifying the probability that the sum of $b_k$ and $P_{campus,max}$ exceeds the power inverter power rating (e.g., using a probability density function for $P_{campus,max}$) and limiting that probability to less than or equal to $1-p$.

In some embodiments, optimization constraints module 1614 implements an optimization constraint to ensure (with a given probability) that the actual SOC of battery 1308 remains between zero and one at each time step during the applicable frequency response period. This constraint is different from the first optimization constraint which placed bounds on the expected SOC of battery 1308 at the end of each optimization period. The expected SOC of battery 1308 can be determined deterministically, whereas the actual SOC of battery 1308 is dependent on the campus power $P_{campus}$ and the actual value of the regulation signal $\text{Reg}_{signal}$ at each time step during the optimization period. In other words, for any value of $\text{Reg}_{award} > 0$, there is a chance that battery 1308 becomes fully depleted or fully charged while maintaining the desired power $P_{POI}^*$ at POI 1310.

Optimization constraints module 1614 may implement the constraint on the actual SOC of battery 1308 by approximating the battery power $P_{bat}$ (a random process) as a wide-sense stationary, correlated normally distributed process. Thus, the SOC of battery 1308 can be considered as a random walk. Determining if the SOC would violate the constraint is an example of a gambler's ruin problem. For example, consider a random walk described by the following equation:

$$y_{k+1} = y_k + x_k, P(x_k=1) = p, P(x_k=-1) = 1-p$$

The probability P that $y_k$ (starting at state z) will reach zero in less than n moves is given by the following equation:

$$P = 2a^{-1}(2p)^{\frac{n-z}{2}}[2(1-p)]^{\frac{n+z}{2}}\sum_{v=1}^{\frac{a}{2}}\cos^{n-1}\left(\frac{\pi v}{a}\right)\sin\left(\frac{\pi v}{a}\right)\sin\left(\frac{\pi z v}{a}\right)$$

In some embodiments, each frequency response period includes approximately n=1800 time steps (e.g., one time step every two seconds for an hour). Therefore, the central limit theorem applies and it is possible to convert the autocorrelated random process for $P_{bat}$ and the limits on the SOC of battery 1308 into an uncorrelated random process of 1 or −1 with a limit of zero.

In some embodiments, optimization constraints module 1614 converts the battery power $P_{bat}$ into an uncorrelated normal process driven by the regulation signal $\text{Reg}_{signal}$. For example, consider the original battery power described by the following equation:

$$x_{k+1} = \alpha x_k + e_k, x_k \sim N(\mu, \sigma), e_k \sim N(\mu_e, \sigma_e)$$

where the signal x represents the battery power $P_{bat}$, $\alpha$ is an autocorrelation parameter, and e is a driving signal. In some embodiments, e represents the regulation signal $\text{Reg}_{signal}$. If the power of the signal x is known, then the power of signal e is also known, as shown in the following equations:

$$\mu(1-\alpha) = \mu_e$$

$$E\{x_k^2\}(1-\alpha)^2 - 2\alpha\mu\mu_e = E\{e_k^2\}$$

$$E\{x_k^2\}(1-\alpha^2) - 2\mu^2\alpha(1-\alpha) = \{e_k^2\},$$

Additionally, the impulse response of the difference equation for $x_{k+1}$ is:

$$h_k = \alpha^k k \geq 0$$

Using convolution, $x_k$ can be expressed as follows:

$$x_k = \sum_{i=1}^{k} \alpha^{k-i} e_{i-1}$$

$$x_3 = \alpha^2 e_0 + \alpha^1 e_1 + e_2$$

$$x_q = \alpha^{q-1} e_0 + \alpha^{q-2} e_1 + \ldots + \alpha e_{q-2} + e_{q-1}$$

A random walk driven by signal $x_k$ can be defined as follows:

$$y_k = \sum_{j=1}^{k} x_j = \sum_{j=1}^{k} \sum_{i=1}^{j} \alpha^{j-1} e_{i-1}$$

which for large values of j can be approximated using the infinite sum of a geometric series in terms of the uncorrelated signal e rather than x:

$$y_k = \sum_{j=1}^{k} x_j \approx \sum_{j=1}^{k} \frac{1}{1-\alpha} e_j = \sum_{j=1}^{k} x_j' \quad k \gg 1$$

Thus, the autocorrelated driving signal $x_k$ of the random walk can be converted into an uncorrelated driving signal $x_k'$ with mean and power given by:

$$E\{x_k'\} = \mu, \quad E\{(x_k' - \mu)^2\} = \frac{1+\alpha}{1-\alpha}\sigma^2, \quad E\{x_k'^2\} = \frac{1+\alpha}{1-\alpha}\sigma^2 + \mu^2,$$

$$\sigma_{x'}^2 = \frac{1+\alpha}{1-\alpha}\sigma^2$$

where $x_k'$ represents the regulation signal $Reg_{signal}$. Advantageously, this allows optimization constraints module 1614 to define the probability of ruin in terms of the regulation signal $Reg_{signal}$.

In some embodiments, optimization constraints module 1614 determines a probability p that the random walk driven by the sequence of −1 and 1 will take the value of 1. In order to ensure that the random walk driven by the sequence of −1 and 1 will behave the same as the random walk driven by $x_k'$, optimization constraints module 1614 may select p such that the ratio of the mean to the standard deviation is the same for both driving functions, as shown in the following equations:

$$\frac{mean}{stdev} = \frac{\mu}{\sqrt{\frac{1+\alpha}{1-\alpha}\sigma}} = \tilde{\mu} = \frac{2p-1}{\sqrt{4p(1-p)}}$$

$$p = \frac{1}{2} \pm \frac{1}{2}\sqrt{1 - \left(\frac{1}{\tilde{\mu}^2 + 1}\right)}$$

where $\tilde{\mu}$ is the ratio of the mean to the standard deviation of the driving signal (e.g., $Reg_{signal}$) and $\mu$ is the change in state-of-charge over the frequency response period divided by the number of time steps within the frequency response period $$\left(i.e., \mu = \frac{\Delta SOC}{n}\right).$$

for embodiments in which each frequency response period has a duration of one hour (i.e., 3600 seconds) and the interval between time steps is two seconds, the number of time steps per frequency response period is 1800 (i.e., n=1800). In the equation for p, the plus is used when $\tilde{\mu}$ is greater than zero, whereas the minus is used when $\tilde{\mu}$ is less than zero. Optimization constraints module 1614 may also ensure that both driving functions have the same number of standard deviations away from zero (or ruin) to ensure that both random walks have the same behavior, as shown in the following equation:

$$z = \frac{SOC \cdot C_{des}\sqrt{4p(1-p)}}{\sqrt{\frac{1+\alpha}{1-\alpha}\sigma}}$$

Advantageously, the equations for p and z allow optimization constraints module 1614 to define the probability of ruin P (i.e., the probability of battery 1308 fully depleting or reaching a fully charged state) within N time steps (n=1 N) as a function of variables that are known to high level controller 1512 and/or manipulated by high level controller 1512. For example, the equation for p defines p as a function of the mean and standard deviation of the regulation signal $Reg_{signal}$, which may be estimated by signal statistics predictor 1518. The equation for z defines z as a function of the SOC of battery 1308 and the parameters of the regulation signal $Reg_{signal}$.

Optimization constraints module 1614 may use one or more of the previous equations to place constraints on $\Delta SOC \cdot C_{des}$ and $Reg_{award}$ given the current SOC of battery 1308. For example, optimization constraints module 1614 may use the mean and standard deviation of the regulation signal $Reg_{signal}$ to calculate p. Optimization constraints module 1614 may then use p in combination with the SOC of battery 1308 to calculate z. Optimization constraints module 1614 may use p and z as inputs to the equation for the probability of ruin P. This allows optimization constraints module 1614 to define the probability or ruin P as a function of the SOC of battery 1308 and the estimated statistics of the regulation signal $Reg_{signal}$. Optimization constraints module 1614 may impose constraints on the SOC of battery 1308 to ensure that the probability of ruin P within N time steps does not exceed a threshold value. These constraints may be expressed as limitations on the variables $\Delta SOC \cdot C_{des}$ and/or $Reg_{award}$, which are related to midpoint b as previously described.

In some embodiments, optimization constraints module 1614 uses the equation for the probability of ruin P to define boundaries on the combination of variables p and z. The boundaries represent thresholds when the probability of ruin P in less than N steps is greater than a critical value $P_{cr}$ (e.g., $P_{cr}=0\,0.001$). For example, optimization constraints module 1614 may generate boundaries that correspond to a threshold probability of battery 1308 fully depleting or reaching a fully charged state during a frequency response period (e.g., in N=1800 steps).

In some embodiments, optimization constraints module 1614 constrains the probability of ruin P to less than the threshold value, which imposes limits on potential combinations of the variables p and z. Since the variables p and z are related to the SOC of battery 1308 and the statistics of the regulation signal, the constraints may impose limitations on $\Delta SOC \cdot C_{des}$ and $Reg_{award}$ given the current SOC of battery 1308. These constraints may also impose limitations on midpoint b since the variables $\Delta SOC \cdot C_{des}$ and $Reg_{award}$ are related to midpoint b. For example, optimization constraints module 1614 may set constraints on the maximum bid $Reg_{award}$ given a desired change in the SOC for battery 1308. In other embodiments, optimization constraints module 1614 penalizes the objective function J given the bid $Reg_{award}$ and the change in SOC.

Still referring to FIG. 16, variable SOC controller 1608 is shown to include a frequency response (FR) revenue estimator 1616. FR revenue estimator 1616 may be configured to estimate the frequency response revenue that will result from a given midpoint b (e.g., a midpoint provided by midpoint optimizer 1612). The estimated frequency response revenue may be used as the term $Rev(Reg_{award,k})$ in the objective function J. Midpoint optimizer 1612 may use the estimated frequency response revenue along with other terms in the objective function J to determine an optimal midpoint b.

In some embodiments, FR revenue estimator 1616 uses a revenue model to predict frequency response revenue. An exemplary revenue model which may be used by FR revenue estimator 1616 is shown in the following equation:

$$Rev(Reg_{award}) , Reg_{award}(CP_{cap} + MR \cdot CP_{perf})$$

where $CP_{cap}$, MR, and $CP_{perf}$ are the energy market statistics received from energy market predictor 1516 and $Reg_{award}$ is a function of the midpoint b. For example, capability bid calculator 1622 may calculate $Reg_{award}$ using the following equation:

$$Reg_{award} = P_{limit} - |b|$$

where $P_{limit}$ is the power rating of power inverter 1306.

As shown above, the equation for frequency response revenue used by FR revenue estimator 1616 does not include a performance score (or assumes a performance score of 1.0). This results in FR revenue estimator 1616 estimating a maximum possible frequency response revenue that can be achieved for a given midpoint b (i.e., if the actual frequency response of controller 1312 were to follow the regulation signal exactly). However, it is contemplated that the actual frequency response may be adjusted by low level controller 1514 in order to preserve the life of battery 1308. When the actual frequency response differs from the regulation signal, the equation for frequency response revenue can be adjusted to include a performance score. The resulting value function J may then be optimized by low level controller 1514 to determine an optimal frequency response output which considers both frequency response revenue and the costs of battery degradation, as described with reference to FIG. 17.

Still referring to FIG. 16, variable SOC controller 1608 is shown to include a battery degradation estimator 1618. Battery degradation estimator 1618 may estimate the cost of battery degradation that will result from a given midpoint b (e.g., a midpoint provided by midpoint optimizer 1612). The estimated battery degradation may be used as the term $\lambda_{bat}$ in the objective function J. Midpoint optimizer 1612 may use the estimated battery degradation along with other terms in the objective function J to determine an optimal midpoint b.

In some embodiments, battery degradation estimator 1618 uses a battery life model to predict a loss in battery capacity that will result from a set of midpoints b, power outputs, and/or other variables that can be manipulated by controller 1312. The battery life model may define the loss in battery capacity $C_{loss,add}$ as a sum of multiple piecewise linear functions, as shown in the following equation:

$$C_{loss,add} = f_1(T_{cell}) f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$\left( e.g., PR = avg\left(\frac{P_{avg}}{P_{des}}\right)\right),$$

and ER is the average effort ratio $$\left( e.g., ER = avg\left(\frac{\Delta P_{bat}}{P_{des}}\right)\right)$$

of battery 1308. $C_{loss,nom}$ is the nominal loss in battery capacity that is expected to occur over time. Therefore, $C_{loss,add}$ represents the additional loss in battery capacity degradation in excess of the nominal value $C_{loss,nom}$.

Battery degradation estimator 1618 may define the terms in the battery life model as functions of one or more variables that have known values (e.g., estimated or measured values) and/or variables that can be manipulated by high level controller 1512. For example, battery degradation estimator 1618 may define the terms in the battery life model as functions of the regulation signal statistics (e.g., the mean and standard deviation of $Reg_{signal}$), the campus power signal statistics (e.g., the mean and standard deviation of $P_{campus}$), $Reg_{award}$, midpoint b, the SOC of battery 1308, and/or other variables that have known or controlled values.

In some embodiments, battery degradation estimator 1618 measures the cell temperature $T_{cell}$ using a temperature sensor configured to measure the temperature of battery 1308. In other embodiments, battery degradation estimator 1618 estimates or predicts the cell temperature $T_{cell}$ based on a history of measured temperature values. For example, battery degradation estimator 1618 may use a predictive model to estimate the cell temperature $T_{cell}$ as a function of the battery power $P_{bat}$, the ambient temperature, and/or other variables that can be measured, estimated, or controlled by high level controller 1512.

Battery degradation estimator 1618 may define the variable SOC in the battery life model as the SOC of battery 1308 at the end of the frequency response period. The SOC of battery 1308 may be measured or estimated based on the control decisions made by controller 1312. For example, battery degradation estimator 1618 may use a predictive model to estimate or predict the SOC of battery 1308 at the end of the frequency response period as a function of the battery power $P_{bat}$, the midpoint b, and/or other variables that can be measured, estimated, or controlled by high level controller 1512.

Battery degradation estimator 1618 may define the average power ratio PR as the ratio of the average power output of battery 1308 (i.e., $P_{avg}$) to the design power $P_{des}$ $$\left( e.g., PR = \frac{P_{avg}}{P_{des}}\right).$$

The average power output of battery 1308 can be defined using the following equation:

$$P_{avg} = E\{|Reg_{award} Reg_{signal} + b - P_{loss} - P_{campus}|\}$$

where the expression ($Reg_{award} Reg_{signal} + b - P_{loss} - P_{campus}$) represents the battery power $P_{bat}$. The expected value of $P_{avg}$ is given by:

$$P_{avg} = \sigma_{bat} \sqrt{\frac{2}{\pi}} \exp\left(\frac{-\mu_{bat}^2}{2\sigma_{bat}^2}\right) + \text{erf}\left(\frac{-\mu_{bat}}{\sqrt{2\sigma_{bat}^2}}\right)$$

where $\mu_{bat}$ and $\sigma_{bat}^2$ are the mean and variance of the battery power $P_{bat}$. The variables $\mu_{bat}$ and $\sigma_{bat}^2$ may be defined as follows:

$$\mu_{bat} = Reg_{award} E\{Reg_{signal}\} + b - R\{P_{loss}\} - E\{P_{campus}\}$$

$$\sigma_{bat}^2 = Reg_{award}^2 \sigma_{FR}^2 + \sigma_{campus}^2$$

where $\sigma_{FR}^2$ is the variance of $Reg_{signal}$ and the contribution of the battery power loss to the variance $\sigma_{bat}^2$ is neglected.

Battery degradation estimator 1618 may define the average effort ratio ER as the ratio of the average change in battery power $\Delta P_{avg}$ to the design power $P_{des}$ $$\left(\text{i.e., } ER = \frac{\Delta P_{avg}}{P_{des}}\right).$$

The average change in battery power can be defined using the following equation:

$$\Delta P_{avg} = E\{P_{bat,k} - P_{bat,k-1}\}$$

$$\Delta P_{avg} = E\{|Reg_{award}(Reg_{signal,k} - Reg_{signal,k-1}) - (P_{loss,k} - P_{loss,k-1}) - (P_{campus,k} - P_{campus,k-1})|\}$$

To make this calculation more tractable, the contribution due to the battery power loss can be neglected. Additionally, the campus power $P_{campus}$ and the regulation signal $Reg_{signal}$ can be assumed to be uncorrelated, but autocorrelated with first order autocorrelation parameters of $\alpha_{campus}$ and $\alpha$, respectively. The argument inside the absolute value in the equation for $\Delta P_{avg}$ has a mean of zero and a variance given by:

$$\sigma_{diff}^2 = E\{[Reg_{award}(Reg_{signal,k} - Reg_{signal,k-1}) - (P_{campus,k} - P_{campus,k-1})]^2\}$$
$$= E\{Reg_{award}^2(Reg_{signal,k} - Reg_{signal,k-1})^2 - (P_{campus,k} - P_{campus,k-1})^2\}$$
$$= 2Reg_{award}^2(1-\alpha)\sigma_{FR}^2 + 2(1-\alpha_{campus})\sigma_{campus}^2$$

Battery degradation estimator 1618 may define the depth of discharge DOD as the maximum state-of-charge minus the minimum state-of-charge of battery 1308 over the frequency response period, as shown in the following equation:

$$DOD = SOC_{max} - SOC_{min}$$

The SOC of battery 1308 can be viewed as a constant slope with a zero mean random walk added to it, as previously described. An uncorrelated normal random walk with a driving signal that has zero mean has an expected range given by:

$$E\{max - min\} = 2\sigma\sqrt{\frac{2N}{\pi}}$$

where $E\{max-min\}$ represent the depth of discharge DOD and can be adjusted for the autocorrelation of the driving signal as follows:

$$E\{max - min\} = 2\sigma_{bat}\sqrt{\frac{1+\alpha_{bat}}{1-\alpha_{bat}}}\sqrt{\frac{2N}{\pi}}$$

$$\sigma_{bat}^2 = Reg_{award}^2\sigma_{FR}^2 + \sigma_{campus}^2$$

$$\alpha_{bat} = \frac{Reg_{award}^2\alpha\sigma_{FR}^2 + \alpha_{campus}\sigma_{campus}^2}{Reg_{award}^2\sigma_{FR}^2 + \sigma_{campus}^2}$$

If the SOC of battery 1308 is expected to change (i.e., is not zero mean), the following equation may be used to define the depth of discharge:

$$E\{max - min\} = \begin{cases} R_0 + c \cdot \Delta SOC \cdot \exp\left\{-\alpha\frac{R_0 - \Delta SOC}{\sigma_{bat}}\right\} & \Delta SOC < R_0 \\ \Delta SOC + c \cdot R_0 \cdot \exp\left\{-\alpha\frac{\Delta SOC - R_0}{\sigma_{bat}}\right\} & \Delta SOC > R_0 \end{cases}$$

where $R_0$ is the expected range with zero expected change in the state-of-charge. Battery degradation estimator 1618 may use the previous equations to establish a relationship between the capacity loss $C_{loss,add}$ and the control outputs provided by controller 1312.

Still referring to FIG. 16, variable SOC controller 1608 is shown to include a revenue loss estimator 1620. Revenue loss estimator 1620 may be configured to estimate an amount of potential revenue that will be lost as a result of the battery capacity loss $C_{loss,add}$. In some embodiments, revenue loss estimator 1620 converts battery capacity loss $C_{loss,add}$ into lost revenue using the following equation:

$$R_{loss} = (CP_{cap} + MR \cdot CP_{perf})C_{loss,add}P_{des}$$

where $R_{loss}$ is the lost revenue over the duration of the frequency response period.

Revenue loss estimator 1620 may determine a present value of the revenue loss $R_{loss}$ using the following equation:

$$\lambda_{bat} = \left[\frac{1 - \left(1 + \frac{i}{n}\right)^{-n}}{\frac{i}{n}}\right]R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 1620 may provide the present value of the revenue loss $\lambda_{bat}$ to midpoint optimizer 1612 for use in the objective function J.

Midpoint optimizer 1612 may use the inputs from optimization constraints module 1614, FR revenue estimator 1616, battery degradation estimator 1618, and revenue loss estimator 1620 to define the terms in objective function J. Midpoint optimizer 1612 may determine values for midpoint b that optimize objective function J. In various embodiments, midpoint optimizer 1612 may use sequential quadratic programming, dynamic programming, or any other optimization technique.

Still referring to FIG. 16, high level controller 1512 is shown to include a capability bid calculator 1622. Capability bid calculator 1622 may be configured to generate a capability bid $Reg_{award}$ based on the midpoint b generated by constant SOC controller 1602 and/or variable SOC controller 1608. In some embodiments, capability bid calculator 1622 generates a capability bid that is as large as possible for a given midpoint, as shown in the following equation:

$$Reg_{award} = P_{limit} - |b|$$

where $P_{limit}$ is the power rating of power inverter 1306. Capability bid calculator 1622 may provide the capability bid to incentive provider 1314 and to frequency response optimizer 1624 for use in generating an optimal frequency response.

Filter Parameters Optimization

Still referring to FIG. 16, high level controller 1512 is shown to include a frequency response optimizer 1624 and a filter parameters optimizer 1626. Filter parameters optimizer 1626 may be configured to generate a set of filter parameters for low level controller 1514. The filter parameters may be used by low level controller 1514 as part of a low-pass filter that removes high frequency components from the regulation signal $\text{Reg}_{signal}$. In some embodiments, filter parameters optimizer 1626 generates a set of filter parameters that transform the regulation signal $\text{Reg}_{signal}$ into an optimal frequency response signal $\text{Res}_{FR}$. Frequency response optimizer 1624 may perform a second optimization process to determine the optimal frequency response $\text{Res}_{FR}$ based on the values for $\text{Reg}_{award}$ and midpoint b. In the second optimization, the values for $\text{Reg}_{award}$ and midpoint b may be fixed at the values previously determined during the first optimization.

In some embodiments, frequency response optimizer 1624 determines the optimal frequency response $\text{Res}_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response revenue $Rev(Reg_{award})$ is defined as follows:

$$Rev(Reg_{award}) = PS \cdot Reg_{award}(CP_{cap} + MR \cdot CP_{perf})$$

and the frequency response $\text{Res}_{FR}$ is substituted for the regulation signal $\text{Reg}_{signal}$ in the battery life model used to calculate $\lambda_{bat,k}$. The performance score PS may be based on several factors that indicate how well the optimal frequency response $\text{Res}_{FR}$ tracks the regulation signal $\text{Reg}_{signal}$.

The frequency response $\text{Res}_{FR}$ may affect both $Rev(Reg_{award})$ and the monetized cost of battery degradation $\lambda_{bat}$. Closely tracking the regulation signal may result in higher performance scores, thereby increasing the frequency response revenue. However, closely tracking the regulation signal may also increase the cost of battery degradation $\lambda_{bat}$. The optimized frequency response $\text{Res}_{FR}$ represents an optimal tradeoff between decreased frequency response revenue and increased battery life (i.e., the frequency response that maximizes value J).

In some embodiments, the performance score PS is a composite weighting of an accuracy score, a delay score, and a precision score. Frequency response optimizer 1624 may calculate the performance score PS using the performance score model shown in the following equation:

$$PS = \frac{1}{3}PS_{acc} + \frac{1}{3}PS_{delay} + \frac{1}{3}PS_{prec}$$

where $PS_{acc}$ is the accuracy score, $PS_{delay}$ is the delay score, and $PS_p$, is the precision score. In some embodiments, each term in the precision score is assigned an equal weighting (e.g., ⅓). In other embodiments, some terms may be weighted higher than others.

The accuracy score $PS_{acc}$ may be the maximum correlation between the regulation signal $\text{Reg}_{signal}$ and the optimal frequency response $\text{Res}_{FR}$. Frequency response optimizer 1624 may calculate the accuracy score $PS_{acc}$ using the following equation:

$$PS_{acc} = \max_{\delta} r_{Reg,Res(\delta)}$$

where $\delta$ is a time delay between zero and $\delta_{max}$ (e.g., between zero and five minutes).

The delay score $PS_{delay}$ may be based on the time delay $\delta$ between the regulation signal $\text{Reg}_{signal}$ and the optimal frequency response $\text{Res}_{FR}$. Frequency response optimizer 1624 may calculate the delay score $PS_{delay}$ using the following equation:

$$PS_{delay}\left|\frac{\delta[s] - \delta_{max}}{\delta_{max}}\right|$$

where $\delta[s]$ is the time delay of the frequency response $\text{Res}_{FR}$ relative to the regulation signal $\text{Reg}_{signal}$ and $\delta_{max}$ is the maximum allowable delay (e.g., 5 minutes or 300 seconds).

The precision score $PS_{prec}$ may be based on a difference between the frequency response $\text{Res}_{FR}$ and the regulation signal $\text{Reg}_{signal}$. Frequency response optimizer 1624 may calculate the precision score $PS_{prec}$ using the following equation:

$$PS_{prec} = 1 - \frac{\sum |Res_{FR} - Reg_{signal}|}{\sum |Reg_{signal}|}$$

Frequency response optimizer 1624 may use the estimated performance score and the estimated battery degradation to define the terms in objective function J. Frequency response optimizer 1624 may determine values for frequency response $\text{Res}_{FR}$ that optimize objective function J. In various embodiments, frequency response optimizer 1624 may use sequential quadratic programming, dynamic programming, or any other optimization technique.

Filter parameters optimizer 1626 may use the optimized frequency response $\text{Res}_{FR}$ to generate a set of filter parameters for low level controller 1514. In some embodiments, the filter parameters are used by low level controller 1514 to translate an incoming regulation signal into a frequency response signal. Low level controller 1514 is described in greater detail with reference to FIG. 17.

Figure 19:
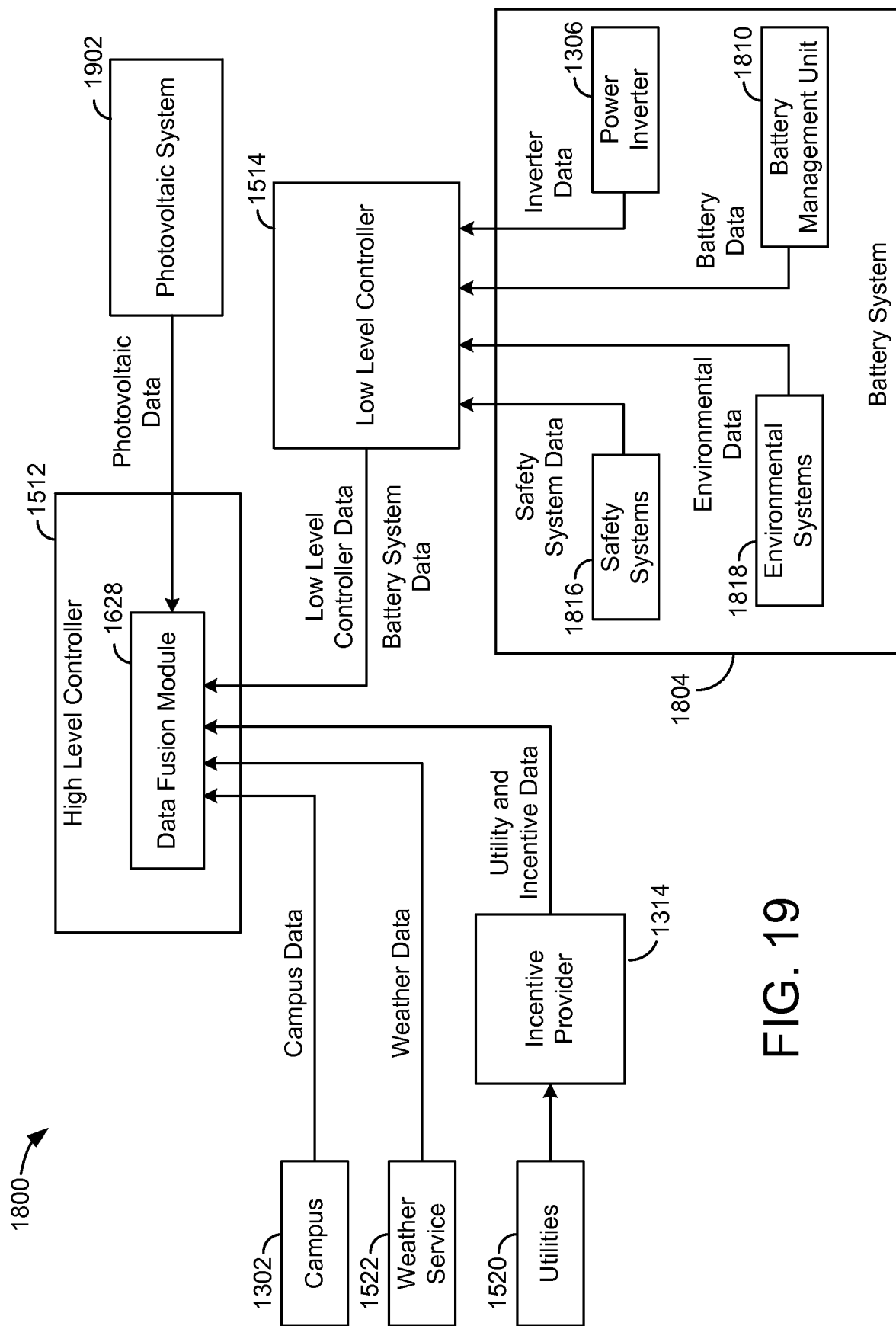
FIG. 19 is a block diagram illustrating data flow into a data fusion module of the frequency response control system of FIG. 18, according to an exemplary embodiment.

Still referring to FIG. 16, high level controller 1512 is shown to include a data fusion module 1628. Data fusion module 1628 is configured to aggregate data received from external systems and devices for processing by high level controller 1512. For example, data fusion module 1628 may store and aggregate external data such as the campus power signal, utility rates, incentive event history and/or weather forecasts as shown in FIG. 19. Further, data fusion module 1628 may store and aggregate data from low level controller 1514. For example, data fusion module 1628 may receive data such as battery SOC, battery temperature, battery system temperature data, security device status data, battery voltage data, battery current data and/or any other data provided by battery system 1804. Data fusion module 1628 is described in greater detail with reference to FIG. 19.

Low Level Controller

Figure 17:
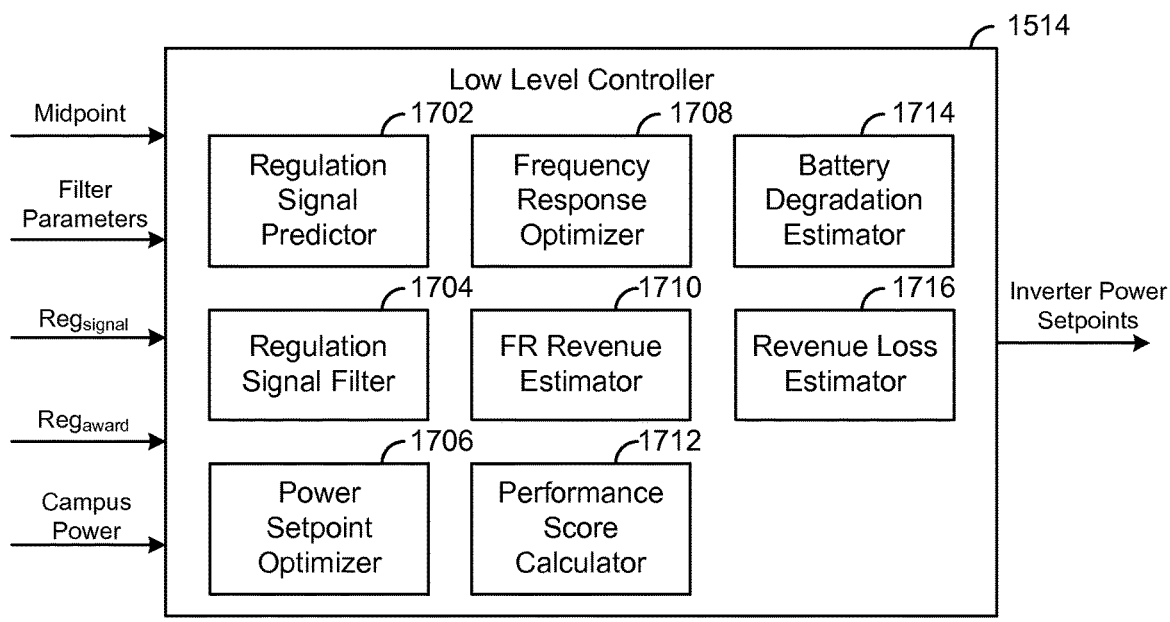
FIG. 17 is a block diagram of a low level controller which can be used in the frequency response optimization system of FIG. 13, according to an exemplary embodiment.

Referring now to FIG. 17, a block diagram illustrating low level controller 1514 in greater detail is shown, according to an exemplary embodiment. Low level controller 1514 may receive the midpoints b and the filter parameters from high level controller 1512. Low level controller 1514 may also receive the campus power signal from campus 1302 and the regulation signal $\text{Reg}_{signal}$ and the regulation award $\text{Reg}_{award}$ from incentive provider 1314.

Predicting and Filtering the Regulation Signal

Low level controller 1514 is shown to include a regulation signal predictor 1702. Regulation signal predictor 1702 may use a history of past and current values for the regulation signal $Reg_{signal}$ to predict future values of the regulation signal. In some embodiments, regulation signal predictor 1702 uses a deterministic plus stochastic model trained from historical regulation signal data to predict future values of the regulation signal $Reg_{signal}$. For example, regulation signal predictor 1702 may use linear regression to predict a deterministic portion of the regulation signal $Reg_{signal}$ and an AR model to predict a stochastic portion of the regulation signal $Reg_{signal}$. In some embodiments, regulation signal predictor 1702 predicts the regulation signal $Reg_{signal}$ using the techniques described in U.S. patent application Ser. No. 14/717,593.

Low level controller 1514 is shown to include a regulation signal filter 1704. Regulation signal filter 1704 may filter the incoming regulation signal $Reg_{signal}$ and/or the predicted regulation signal using the filter parameters provided by high level controller 1512. In some embodiments, regulation signal filter 1704 is a low pass filter configured to remove high frequency components from the regulation signal $Reg_{signal}$. Regulation signal filter 1704 may provide the filtered regulation signal to power setpoint optimizer 1706.

Determining Optimal Power Setpoints

Power setpoint optimizer 1706 may be configured to determine optimal power setpoints for power inverter 1306 based on the filtered regulation signal. In some embodiments, power setpoint optimizer 1706 uses the filtered regulation signal as the optimal frequency response. For example, low level controller 1514 may use the filtered regulation signal to calculate the desired interconnection power $P_{POI}^*$ using the following equation:

$$P_{POI}^* = Reg_{award} \cdot Reg_{filter} + b$$

where $Reg_{filter}$ is the filtered regulation signal. Power setpoint optimizer 1706 may subtract the campus power $P_{campus}$ from the desired interconnection power $P_{POI}^*$ to calculate the optimal power setpoints $P_{SP}$ for power inverter 1306, as shown in the following equation:

$$P_{SP} = P_{POI}^* - P_{campus}$$

In other embodiments, low level controller 1514 performs an optimization to determine how closely to track $P_{POI}^*$. For example, low level controller 1514 is shown to include a frequency response optimizer 1708. Frequency response optimizer 1708 may determine an optimal frequency response $Res_{FR}$ by optimizing value function J shown in the following equation:

$$J = \sum_{k=1}^{h} Rev(Reg_{award,k}) + \sum_{k=1}^{h} c_k b_k + \min_{period} (P_{campus,k} + b_k) - \sum_{k=1}^{h} \lambda_{bat,k}$$

where the frequency response $Res_{FR}$ affects both $Rev(Reg_{award})$ and the monetized cost of battery degradation $\lambda_{bat}$. The frequency response $Res_{FR}$ may affect both Rev $(Reg_{award})$ and the monetized cost of battery degradation $\lambda_{bat}$. The optimized frequency response $Res_{FR}$ represents an optimal tradeoff between decreased frequency response revenue and increased battery life (i.e., the frequency response that maximizes value J). The values of $Rev(Reg_{award})$ and $\lambda_{bat,k}$ may be calculated by FR revenue estimator 1710, performance score calculator 1712, battery degradation estimator 1714, and revenue loss estimator 1716.

Estimating Frequency Response Revenue

Still referring to FIG. 17, low level controller 1514 is shown to include a FR revenue estimator 1710. FR revenue estimator 1710 may estimate a frequency response revenue that will result from the frequency response $Res_{FR}$. In some embodiments, FR revenue estimator 1710 estimates the frequency response revenue using the following equation:

$$Rev(Reg_{award}) = PS \cdot Reg_{award}(CP_{cap} + MR \cdot CP_{perf})$$

where $Reg_{award}$, $CP_{cap}$, MR, and $CP_{perf}$ are provided as known inputs and PS is the performance score.

Low level controller 1514 is shown to include a performance score calculator 1712. Performance score calculator 1712 may calculate the performance score PS used in the revenue function. The performance score PS may be based on several factors that indicate how well the optimal frequency response $Res_{FR}$ tracks the regulation signal $Reg_{signal}$. In some embodiments, the performance score PS is a composite weighting of an accuracy score, a delay score, and a precision score. Performance score calculator 1712 may calculate the performance score PS using the performance score model shown in the following equation:

$$PS = \frac{1}{3} PS_{acc} + \frac{1}{3} PS_{delay} + \frac{1}{3} PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others. Each of the terms in the performance score model may be calculated as previously described with reference to FIG. 16.

Estimating Battery Degradation

Still referring to FIG. 17, low level controller 1514 is shown to include a battery degradation estimator 1714. Battery degradation estimator 1714 may be the same or similar to battery degradation estimator 1618, with the exception that battery degradation estimator 1714 predicts the battery degradation that will result from the frequency response $Res_{FR}$ rather than the original regulation signal $Reg_{signal}$. The estimated battery degradation may be used as the term $\lambda_{batt}$ in the objective function J. Frequency response optimizer 1708 may use the estimated battery degradation along with other terms in the objective function J to determine an optimal frequency response $Res_{FR}$.

In some embodiments, battery degradation estimator 1714 uses a battery life model to predict a loss in battery capacity that will result from the frequency response $Res_{FR}$. The battery life model may define the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$\left( \text{e.g., } PR = avg\left(\frac{P_{avg}}{P_{des}}\right) \right),$$

and ER is the average effort ratio $$(\text{e.g., } ER = avg\left(\frac{\Delta P_{bat}}{P_{des}}\right)$$

of battery 1308. $C_{loss,nom}$ is the nominal loss in battery capacity that is expected to occur over time. Therefore, $C_{loss,add}$ represents the additional loss in battery capacity degradation in excess of the nominal value $C_{loss,nom}$. The terms in the battery life model may be calculated as described with reference to FIG. 16, with the exception that the frequency response $Res_{FR}$ is used in place of the regulation signal $Reg_{signal}$.

Still referring to FIG. 17, low level controller 1514 is shown to include a revenue loss estimator 1716. Revenue loss estimator 1716 may be the same or similar to revenue loss estimator 1620, as described with reference to FIG. 16. For example, revenue loss estimator 1716 may be configured to estimate an amount of potential revenue that will be lost as a result of the battery capacity loss $C_{loss,add}$ In some embodiments, revenue loss estimator 1716 converts battery capacity loss $C_{loss,add}$ into lost revenue using the following equation:

$$R_{loss} = (CP_{cap} + MR \cdot CP_{perf}) C_{loss,add} P_{des}$$

where $R_{loss}$ is the lost revenue over the duration of the frequency response period.

Revenue loss estimator 1620 may determine a present value of the revenue loss $R_{loss}$ using the following equation:

$$\lambda_{bat} = \left[ \frac{1 - \left(1 + \frac{i}{n}\right)^{-n}}{\frac{i}{n}} \right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 1620 may provide the present value of the revenue loss $\lambda_{bat}$ to frequency response optimizer 1708 for use in the objective function J.

Frequency response optimizer 1708 may use the estimated performance score and the estimated battery degradation to define the terms in objective function J. Frequency response optimizer 1708 may determine values for frequency response $Res_{FR}$ that optimize objective function J. In various embodiments, frequency response optimizer 1708 may use sequential quadratic programming, dynamic programming, or any other optimization technique.

Frequency Response Control System

Figure 18:
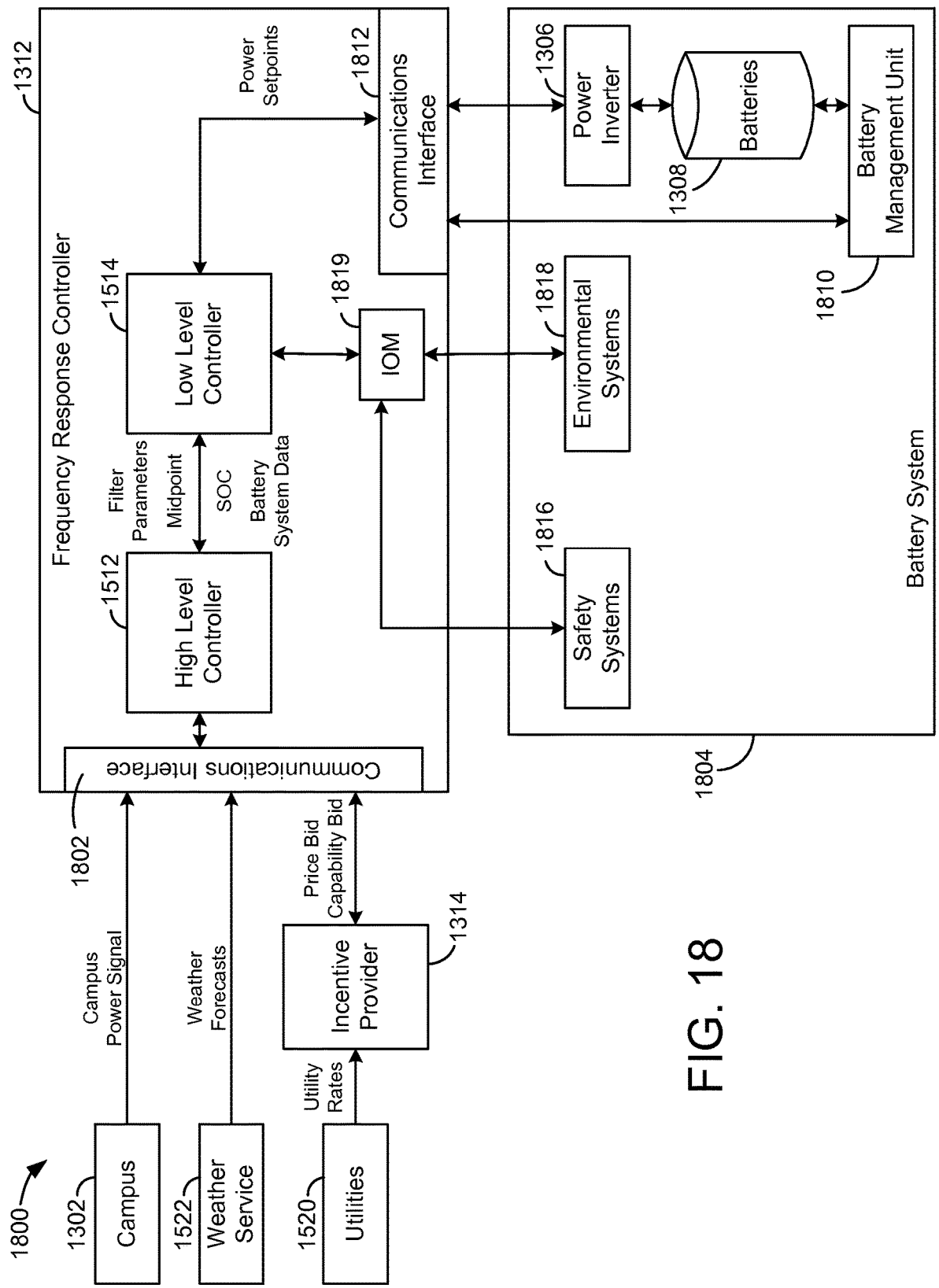
FIG. 18 is a block diagram of a frequency response control system, according to an exemplary embodiment.

Referring now to FIG. 18, a block diagram of a frequency response control system 1800 is shown, according to exemplary embodiment. Control system 1800 is shown to include frequency response controller 1312, which may be the same or similar as previously described. For example, frequency response controller 1312 may be configured to perform an optimization process to generate values for the bid price, the capability bid, and the midpoint b. In some embodiments, frequency response controller 1312 generates values for the bids and the midpoint b periodically using a predictive optimization scheme (e.g., once every half hour, once per frequency response period, etc.). Frequency response controller 1312 may also calculate and update power setpoints for power inverter 1306 periodically during each frequency response period (e.g., once every two seconds). As shown in FIG. 18, frequency response controller 1312 is in communication with one or more external systems via communication interface 1802. Additionally, frequency response controller 1312 is also shown as being in communication with a battery system 1804.

In some embodiments, the interval at which frequency response controller 1312 generates power setpoints for power inverter 1306 is significantly shorter than the interval at which frequency response controller 1312 generates the bids and the midpoint b. For example, frequency response controller 1312 may generate values for the bids and the midpoint b every half hour, whereas frequency response controller 1312 may generate a power setpoint for power inverter 1306 every two seconds. The difference in these time scales allows frequency response controller 1312 to use a cascaded optimization process to generate optimal bids, midpoints b, and power setpoints.

In the cascaded optimization process, high level controller 1512 determines optimal values for the bid price, the capability bid, and the midpoint b by performing a high level optimization. The high level controller 1512 may be a centralized server within the frequency response controller 1312. The high level controller 1512 may be configured to execute optimization control algorithms, such as those described herein. In one embodiment, the high level controller 1512 may be configured to run an optimization engine, such as a MATLAB optimization engine.

Further, the cascaded optimization process allows for multiple controllers to process different portions of the optimization process. As will be described below, the high level controller 1512 may be used to perform optimization functions based on received data, while a low level controller 1514 may receive optimization data from the high level controller 1512 and control the battery system 1804 accordingly. By allowing independent platforms to perform separation portions of the optimization, the individual platforms may be scaled and tuned independently. For example, the controller 1312 may be able to be scaled up to accommodate a larger battery system 1804 by adding additional low level controllers to control the battery system 1804. Further, the high level controller 1512 may be modified to provide additional computing power for optimizing battery system 1804 in more complex systems. Further, modifications to either the high level controller 1512 or the low level controller 1514 will not affect the other, thereby increasing overall system stability and availability.

In system 1800, high level controller 1512 may be configured to perform some or all of the functions previously described with reference to FIGS. 15-17. For example, high level controller 1512 may select midpoint b to maintain a constant state-of-charge in battery 1308 (i.e., the same state-of-charge at the beginning and end of each frequency response period) or to vary the state-of-charge in order to optimize the overall value of operating system 1800 (e.g., frequency response revenue minus energy costs and battery degradation costs), as described below. High level controller 1512 may also determine filter parameters for a signal filter (e.g., a low pass filter) used by a low level controller 1514.

The low level controller 1514 may be a standalone controller. In one embodiment, the low level controller 1514 is a Network Automation Engine (NAE) controller from Johnson Controls. However, other controllers having the required capabilities are also contemplated. The required capabilities for the low level controller 1514 may include having sufficient memory and computing power to run the applications, described below, at the required frequencies.

For example, certain optimization control loops (described below) may require control loops running at 200 ms intervals. However, intervals of more than 200 ms and less than 200 ms may also be required. These control loops may require reading and writing data to and from the battery inverter. The low level controller 1514 may also be required to support Ethernet connectivity (or other network connectivity) to connect to a network for receiving both operational data, as well as configuration data. The low level controller 1514 may be configured to perform some or all of the functions previously described with reference to FIGS. 15-17.

The low level controller 1514 may be capable of quickly controlling one or more devices around one or more setpoints. For example, low level controller 1514 uses the midpoint b and the filter parameters from high level controller 1512 to perform a low level optimization in order to generate the power setpoints for power inverter 1306. Advantageously, low level controller 1514 may determine how closely to track the desired power $P_{POI}^*$ at the point of interconnection 1310. For example, the low level optimization performed by low level controller 1514 may consider not only frequency response revenue but also the costs of the power setpoints in terms of energy costs and battery degradation. In some instances, low level controller 1514 may determine that it is deleterious to battery 1308 to follow the regulation exactly and may sacrifice a portion of the frequency response revenue in order to preserve the life of battery 1308.

Low level controller 1514 may also be configured to interface with one or more other devises or systems. For example, the low level controller 1514 may communicate with the power inverter 1306 and/or the battery management unit 1810 via a low level controller communication interface 1812. Communications interface 1812 may include wired or wireless interfaces (e.g., jacks, antennas, transmitters, receivers, transceivers, wire terminals, etc.) for conducting data communications with various systems, devices, or networks. For example, communications interface 1812 may include an Ethernet card and port for sending and receiving data via an Ethernet-based communications network and/or a WiFi transceiver for communicating via a wireless communications network. Communications interface 1812 may be configured to communicate via local area networks or wide area networks (e.g., the Internet, a building WAN, etc.) and may use a variety of communications protocols (e.g., BACnet, MODBUS, CAN, IP, LON, etc.).

As described above, the low level controller 1514 may communicate setpoints to the power inverter 1306. Furthermore, the low level controller 1514 may receive data from the battery management unit 1810 via the communication interface 1812. The battery management unit 1810 may provide data relating to a state of charge (SOC) of the batteries 1308. The battery management unit 1810 may further provide data relating to other parameters of the batteries 1308, such as temperature, real time or historical voltage level values, real time or historical current values, etc. The low level controller 1514 may be configured to perform time critical functions of the frequency response controller 1312. For example, the low level controller 1514 may be able to perform fast loop (PID, PD, PI, etc.) controls in real time.

The low level controller 1514 may further control a number of other systems or devices associated with the battery system 1804. For example, the low level controller may control safety systems 1816 and/or environmental systems 1818. In one embodiment, the low level controller 1514 may communicate with and control the safety systems 1816 and/or the environmental systems 1818 through an input/output module (TOM) 1819. In one example, the IOM may be an TOM controller from Johnson Controls. The IOM may be configured to receive data from the low level controller and then output discrete control signals to the safety systems 1816 and/or environmental systems 1818. Further, the IOM 1819 may receive discrete outputs from the safety systems 1816 and/or environmental systems 1520, and report those values to the low level controller 1514. For example, the TOM 1819 may provide binary outputs to the environmental system 1818, such as a temperature setpoint; and in return may receive one or more analog inputs corresponding to temperatures or other parameters associated with the environmental systems 1818. Similarly, the safety systems 1816 may provide binary inputs to the TOM 1819 indicating the status of one or more safety systems or devices within the battery system 1804. The IOM 1819 may be able to process multiple data points from devices within the battery system 1804. Further, the TOM may be configured to receive and output a variety of analog signals (4-20 mA, 0-5V, etc.) as well as binary signals.

The environmental systems 1818 may include HVAC devices such as roof-top units (RTUs), air handling units (AHUs), etc. The environmental systems 1818 may be coupled to the battery system 1804 to provide environmental regulation of the battery system 1804. For example, the environmental systems 1818 may provide cooling for the battery system 1804. In one example, the battery system 1804 may be contained within an environmentally sealed container. The environmental systems 1818 may then be used to not only provide airflow through the battery system 1804, but also to condition the air to provide additional cooling to the batteries 1308 and/or the power inverter 1306. The environmental systems 1818 may also provide environmental services such as air filtration, liquid cooling, heating, etc. The safety systems 1816 may provide various safety controls and interlocks associated with the battery system 1804. For example, the safety systems 1816 may monitor one or more contacts associated with access points on the battery system. Where a contact indicates that an access point is being accessed, the safety systems 1816 may communicate the associated data to the low level controller 1514 via the IOM 1819. The low level controller may then generate and alarm and/or shut down the battery system 1804 to prevent any injury to a person accessing the battery system 1804 during operation. Further examples of safety systems can include air quality monitors, smoke detectors, fire suppression systems, etc.

Still referring to FIG. 18, the frequency response controller 1312 is shown to include the high level controller communications interface 1802. Communications interface 1802 may include wired or wireless interfaces (e.g., jacks, antennas, transmitters, receivers, transceivers, wire terminals, etc.) for conducting data communications with various systems, devices, or networks. For example, communications interface 1802 may include an Ethernet card and port for sending and receiving data via an Ethernet-based communications network and/or a WiFi transceiver for communicating via a wireless communications network. Communications interface 1802 may be configured to communicate via local area networks or wide area networks (e.g., the Internet, a building WAN, etc.) and may use a variety of communications protocols (e.g., BACnet, IP, LON, etc.).

Communications interface 1802 may be a network interface configured to facilitate electronic data communications between frequency response controller 1312 and various external systems or devices (e.g., campus 1302, energy grid 1304, incentive provider 1314, utilities 1520, weather service 1522, etc.). For example, frequency response controller 1312 may receive inputs from incentive provider 1314 indicating an incentive event history (e.g., past clearing prices, mileage ratios, participation requirements, etc.) and a regulation signal. Further, the incentive provider 1314 may communicate utility rates provided by utilities 1520. Frequency response controller 1312 may receive a campus power signal from campus 1302, and weather forecasts from weather service 1522 via communications interface 1802. Frequency response controller 1312 may provide a price bid and a capability bid to incentive provider 1314 and may provide power setpoints to power inverter 1306 via communications interface 1802.

Data Fusion

Turning now to FIG. 19, a block diagram illustrating data flow into the data fusion module 1628 is shown, according to some embodiments. As shown in FIG. 19, the data fusion module 1628 may receive data from multiple devices and/or systems. In one embodiment, the data fusion module 1628 may receive all data received by the high level controller 1512. For example, the data fusion module 1628 may receive campus data from the campus 1302. Campus data may include campus power requirements, campus power requests, occupancy planning, historical use data, lighting schedules, HVAC schedules, etc. In a further embodiment, the data fusion module 1628 may receive weather data from the weather service 1522. The weather service 1522 may include current weather data (temperature, humidity, barometric pressure, etc.), weather forecasts, historical weather data, etc. In a still further embodiment, the data fusion module 1628 may receive utility data from the utilities 1520. In some examples, the data fusion module 1628 may receive some or all of the utility data via the incentive provider 1314. Examples of utility data may include utility rates, future pricing schedules, anticipated loading, historical data, etc. Further, the incentive provider 1314 may further add data such as capability bid requests, price bid requests, incentive data, etc.

The data fusion module 1628 may further receive data from the low level controller 1514. In some embodiments, the low level controller may receive data from multiple sources, which may be referred to collectively as battery system data. For example, the low level controller 1514 may receive inverter data from power inverter 1306. Example inverter data may include inverter status, feedback points, inverter voltage and current, power consumption, etc. The low level controller 1514 may further receive battery data from the battery management unit 1810. Example battery data may include battery SOC, depth of discharge data, battery temperature, battery cell temperatures, battery voltage, historical battery use data, battery health data, etc. In other embodiment, the low level controller 1514 may receive environmental data from the environmental systems 1818. Examples of environmental data may include battery system temperature, battery system humidity, current HVAC settings, setpoint temperatures, historical HVAC data, etc. Further, the low level controller 1514 may receive safety system data from the safety systems 1816. Safety system data may include access contact information (e.g. open or closed indications), access data (e.g. who has accessed the battery system 1804 over time), alarm data, etc. In some embodiments, some or all of the data provided to the low level controller 1514 is via an input/output module, such as TOM 1819. For example, the safety system data and the environmental system data may be provided to the low level controller 1514 via an input/output module, as described in detail in regards to FIG. 18.

The low level controller 1514 may then communicate the battery system data to the data fusion module 1628 within the high level controller 1512. Additionally, the low level controller 1514 may provide additional data to the data fusion module 1628, such as setpoint data, control parameters, etc.

The data fusion module 1628 may further receive data from other stationary power systems, such as a photovoltaic system 1902. For example, the photovoltaic system 1902 may include one or more photovoltaic arrays and one or more photovoltaic array power inverters. The photovoltaic system 1902 may provide data to the data fusion module 1628 such as photovoltaic array efficiency, photovoltaic array voltage, photovoltaic array inverter output voltage, photovoltaic array inverter output current, photovoltaic array inverter temperature, etc. In some embodiments, the photovoltaic system 1902 may provide data directly to the data fusion module 1628 within the high level controller 1512. In other embodiments, the photovoltaic system 1902 may transmit the data to the low level controller 1514, which may then provide the data to the data fusion module 1628 within the high level controller 1512.

The data fusion module 1628 may receive some or all of the data described above, and aggregate the data for use by the high level controller 1512. In one embodiment, the data fusion module 1628 is configured to receive and aggregate all data received by the high level controller 1512, and to subsequently parse and distribute the data to one or more modules of the high level controller 1512, as described above. Further, the data fusion module 1628 may be configured to combine disparate heterogeneous data from the multiple sources described above, into a homogeneous data collection for use by the high level controller 1512. As described above, data from multiple inputs is required to optimize the battery system 1804, and the data fusion module 1628 can gather and process the data such that it can be provided to the modules of the high level controller 1512 efficiently and accurately. For example, extending battery lifespan is critical for ensuring proper utilization of the battery system 1804. By combining battery data such as temperature and voltage, along with external data such as weather forecasts, remaining battery life may be more accurately determined by the battery degradation estimator 1618, described above. Similarly, multiple data points from both external sources and the battery system 1804 may allow for more accurate midpoint estimations, revenue loss estimations, battery power loss estimation, or other optimization determination, as described above.

Figure 20:
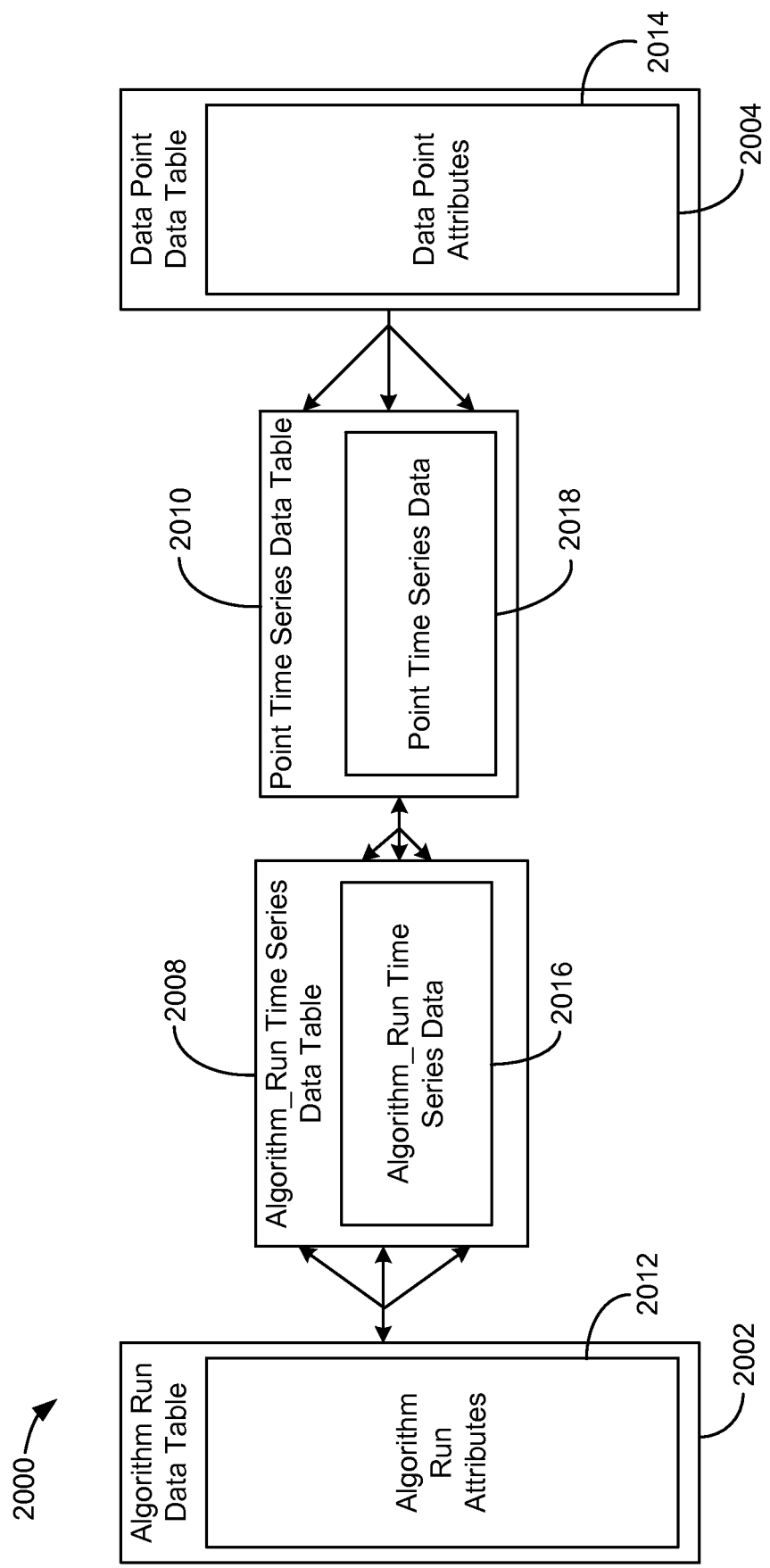
FIG. 20 is a block diagram illustrating a database schema which can be used in the frequency response control system of FIG. 18, according to an exemplary embodiment.

Turning now to FIG. 20, a block diagram showing a database schema 2000 of the system 1800 is shown, according to some embodiments. The schema 2000 is shown to include an algorithm run data table 2002, a data point data table 2004, an algorithm_run time series data table 2008 and a point time series data table 2010. The data tables 2002, 2004, 2008, 2010 may be stored on the memory of the high level controller 1512. In other embodiments, the data tables 2002, 2004, 2008, 2010 may be stored on an external storage device and accessed by the high level controller as required.

As described above, the high level controller performs calculation to generate optimization data for the battery optimization system 1800. These calculation operations (e.g. executed algorithms) may be referred to as "runs." As described above, one such run is the generation of a midpoint b which can subsequently be provided to the low level controller 1514 to control the battery system 1804. However, other types of runs are contemplated. Thus, for the above described run, the midpoint b is the output of the run. The detailed operation of a run, and specifically a run to generate midpoint b is described in detail above.

The algorithm run data table 2002 may include a number of algorithm run attributes 2012. Algorithm run attributes 2012 are those attributes associated with the high level controller 1512 executing an algorithm, or "run", to produce an output. The runs can be performed at selected intervals of time. For example, the run may be performed once every hour. However, in other examples, the run may be performed more than once every hour, or less than once every hour. The run is then performed and by the high level controller 1512 and a data point is output, for example a midpoint b, as described above. The midpoint b may be provided to the low level controller 1514 to control the battery system 1804, described above in the description of the high level controller 1804 calculating the midpoint b.

In one embodiment, the algorithm run attributes contain all the information necessary to perform the algorithm or run. In a further embodiment, the algorithm run attributes 2012 are associated with the high level controller executing an algorithm to generate a midpoint, such as midpoint b described in detail above. Example algorithm run attributes may include an algorithm run key, an algorithm run ID (e.g. "midpoint," "endpoint," "temperature setpoint," etc.), Associated Run ID (e.g. name of the run), run start time, run stop time, target run time (e.g. when is the next run desired to start), run status, run reason, fail reason, plant object ID (e.g. name of system), customer ID, run creator ID, run creation date, run update ID, and run update date. However, this list is for example only, as it is contemplated that the algorithm run attributes may contain multiple other attributes associated with a given run.

As stated above, the algorithm run data table 2002 contains attributes associated with a run to be performed by the high level controller 1512. In some embodiments, the output of a run, is one or more "points," such as a midpoint. The data point data table 2004 contains data point attributes 2014 associated with various points that may be generated by a run. These data point attributes 2014 are used to describe the characteristics of the data points. For example, the data point attributes may contain information associated with a midpoint data point. However, other data point types are contemplated. Example attributes may include point name, default precision (e.g. number of significant digits), default unit (e.g. cm, degrees Celsius, voltage, etc.), unit type, category, fully qualified reference (yes or no), attribute reference ID, etc. However, other attributes are further considered.

The algorithm_run time series data table 2008 may contain time series data 2016 associated with a run. In one embodiment, the algorithm_run time series data 2016 includes time series data associated with a particular algorithm_run ID. For example, a run associated with determining the midpoint b described above, may have an algorithm_run ID of Midpoint_Run. The algorithm_run time series data table 2008 may therefore include algorithm_run time series data 2016 for all runs performed under the algorithm ID Midpoint_Run. Additionally, the algorithm_run time series data table 2008 may also contain run time series data associated with other algorithm IDs as well. The run time series data 2016 may include past data associated with a run, as well as expected future information. Example run time series data 2016 may include final values of previous runs, the unit of measure in the previous runs, previous final value reliability values, etc. As an example, a "midpoint" run may be run every hour, as described above. The algorithm_run time series data 2016 may include data related to the previously performed runs, such as energy prices over time, system data, etc. Additionally, the algorithm_run time series data 2016 may include point time series data associated with a given point, as described below.

The point time series data table 2010 may include the point time series data 2018. The point time series data 2018 may include time series data associated with a given data "point." For example, the above described midpoint b may have a point ID of "Midpoint." The point time series data table 2010 may contain point time series data 2018 associated with the "midpoint" ID, generated over time. For example, previous midpoint values may be stored in the point time series data table 2018 for each performed run. The point time series data table 2010 may identify the previous midpoint values by time (e.g. when the midpoint was used by the low level controller 1514), and may include information such as the midpoint value, reliability information associated with the midpoint, etc. In one embodiment, the point time series data table 2018 may be updated with new values each time a new "midpoint" is generated via a run. Further, the point time series data 2016 for a given point may include information independent of a given run. For example, the high level controller 1512 may monitor other data associated with the midpoint, such as regulation information from the low level controller, optimization data, etc., which may further be stored in the point time series data table 2010 as point time series data 2018.

The above described data tables may be configured to have an association or relational connection between them. For example, as shown in FIG. 20, the algorithm_run data table 2002 may have a one-to-many association or relational relationship with the algorithm_run time series association table 2008, as there may be many algorithm_run time series data points 2016 for each individual algorithm_run ID. Further, the data point data table 2004 may have a one-to-many relationship with the point time series data table 2010, as there may be many point time series data points 2018 associated with an individual point. Further, the point time series data table 2010 may have a one to many relationship with the algorithm_run time series data table 2008, as there may be multiple different point time series data 2018 associated with a run. Accordingly, the algorithm_run data table 2002 has a many-to-many relationship with the data point data table 2004, as there may be many points, and/or point time series data 2018, associated with may run types; and, there may be multiple run types associated with many points By using the above mentioned association data tables 2002, 2004, 2008, 2010, optimization of storage space required for storing time series data may be achieved. With the addition of additional data used in a battery optimization system, such as battery optimization system 1800 described above, vast amounts of time series data related to data provided by external sources (weather data, utility data, campus data, building automation systems (BAS) or building management systems (BMS)), and internal sources (battery systems, photovoltaic systems, etc.) is generated. By utilizing association data tables, such as those described above, the data may be optimally stored and accessed.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A frequency regulation and ramp rate control system comprising:
    a battery configured to store and discharge electric power;
    a battery power inverter configured to control an amount of the electric power stored or discharged from the battery;
    a photovoltaic power inverter configured to control an electric power output of a photovoltaic field; and
    a controller configured to generate a battery power setpoint for the battery power inverter and a photovoltaic power setpoint for the photovoltaic power inverter, the battery power setpoint and the photovoltaic power setpoint causing the battery power inverter and the photovoltaic power inverter to simultaneously perform both frequency regulation and ramp rate control,
    wherein, when a power at a point-of-intersection ("POI") is greater than a POI power limit, the photovoltaic power setpoint for the photovoltaic power inverter is calculated after the battery power setpoint for the battery power inverter by subtracting the battery power setpoint from the POI power limit at the POI between the battery power inverter and the photovoltaic power inverter.

2. The system of claim 1, wherein the controller is configured to generate the battery power setpoint by:
    generating a frequency regulation power setpoint based on a frequency of an energy grid electrically connected to the photovoltaic field and the battery;
    generating a ramp rate control power setpoint based a ramp rate compliance limit; and
    combining the frequency regulation power setpoint and the ramp rate control power setpoint to generate the battery power setpoint.

3. The system of claim 2, wherein the controller is configured to combine the frequency regulation power setpoint and the ramp rate control power setpoint by summing the frequency regulation power setpoint and the ramp rate control power setpoint.

4. The system of claim 2, wherein the controller is configured to generate upper and lower bounds for the ramp rate control power setpoint, the upper and lower bounds defining a range of values for the ramp rate control power setpoint that ensure compliance with the ramp rate compliance limit.

5. The system of claim 4, wherein the controller is configured to generate the ramp rate control power setpoint by:
    determining whether the power output of the photovoltaic field is ramping-up, ramping-down, or not ramping based on the upper and lower bounds; and
    generating the ramp rate control power setpoint based on whether the power output of the photovoltaic field is ramping-up, ramping-down, or not ramping.

6. The system of claim 2, wherein the controller is configured to generate the ramp rate control power setpoint by:
    identifying a state-of-charge of the battery;
    comparing the state-of-charge of the battery with a state-of-charge setpoint; and
    generating the ramp rate control power setpoint based on a difference between the identified state-of-charge of the battery and the state-of-charge setpoint.

7. The system of claim 6, wherein the state-of-charge setpoint comprises at least one of:
    a single setpoint value; and
    a range of setpoint values between an upper setpoint limit and a lower setpoint limit.

8. The system of claim 1, wherein the controller is configured to determine whether the power output of the photovoltaic field is ramping-up, ramping-down, or not ramping based on a power signal from the photovoltaic field over a plurality of time steps.

9. A method for frequency regulation and ramp rate control, the method comprising:
    storing and discharging electric power in a battery;
    controlling an amount of the electric power stored or discharged from the battery using a battery power inverter;

controlling an electric power output of a photovoltaic field using a photovoltaic power inverter;

generating a battery power setpoint for the battery power inverter and a photovoltaic power setpoint for the photovoltaic power inverter using a controller; and using the battery power inverter and the photovoltaic power inverter to simultaneously perform both frequency regulation and ramp rate control based on the battery power setpoint and the photovoltaic power setpoint, wherein, when a power at a point-of-intersection ("POI") is greater than a POI power limit, the photovoltaic power setpoint for the photovoltaic power inverter is calculated after the battery power setpoint for the battery power inverter by subtracting the battery power setpoint from the POI power limit at the POI between the battery power inverter and the photovoltaic power inverter.

10. The method of claim 9, wherein generating the battery power setpoint comprises:

generating a frequency regulation power setpoint based on a frequency of an energy grid electrically connected to the photovoltaic field and the battery;

generating a ramp rate control power setpoint based a ramp rate compliance limit; and combining the frequency regulation power setpoint and the ramp rate control power setpoint to generate the battery power setpoint.

11. The method of claim 10, wherein combining the frequency regulation power setpoint and the ramp rate control power setpoint comprises summing the frequency regulation power setpoint and the ramp rate control power setpoint.

12. The method of claim 10, further comprising generating upper and lower bounds for the ramp rate control power setpoint, the upper and lower bounds defining a range of values for the ramp rate control power setpoint that ensure compliance with the ramp rate compliance limit.

13. The method of claim 12, wherein generating the ramp rate control power setpoint comprises:

determining whether the power output of the photovoltaic field is ramping-up, ramping-down, or not ramping based on the upper and lower bounds; and generating the ramp rate control power setpoint based on whether the power output of the photovoltaic field is ramping-up, ramping-down, or not ramping.

14. The method of claim 10, wherein generating the ramp rate control power setpoint comprises:

identifying a state-of-charge of the battery;

comparing the state-of-charge of the battery with a state-of-charge setpoint; and generating the ramp rate control power setpoint based on a difference between the identified state-of-charge of the battery and the state-of-charge setpoint.

15. The method of claim 14, wherein the state-of-charge setpoint comprises at least one of:

a single setpoint value; and a range of setpoint values between an upper setpoint limit and a lower setpoint limit.

16. The method of claim 9, further comprising determining whether the power output of the photovoltaic field is ramping-up, ramping-down, or not ramping based on a power signal from the photovoltaic field over a plurality of time steps.

17. A controller for a frequency regulation and ramp rate control system, the controller comprising:

a processing circuit configured to:

control an amount of the electric power stored or discharged from a battery using a battery power inverter;

control an electric power output of a photovoltaic field using a photovoltaic power inverter;

generate a battery power setpoint for the battery power inverter and a photovoltaic power setpoint for the photovoltaic power inverter; and use the battery power inverter and the photovoltaic power inverter to simultaneously perform both frequency regulation and ramp rate control based on the battery power setpoint and the photovoltaic power setpoint, wherein, when a power at a point-of-intersection ("POI") is greater than a POI power limit, the photovoltaic power setpoint for the photovoltaic power inverter is calculated after the battery power setpoint for the battery power inverter by subtracting the battery power setpoint from the POI power limit at the POI between the battery power inverter and the photovoltaic power inverter.

18. The controller of claim 17, wherein the processing circuit is configured to generate the battery power setpoint by:

generating a frequency regulation power setpoint based on a frequency of an energy grid electrically connected to the photovoltaic field and the battery;

generating a ramp rate control power setpoint based a ramp rate compliance limit; and combining the frequency regulation power setpoint and the ramp rate control power setpoint to generate the battery power setpoint.

19. The controller of claim 18, wherein the processing circuit is configured to generate upper and lower bounds for the ramp rate control power setpoint, the upper and lower bounds defining a range of values for the ramp rate control power setpoint that ensure compliance with the ramp rate compliance limit.

20. The controller of claim 19, wherein the processing circuit is configured to generate the ramp rate control power setpoint by:

determining whether the power output of the photovoltaic field is ramping-up, ramping-down, or not ramping based on the upper and lower bounds; and generating the ramp rate control power setpoint based on whether the power output of the photovoltaic field is ramping-up, ramping-down, or not ramping.

* * * * *